US010644151B2

(12) United States Patent
Masuoka et al.

(10) Patent No.: US 10,644,151 B2
(45) Date of Patent: May 5, 2020

(54) SEMICONDUCTOR DEVICE INCLUDING SGT

(71) Applicant: Unisantis Electronics Singapore Pte. Ltd., Singapore (SG)

(72) Inventors: Fujio Masuoka, Tokyo (JP); Nozomu Harada, Tokyo (JP)

(73) Assignee: Unisantis Electronics Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/398,574

(22) Filed: Apr. 30, 2019

(65) Prior Publication Data

US 2019/0259876 A1    Aug. 22, 2019

Related U.S. Application Data

(60) Division of application No. 15/917,168, filed on Mar. 9, 2018, which is a continuation-in-part of application No. PCT/JP2015/085469, filed on Dec. 18, 2015.

(51) Int. Cl.
*H01L 29/78* (2006.01)
*H01L 29/66* (2006.01)
(Continued)

(52) U.S. Cl.
CPC ........ *H01L 29/7827* (2013.01); *H01L 21/461* (2013.01); *H01L 21/475* (2013.01);
(Continued)

(58) Field of Classification Search
CPC .......... H01L 29/7827; H01L 29/66666; H01L 29/78642; H01L 29/41741; H01L 29/1079;
(Continued)

(56) References Cited

U.S. PATENT DOCUMENTS 8,188,537 B2    5/2012  Masuoka
10,211,340 B2   2/2019  Masuoka
(Continued)

FOREIGN PATENT DOCUMENTS

JP      02-188966 A     7/1990
JP      02-198170 A     8/1990
(Continued)

OTHER PUBLICATIONS

Probst, V. et al., "WSi$_2$ and CoSi$_2$ as Diffusion Sources for Shallow-Junction Formation in Silicon", *J. Appl. Phys.*, vol. 70(2), No. 15, 1991, pp. 708-719.
(Continued)

*Primary Examiner* — Galina G Yushina
(74) *Attorney, Agent, or Firm* — Brinks Gilson & Lione

(57) ABSTRACT

A surround gate MOS transistor (SGT) includes a silicon pillar and tungsten silicide or cobalt silicide wiring alloy layers constituted by first alloy regions connected to the entire peripheries of impurity regions serving as sources or drains in lower portions of the silicon pillar. The first alloy regions are formed in a self-aligned manner with the impurity regions in a tubular shape, and contain the same impurity atoms as the impurity regions. A second alloy region is partly connected to the peripheries of the first alloy regions and contains the same impurity atoms as the impurity regions.

1 Claim, 47 Drawing Sheets

(51) Int. Cl.

| | |
|---|---|
| *H01L 29/423* | (2006.01) |
| *H01L 29/10* | (2006.01) |
| *H01L 29/417* | (2006.01) |
| *H01L 29/786* | (2006.01) |
| *H01L 29/06* | (2006.01) |
| *H01L 21/461* | (2006.01) |
| *H01L 21/475* | (2006.01) |
| *H01L 21/8238* | (2006.01) |
| *H01L 29/775* | (2006.01) |

(52) U.S. Cl.
CPC ...... *H01L 21/8238* (2013.01); *H01L 29/1079* (2013.01); *H01L 29/41741* (2013.01); *H01L 29/42392* (2013.01); *H01L 29/66666* (2013.01); *H01L 29/66712* (2013.01); *H01L 29/78* (2013.01); *H01L 29/7802* (2013.01); *H01L 29/78642* (2013.01); *H01L 29/0676* (2013.01); *H01L 29/66439* (2013.01); *H01L 29/775* (2013.01)

(58) Field of Classification Search
CPC .......... H01L 29/7802; H01L 29/66712; H01L 29/42392; H01L 29/78; H01L 29/775; H01L 29/66439; H01L 29/0676; H01L 21/475; H01L 21/461; H01L 21/1079
See application file for complete search history.

(56) References Cited

U.S. PATENT DOCUMENTS

| | | |
|---|---|---|
| 2008/0258209 A1 | 10/2008 | Oyu |
| 2010/0187601 A1 | 7/2010 | Masuoka et al. |
| 2010/0219483 A1 | 9/2010 | Masuoka |
| 2010/0264484 A1 | 10/2010 | Masuoka et al. |
| 2010/0291743 A1 | 11/2010 | Nishi |
| 2013/0328138 A1* | 12/2013 | Masuoka .............. H01L 29/785 257/413 |
| 2015/0221750 A1* | 8/2015 | Masuoka .......... H01L 21/82388 438/268 |
| 2015/0357438 A1 | 12/2015 | Masuoka et al. |

FOREIGN PATENT DOCUMENTS

| | | |
|---|---|---|
| JP | 2008-140996 A | 6/2008 |
| JP | 2011-023543 A | 2/2011 |
| JP | 2013-165159 A | 8/2013 |
| WO | WO 2009/075031 A1 | 6/2009 |
| WO | WO 2015/097798 A1 | 7/2015 |

OTHER PUBLICATIONS

Shibata, T. et al., "A New Field Isolation Technology for High Density MOS LSI", *Japanese Journal of Applied Physics*, vol. 18, 1979, pp. 263-267.

Takato, H. et al., "Impact of Surrounding Gate Transistor (SGT) for Ultra-High-Density LSI's", *IEEE Transaction on Electron Devices*, vol. 38, No. 3, 1991, pp. 573-578.

Ting, C.Y. et al., "Study of Planarized Sputter-Deposited $SiO_2$", *J. Vac. Sci. Technol.*, vol. 15, No. 3, May/Jun. 1978, pp. 1105-1112.

International Search Report, and English language translation thereof, in corresponding International Application No. PCT/JP2015/085469, dated Mar. 8, 2016, 12 pages.

International Preliminary Report on Patentability, English Translation, for International Application No. PCT/JP2015/085469, dated Jul. 5, 2018, pp. 1-6.

* cited by examiner

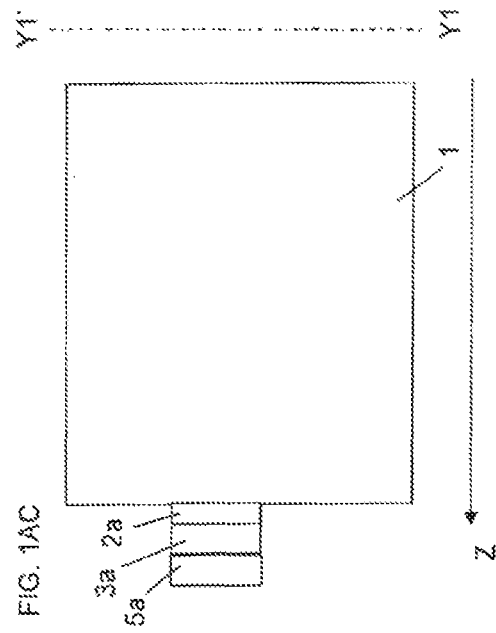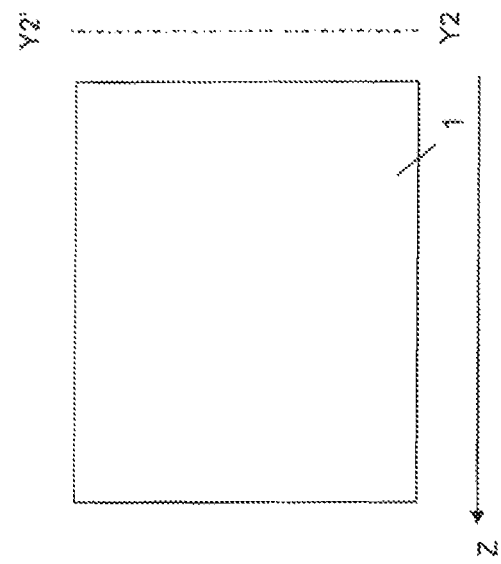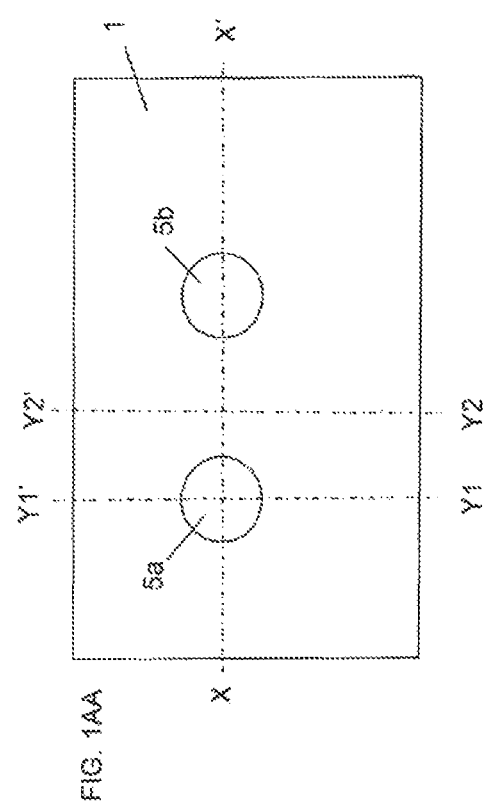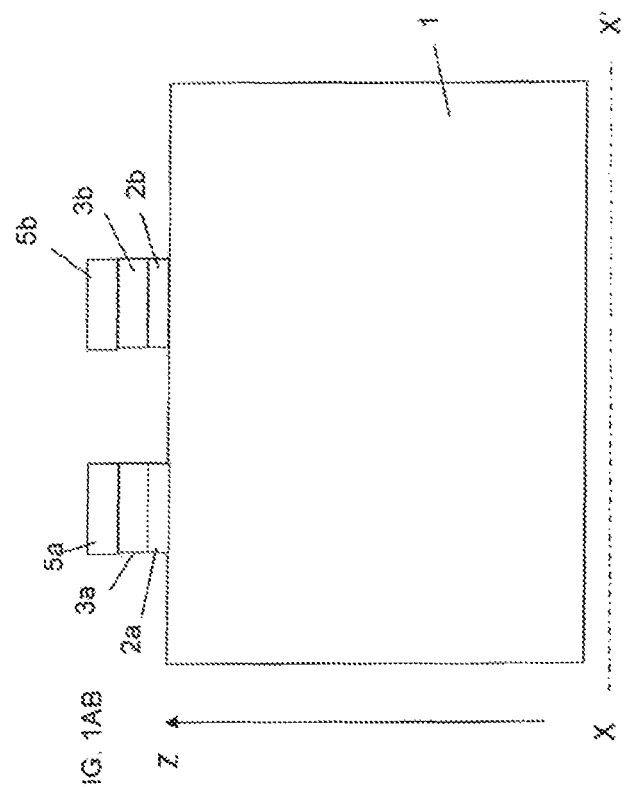

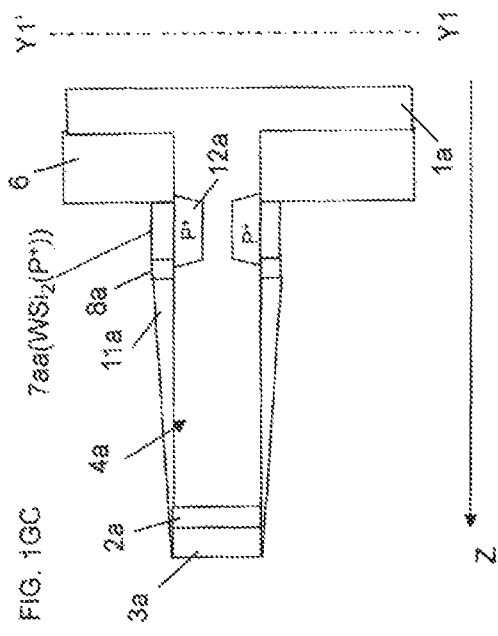
FIG. 1GA
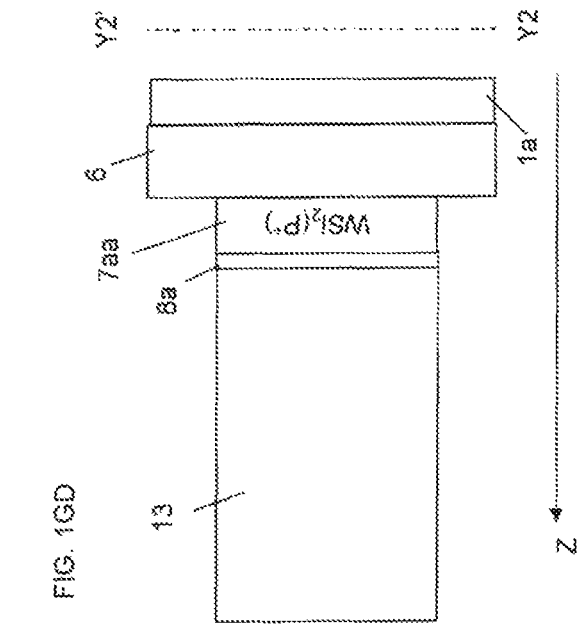
FIG. 1GC
FIG. 1GD
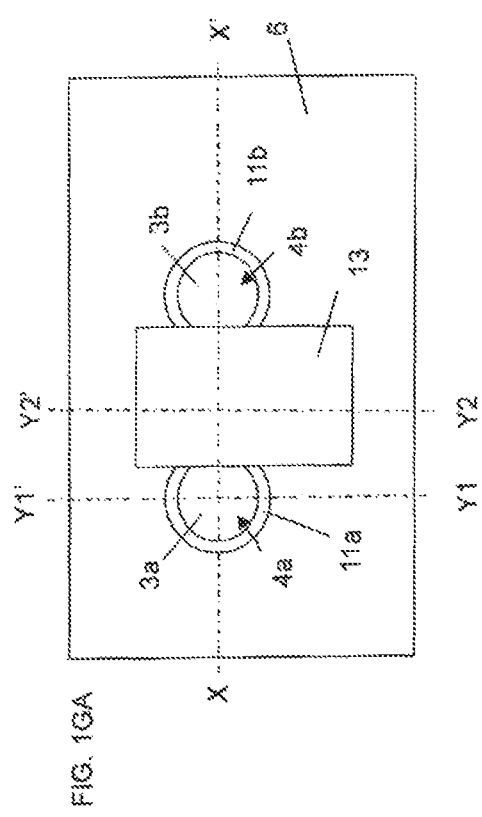
FIG. 1GB
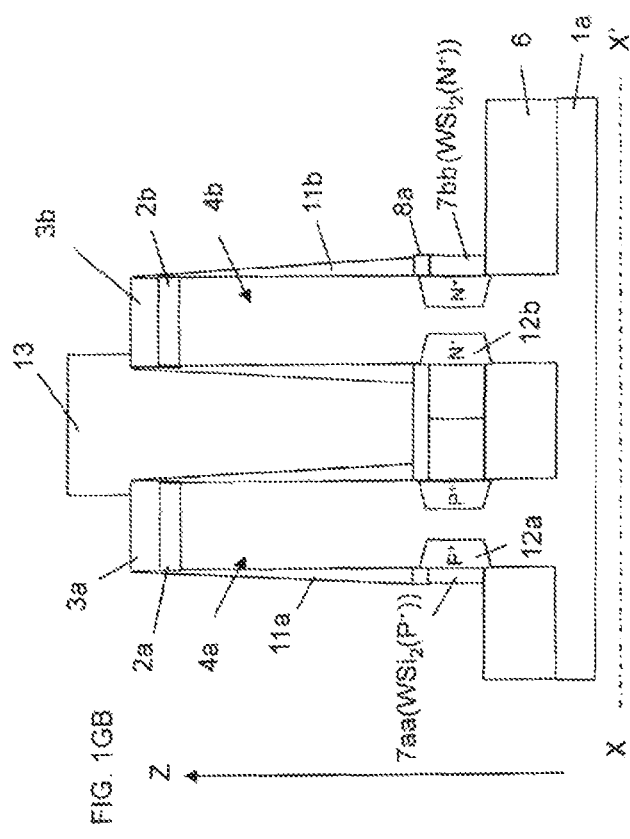

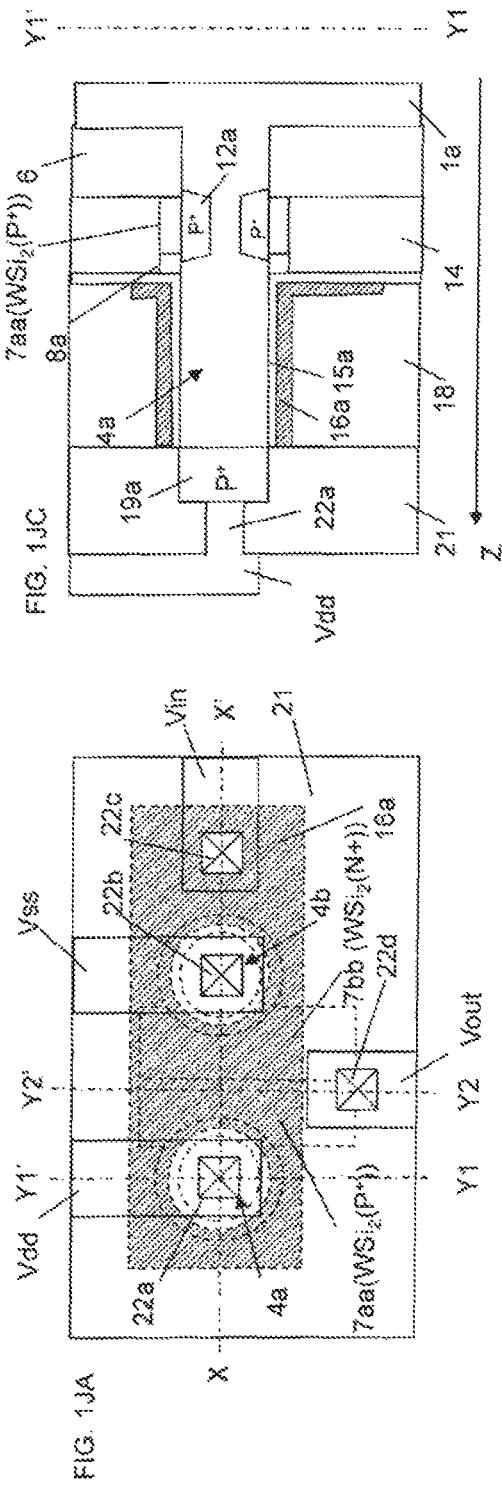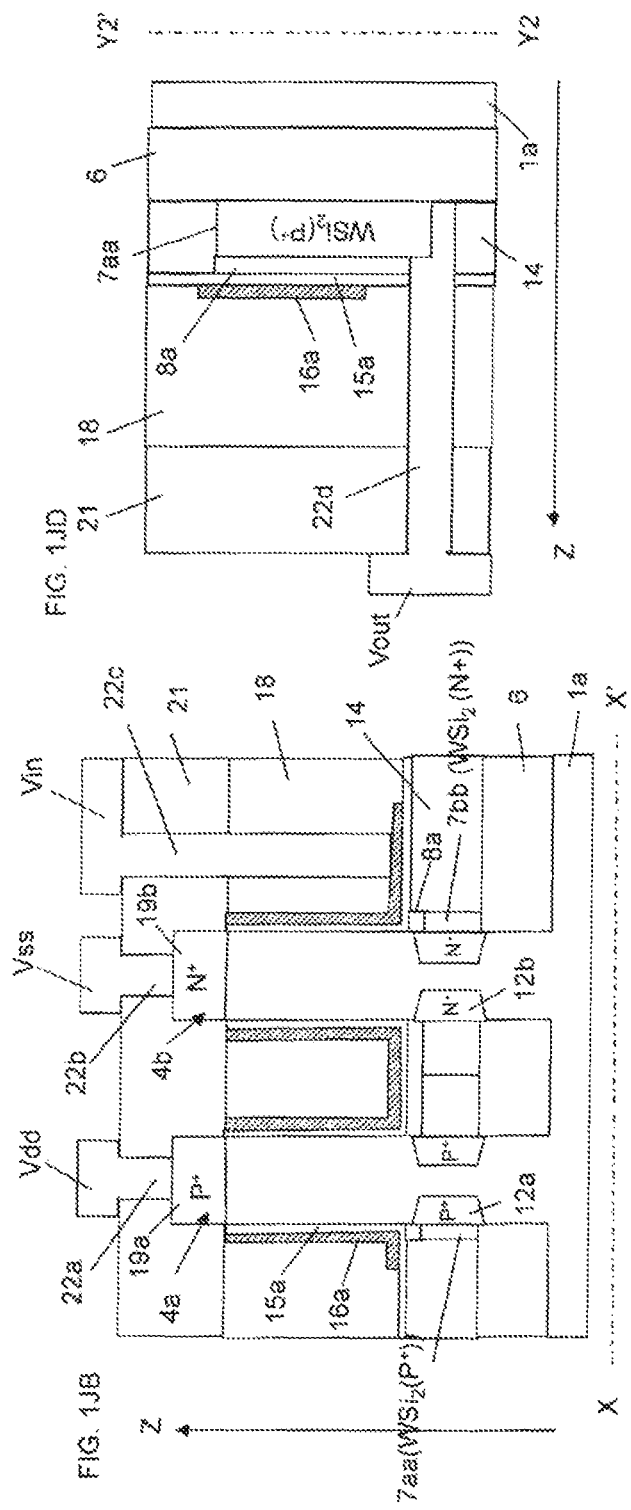

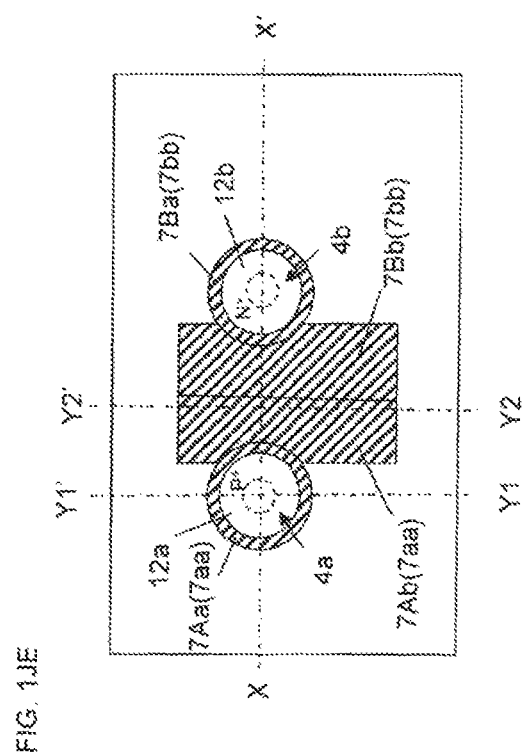

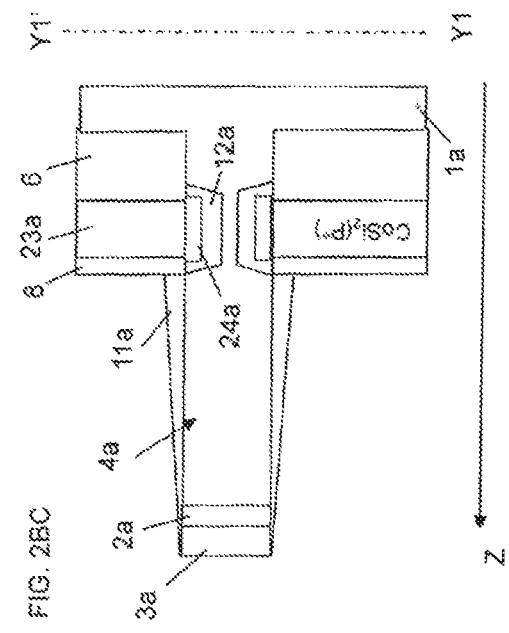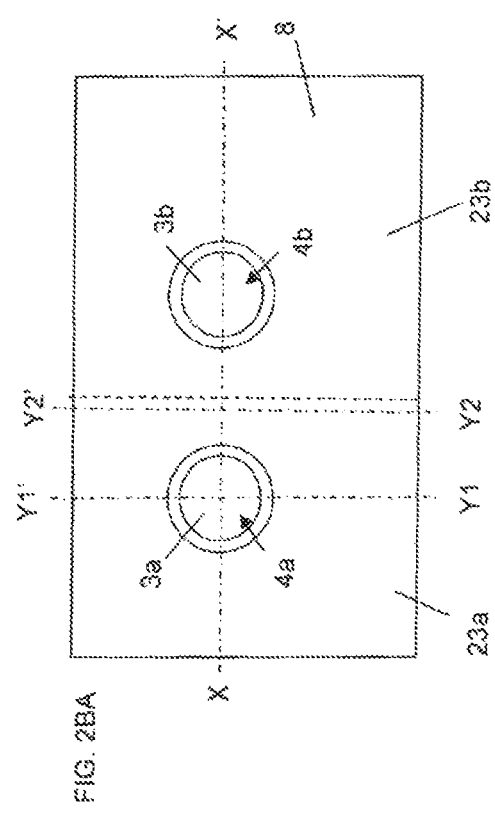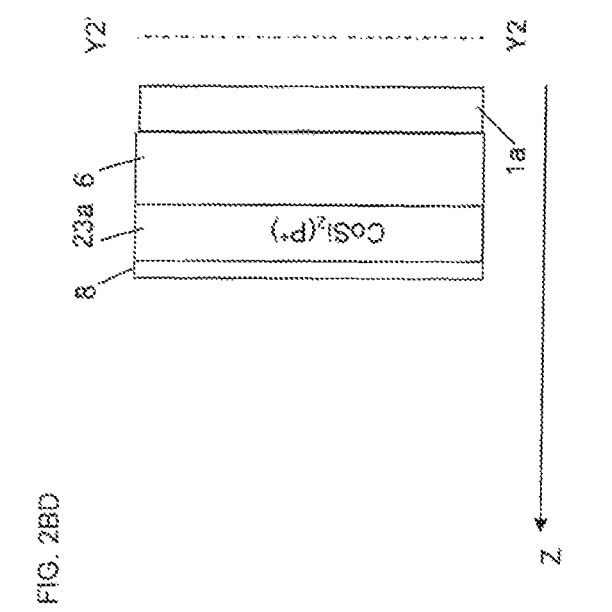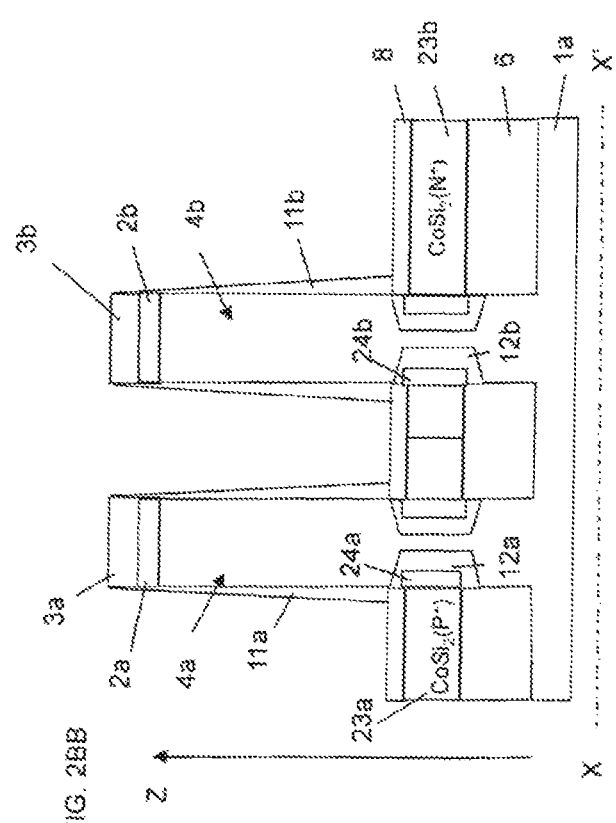

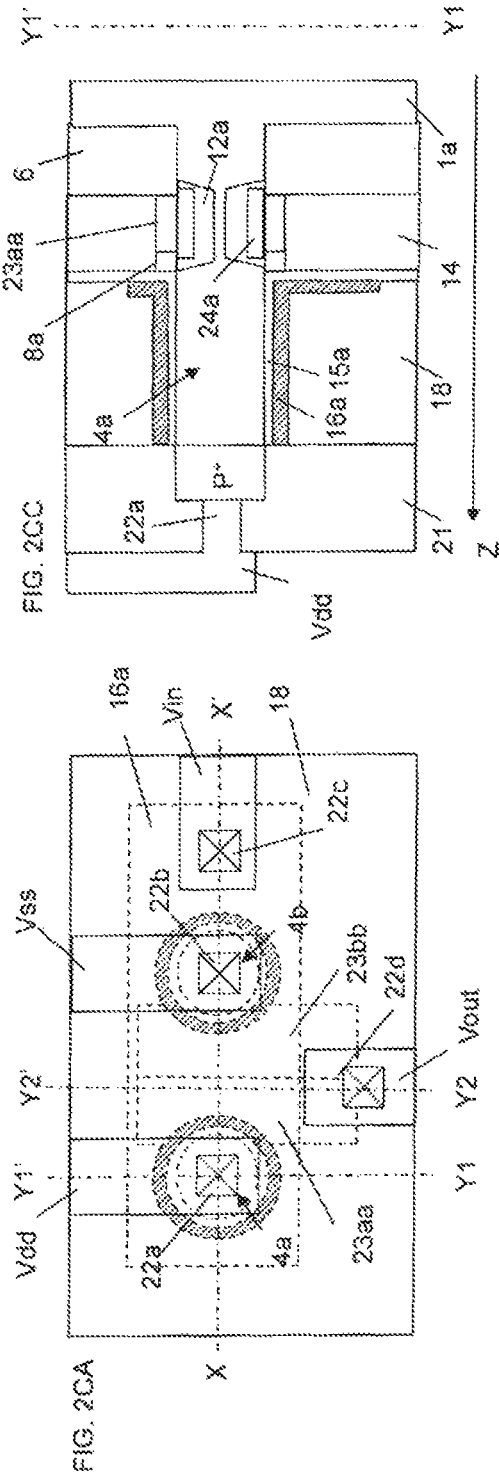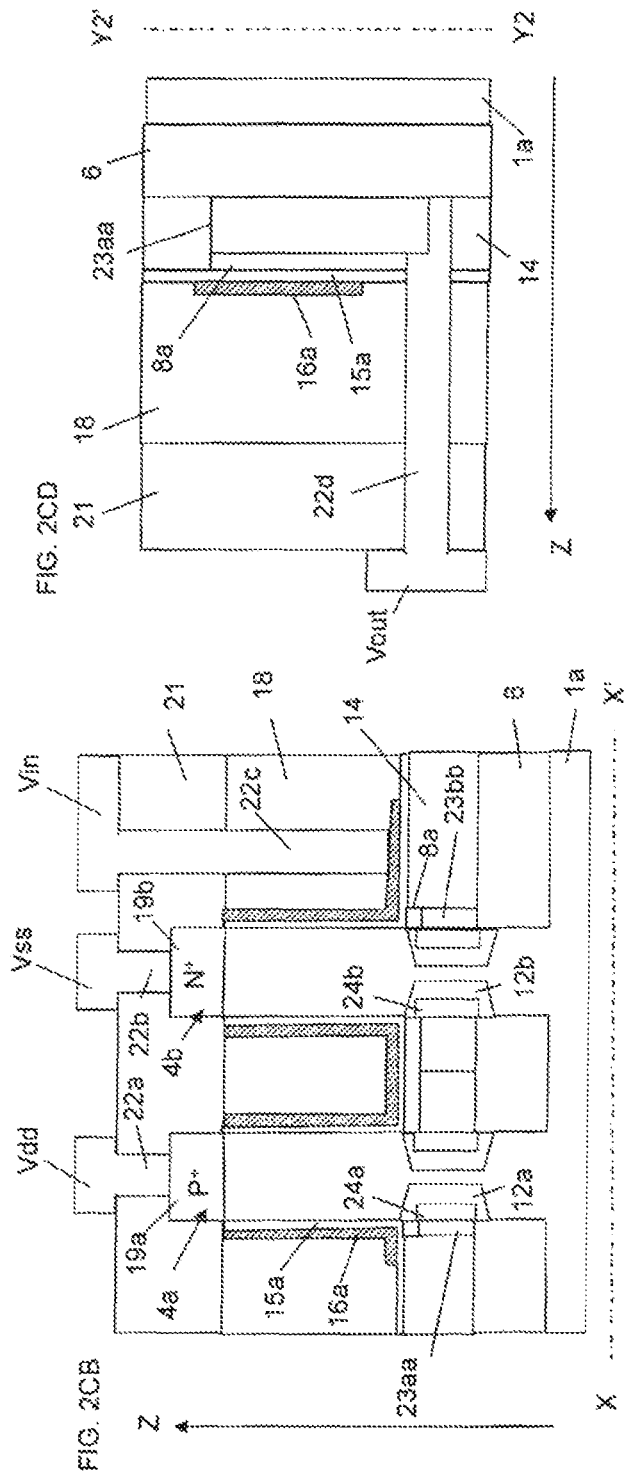

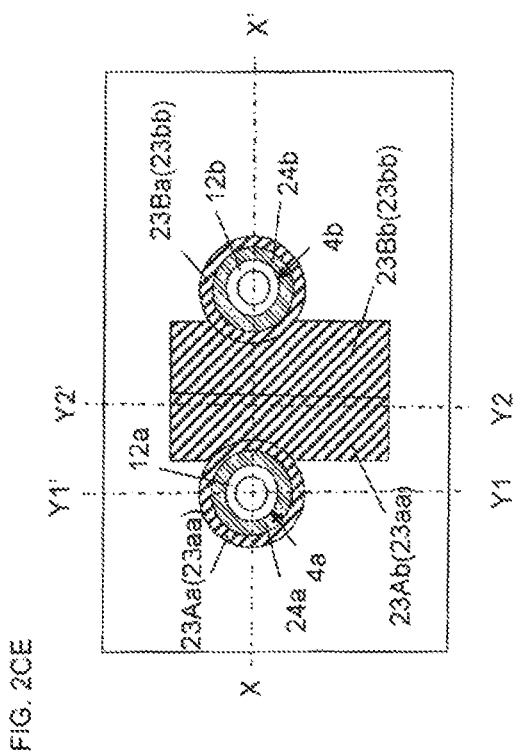

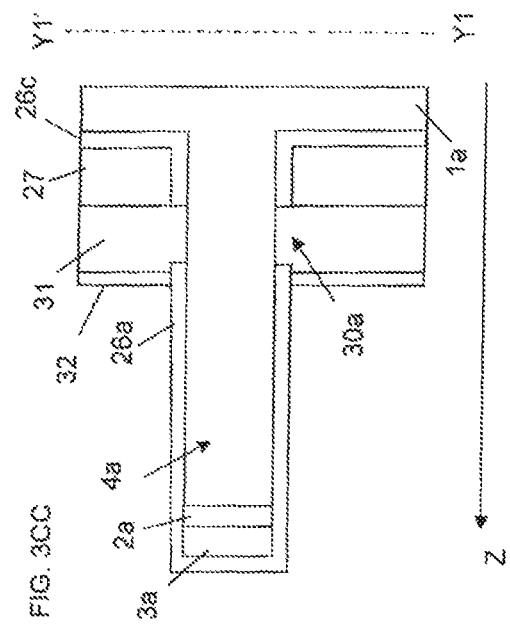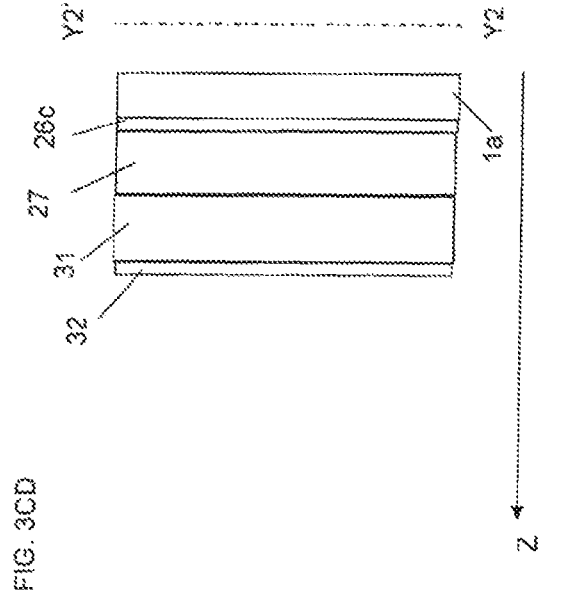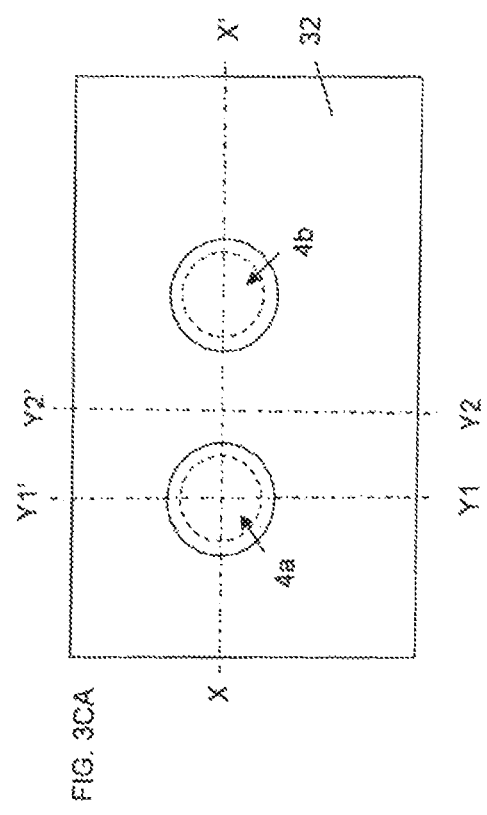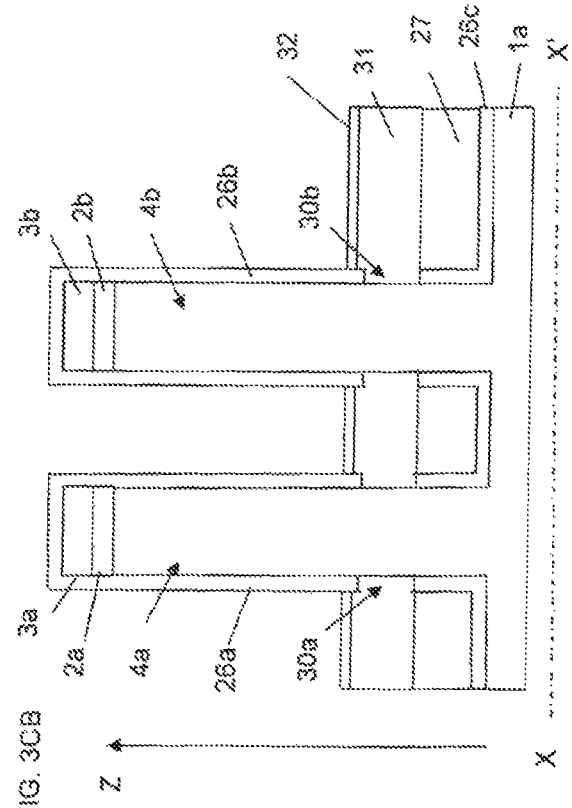

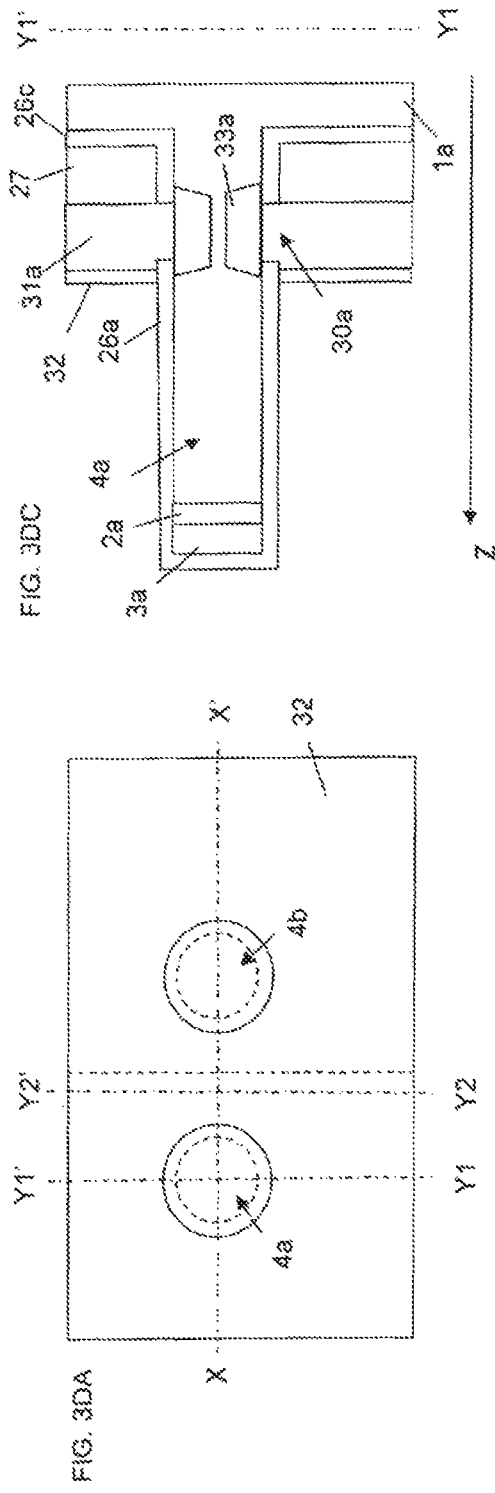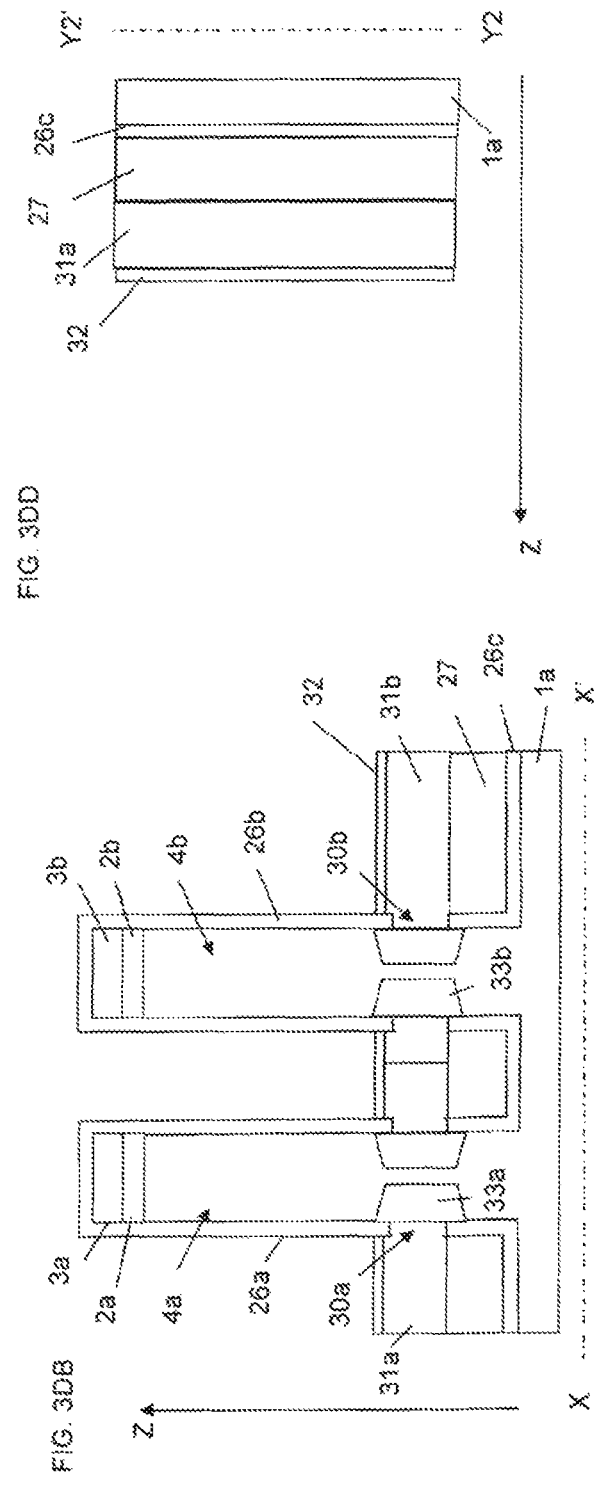

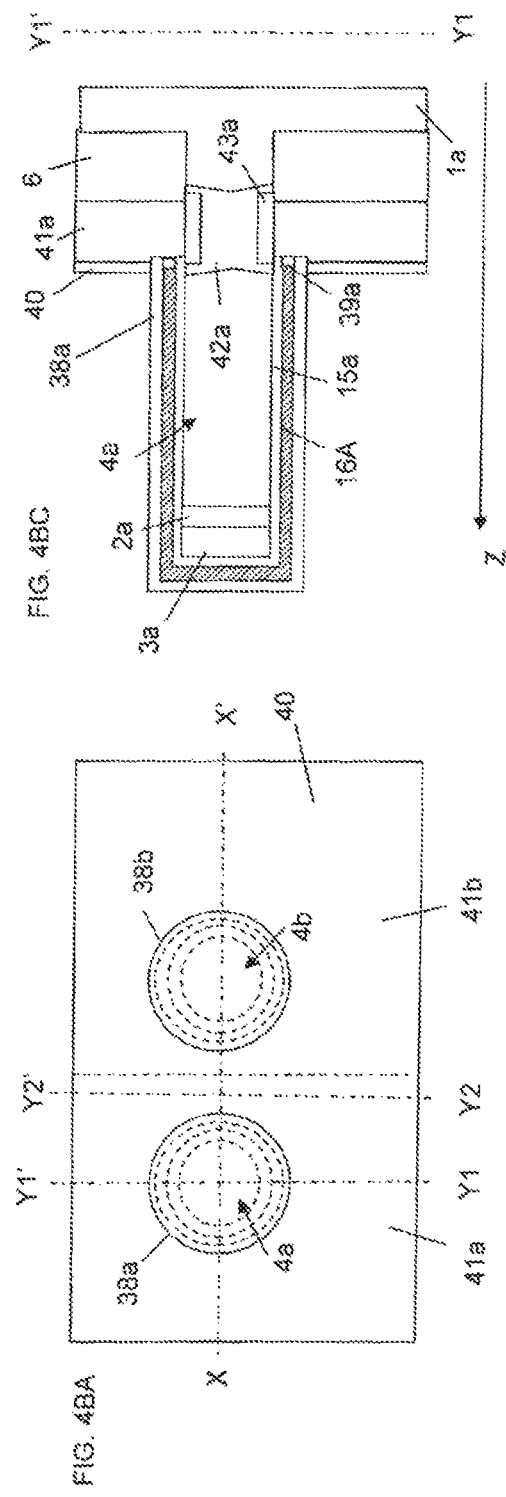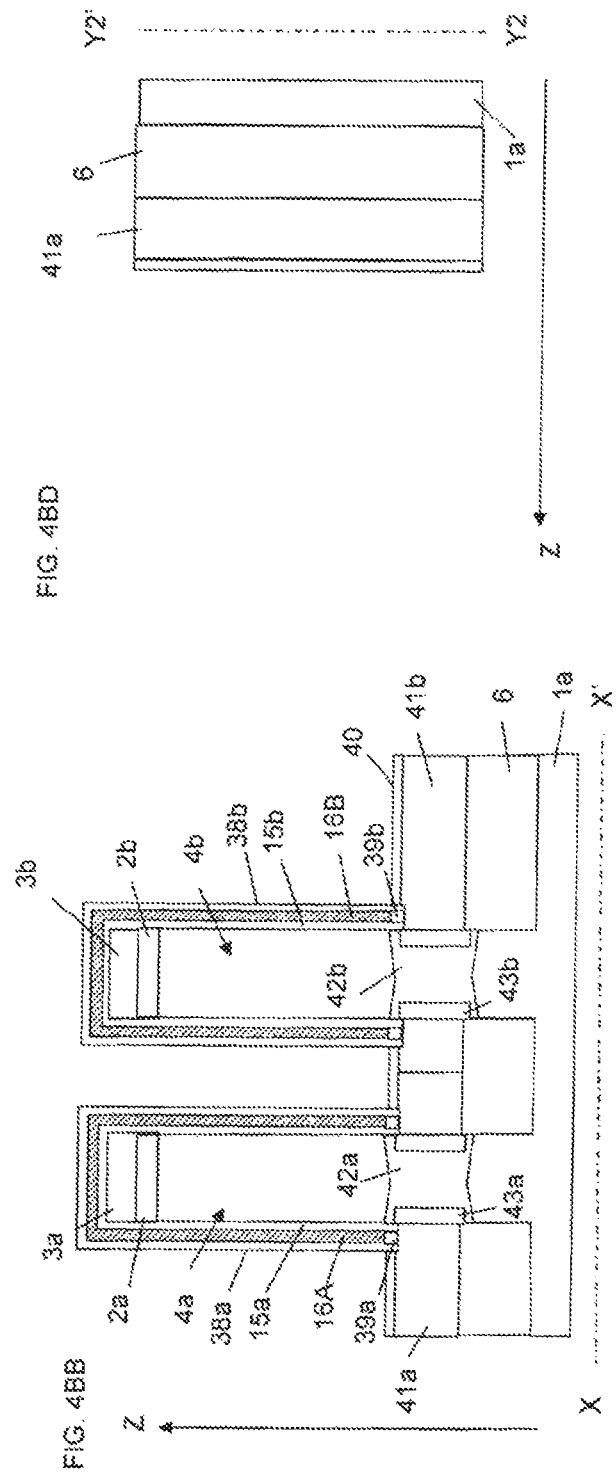

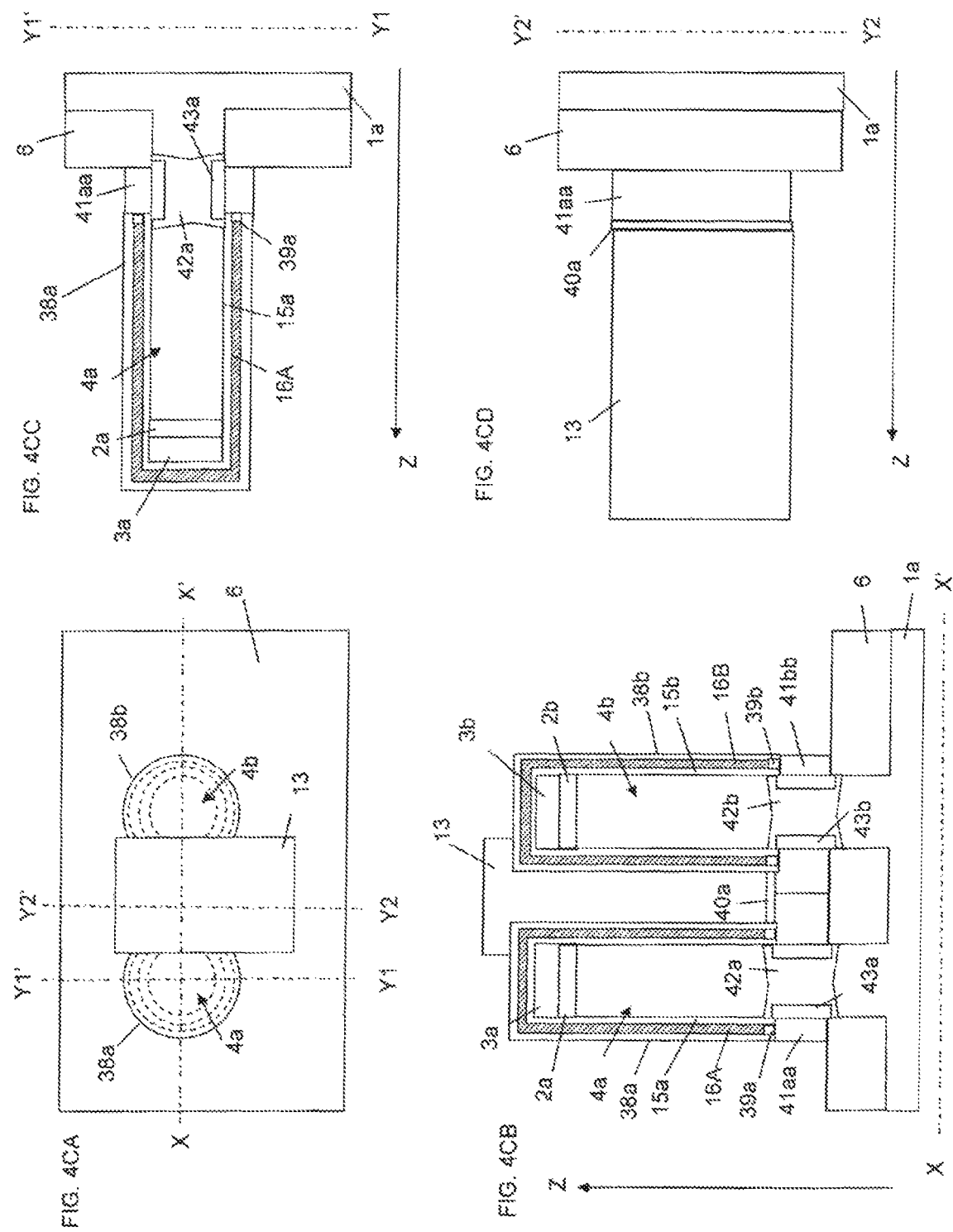

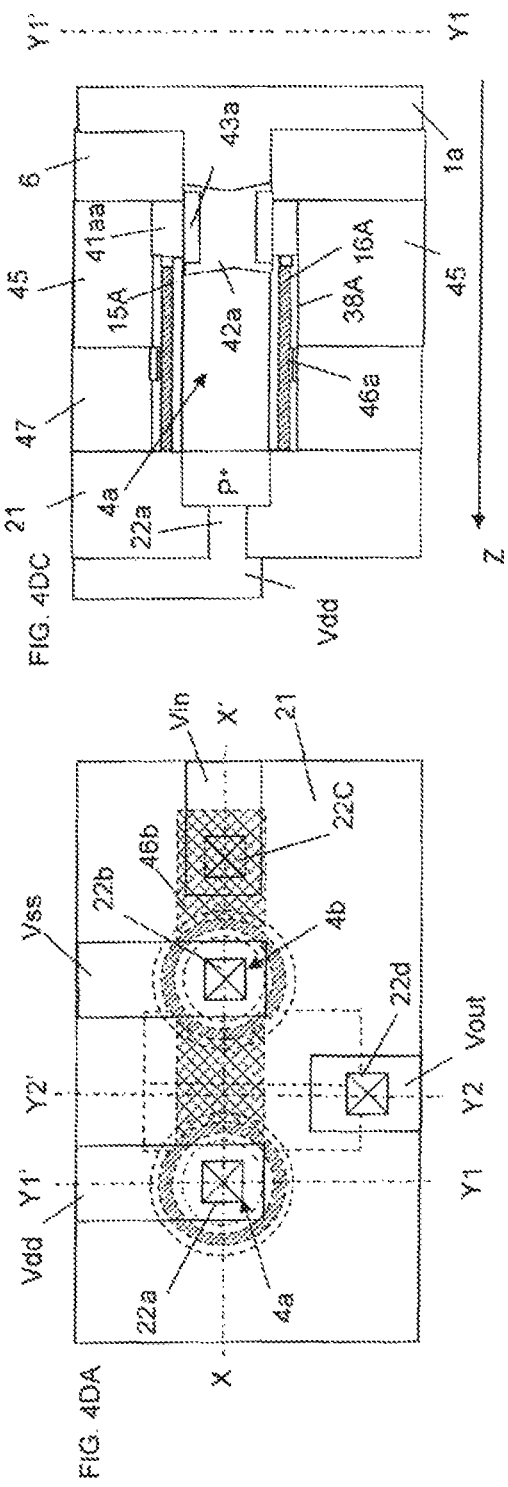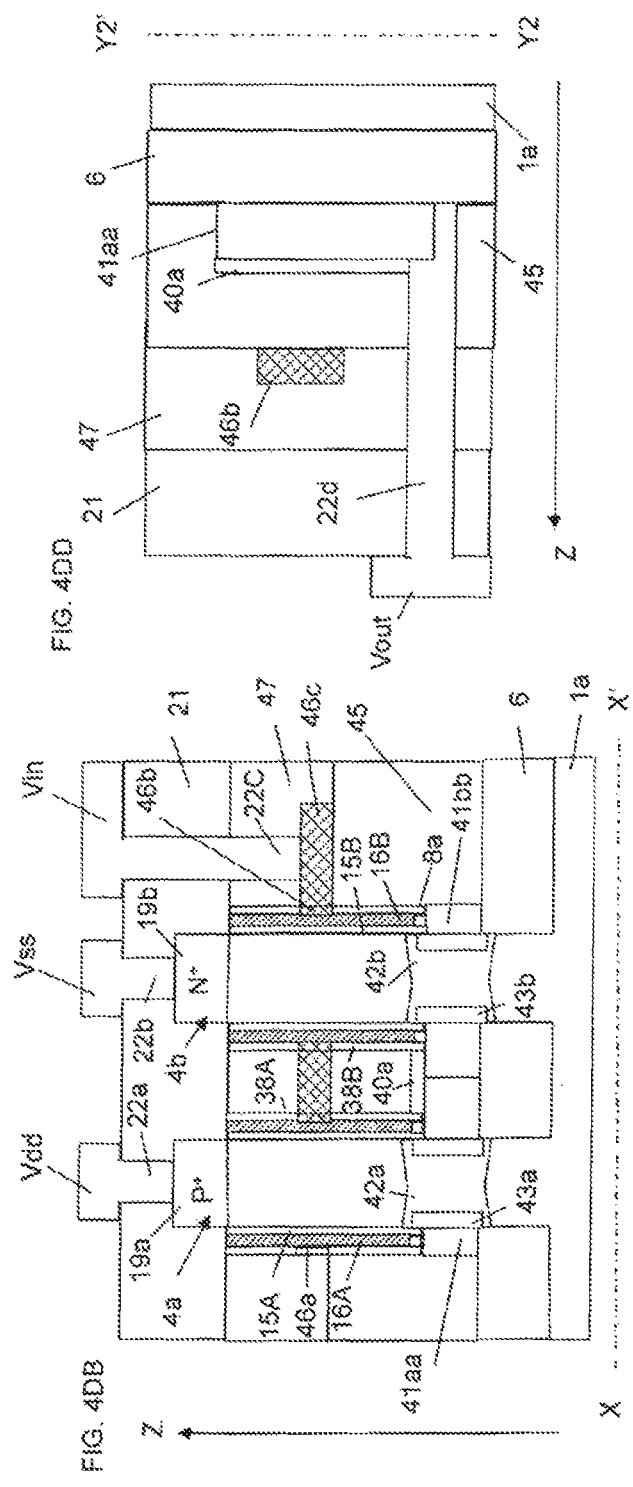

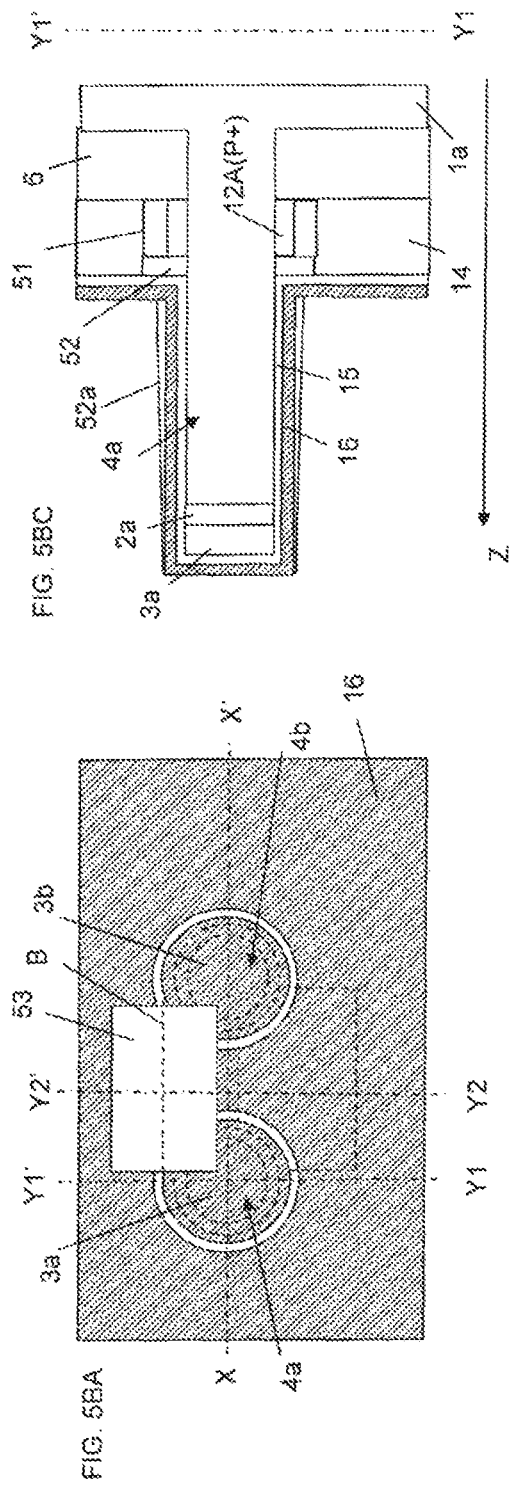
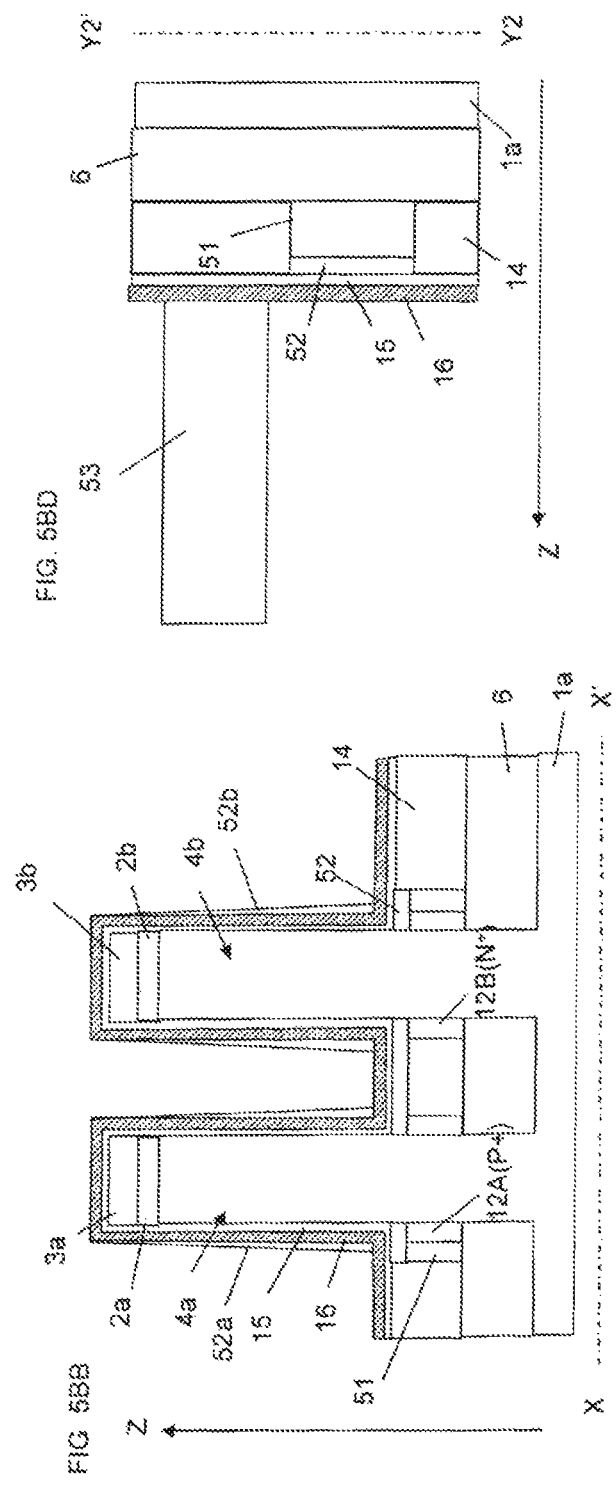

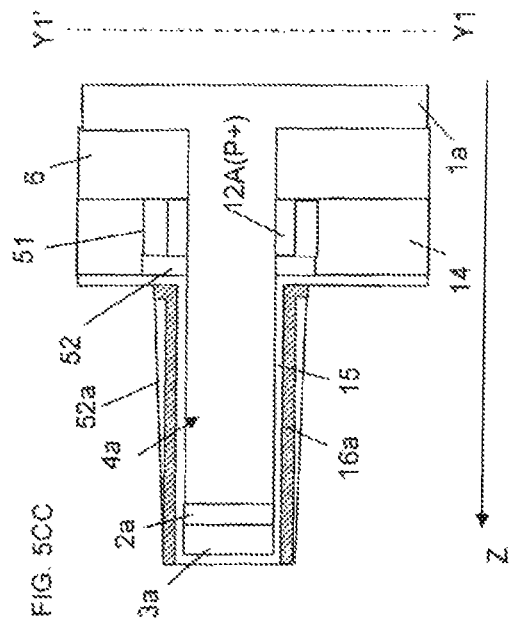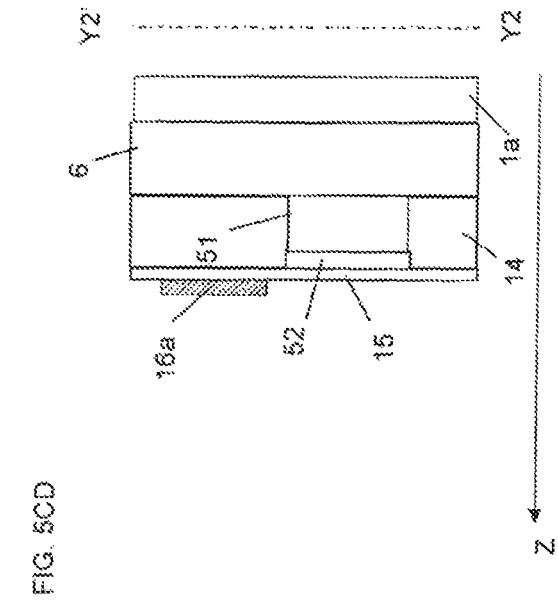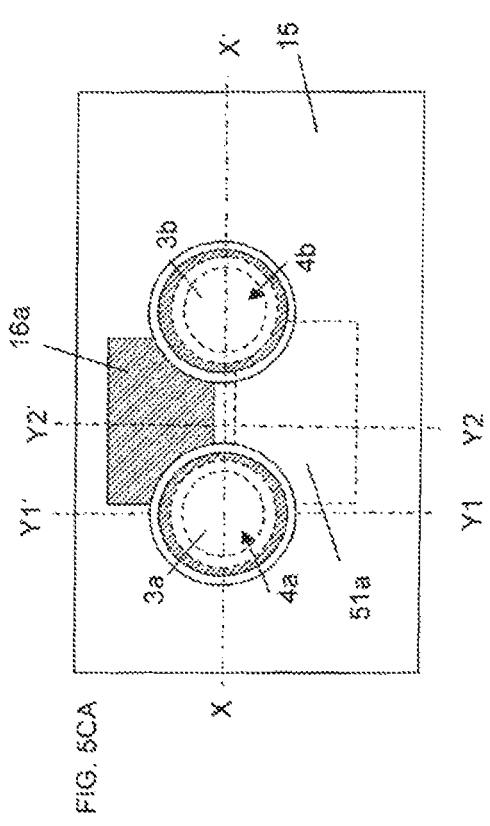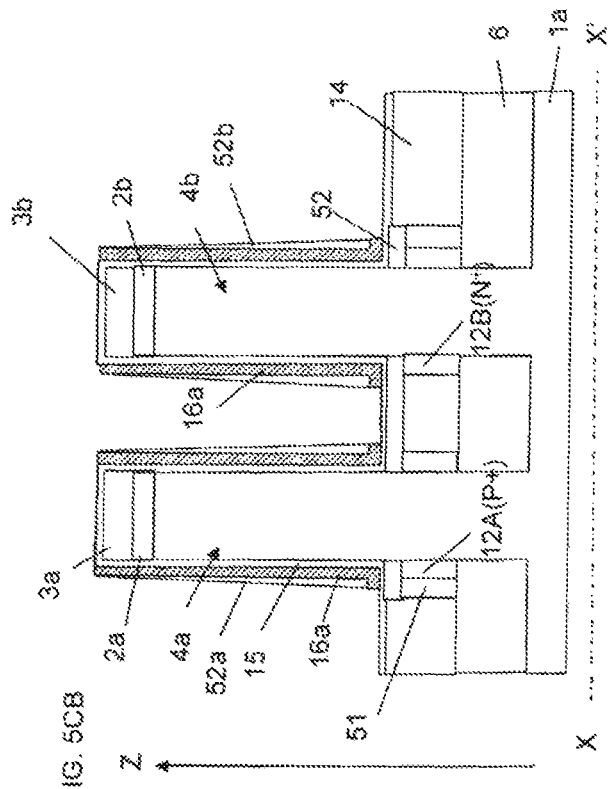

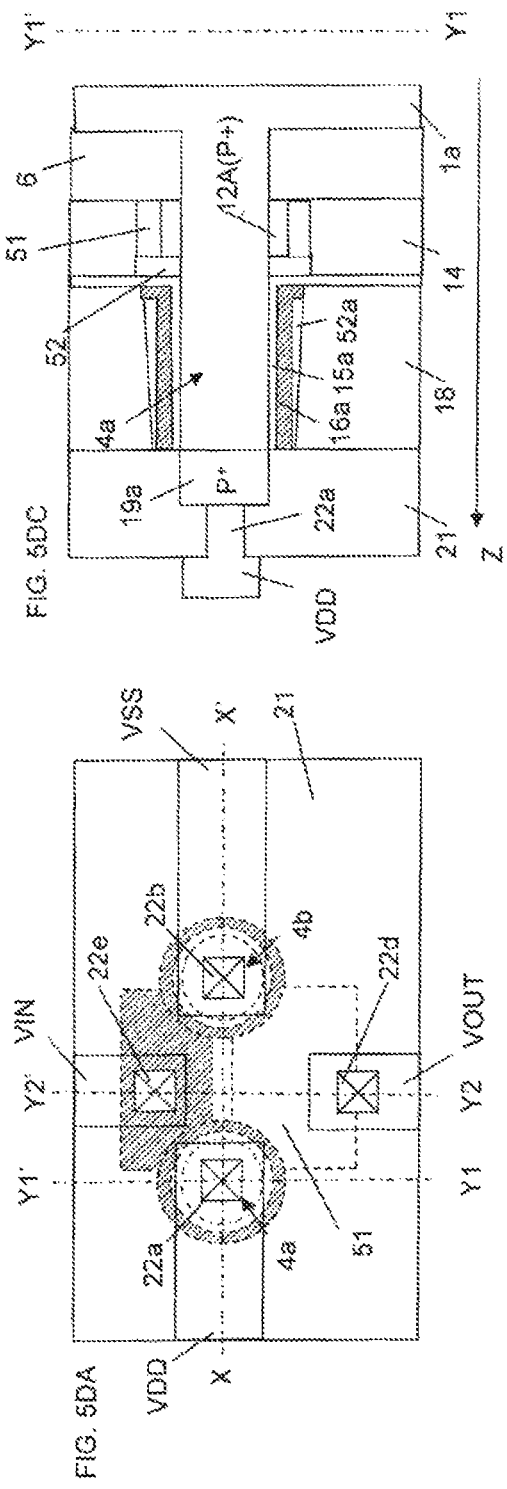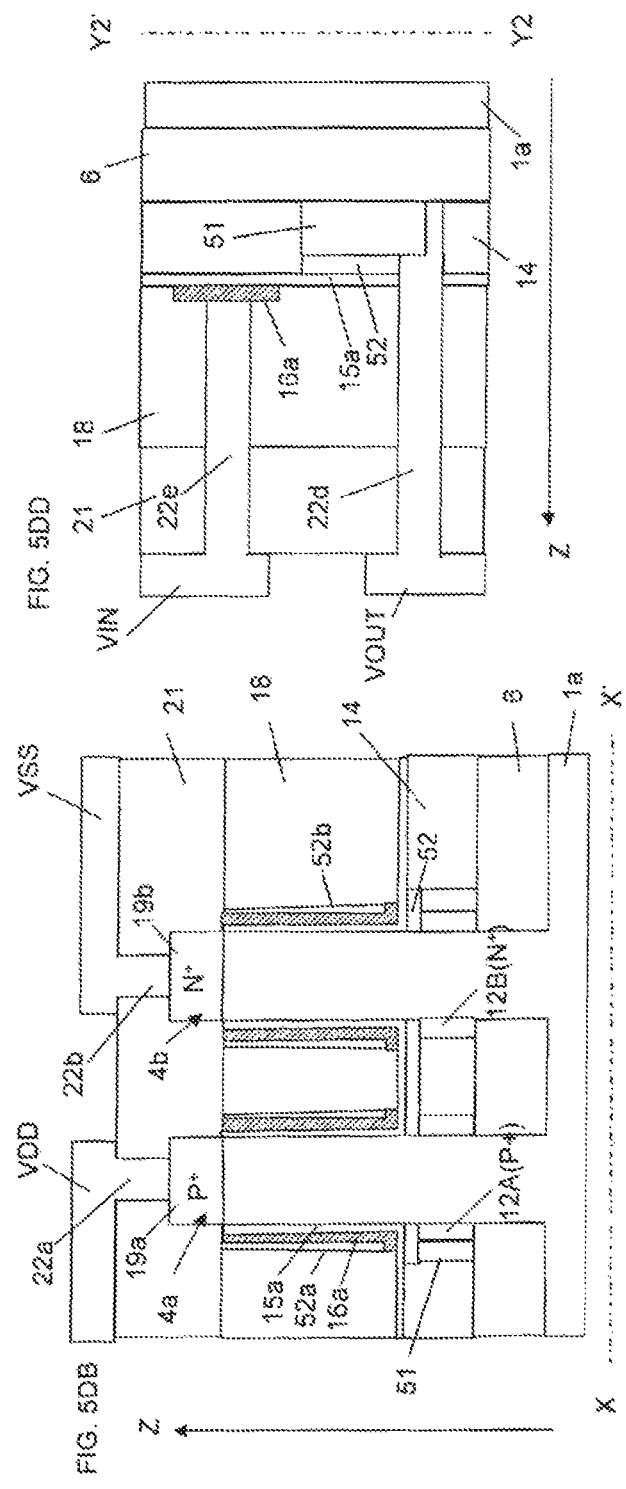

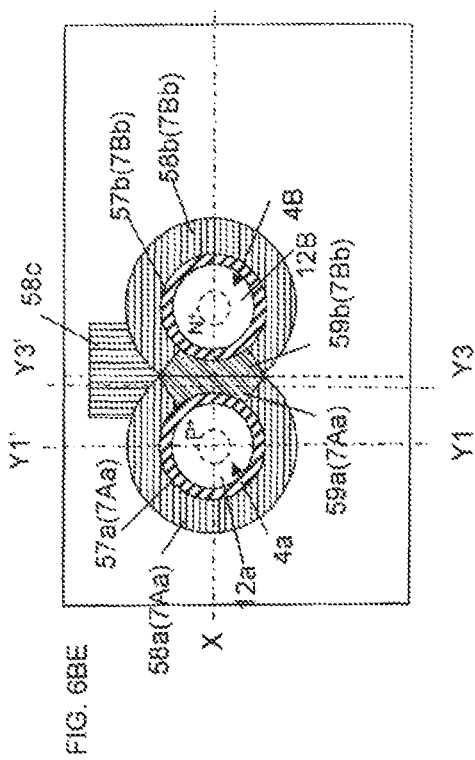

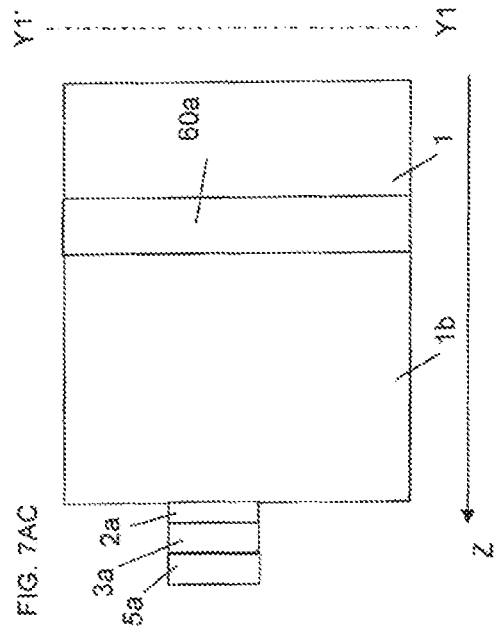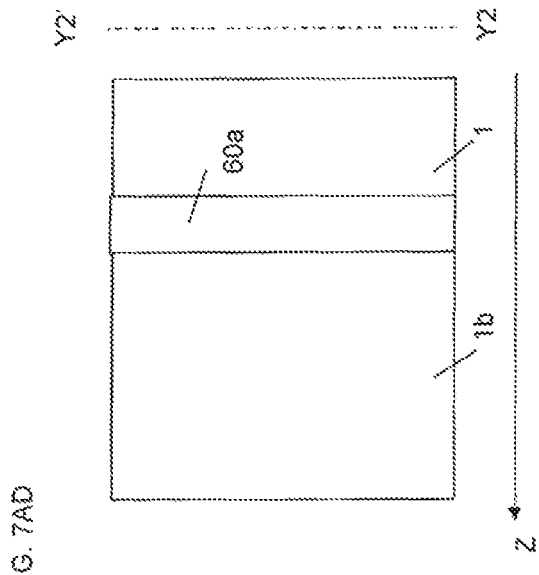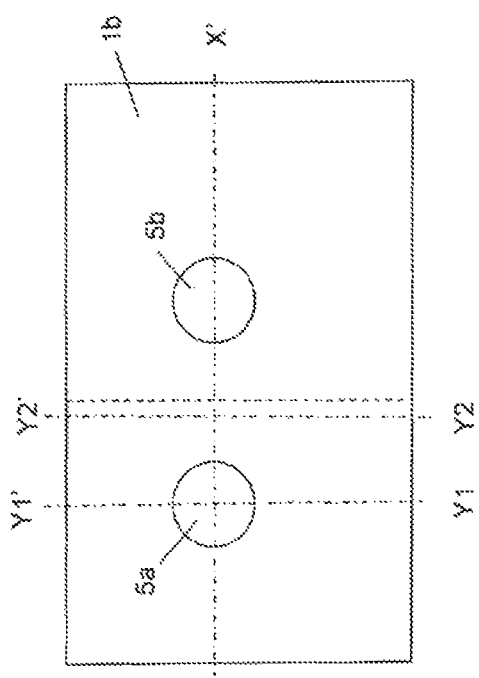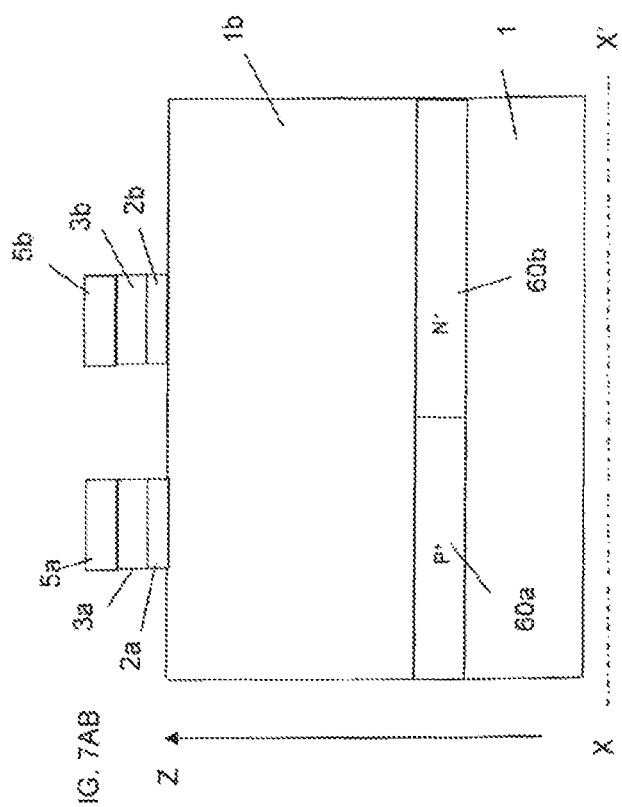

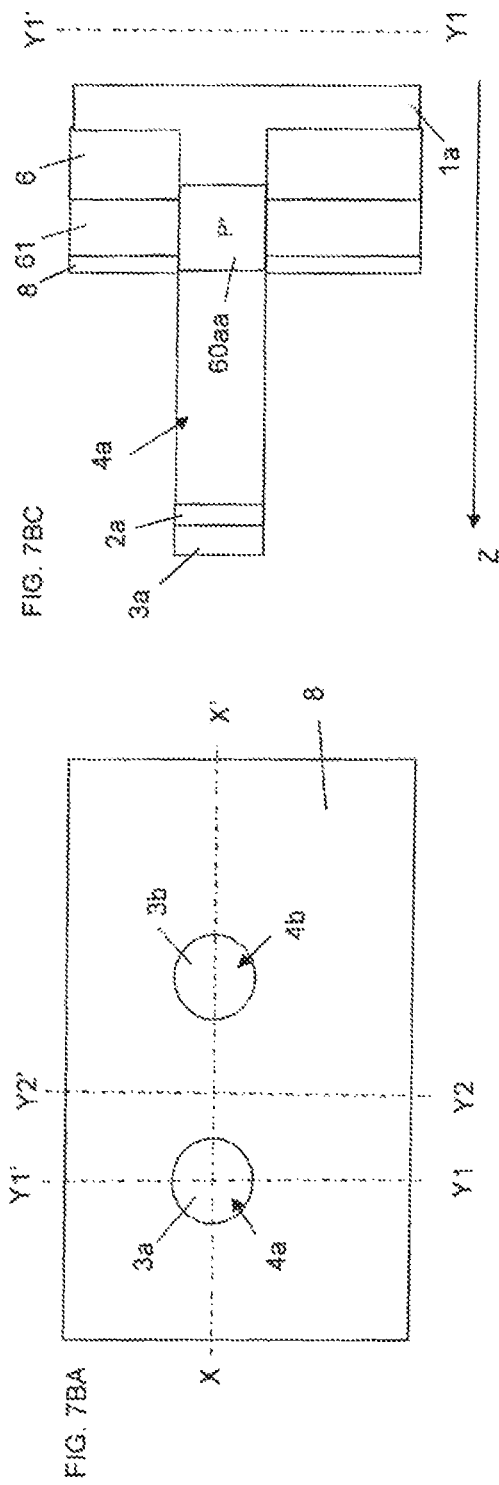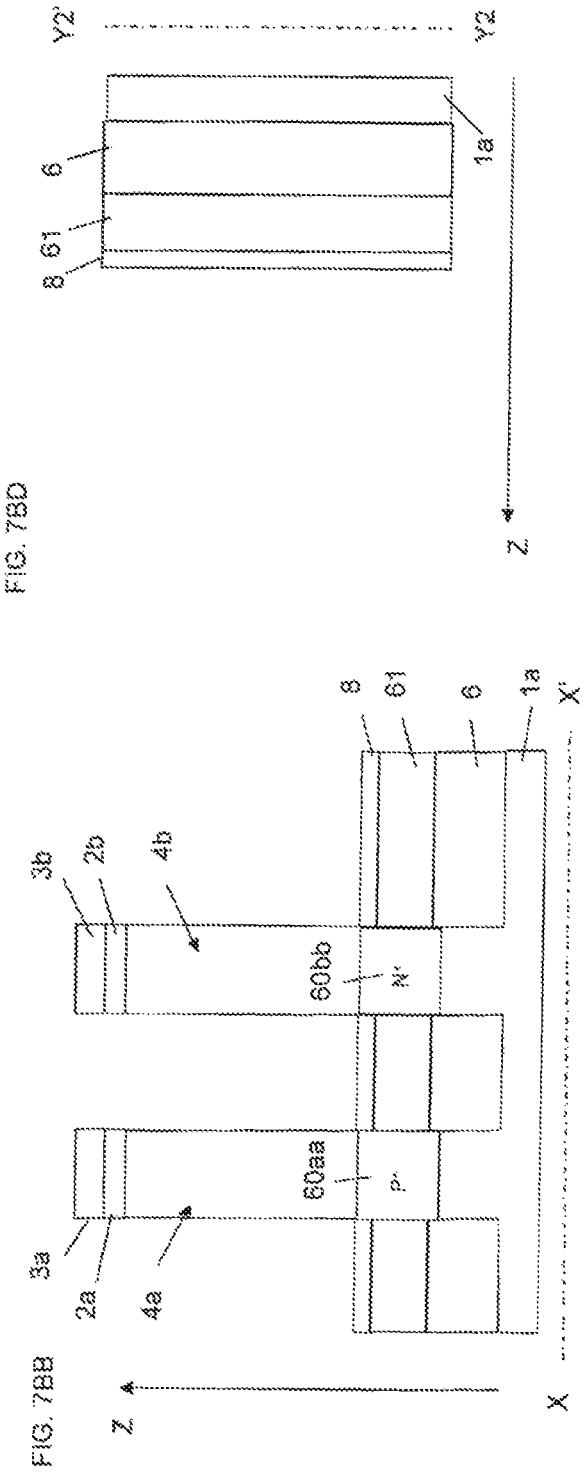

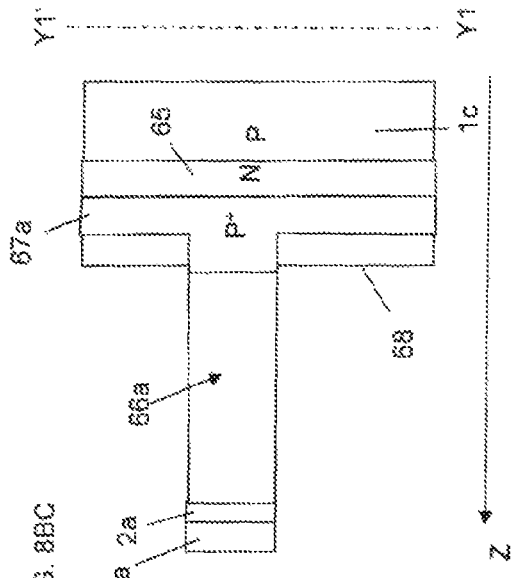
FIG. 8BC
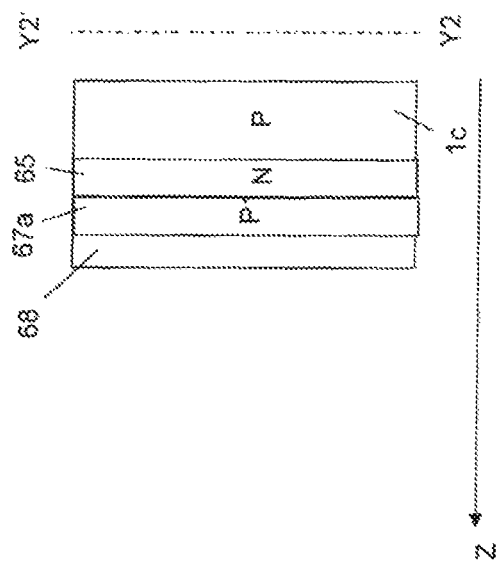
FIG. 8BD
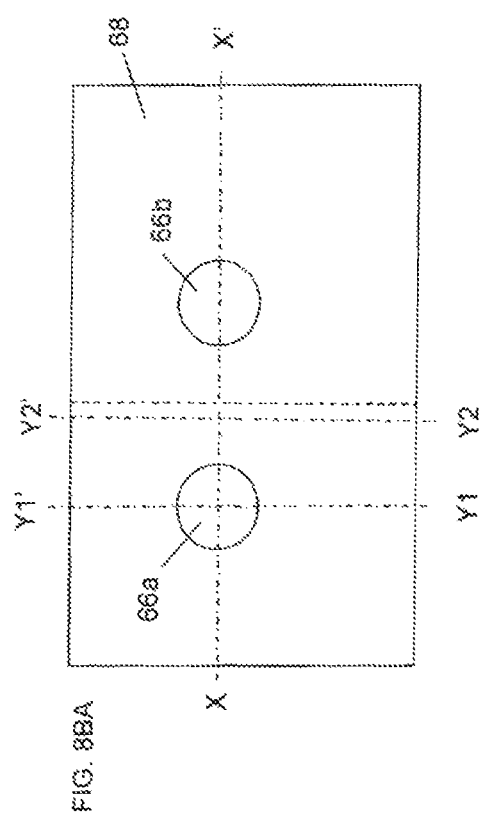
FIG. 8BA
FIG. 8BB
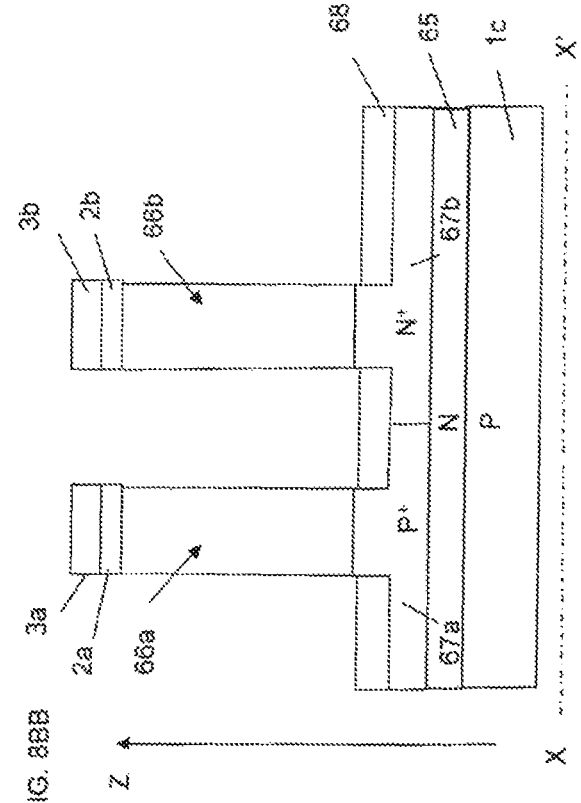

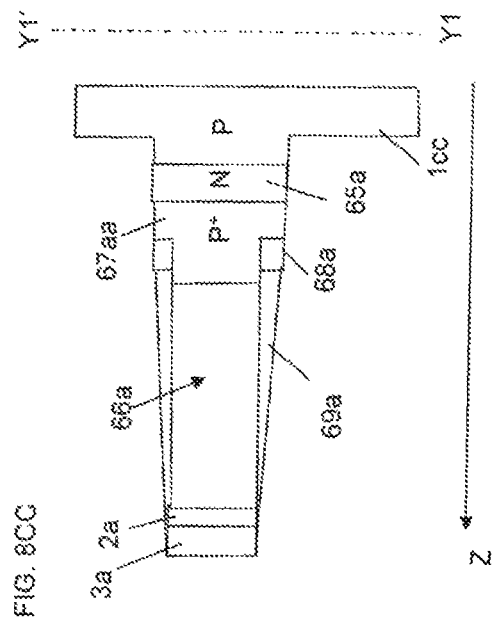
FIG. 8CC
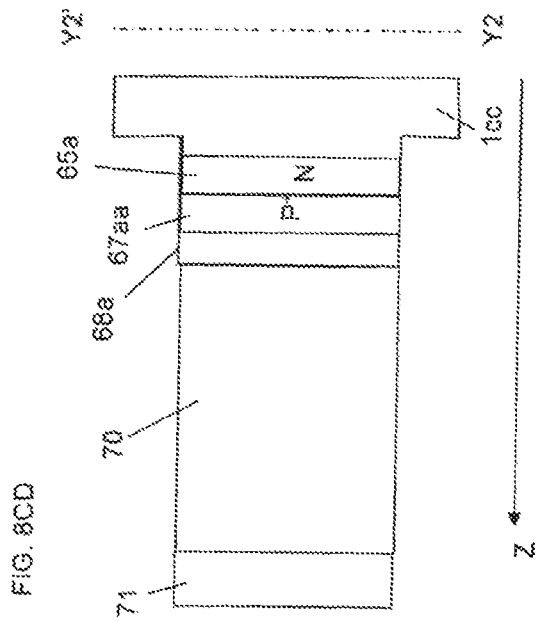
FIG. 8CD
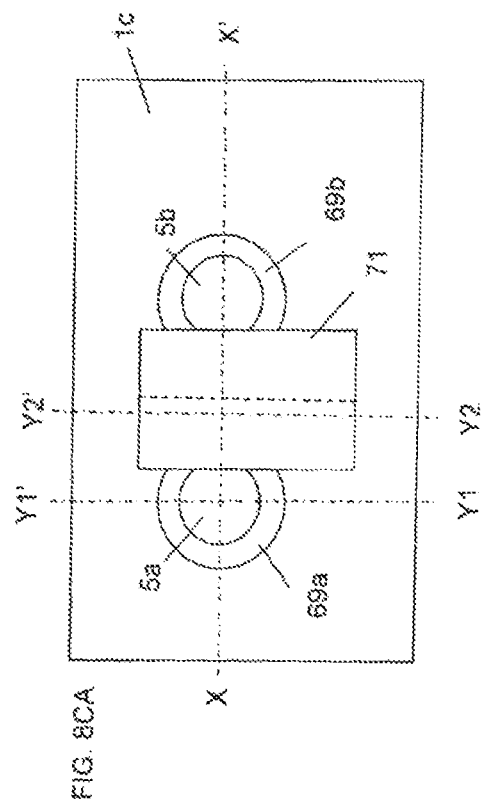
FIG. 8CA
FIG. 8CB
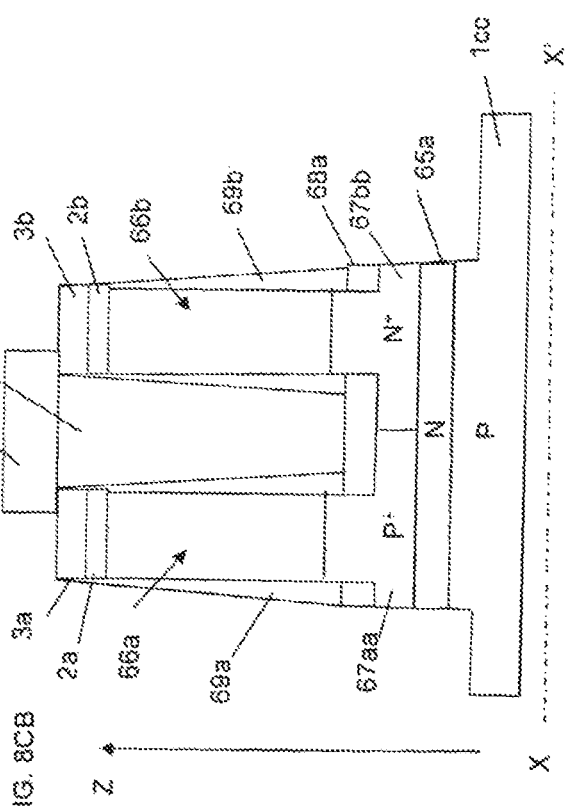

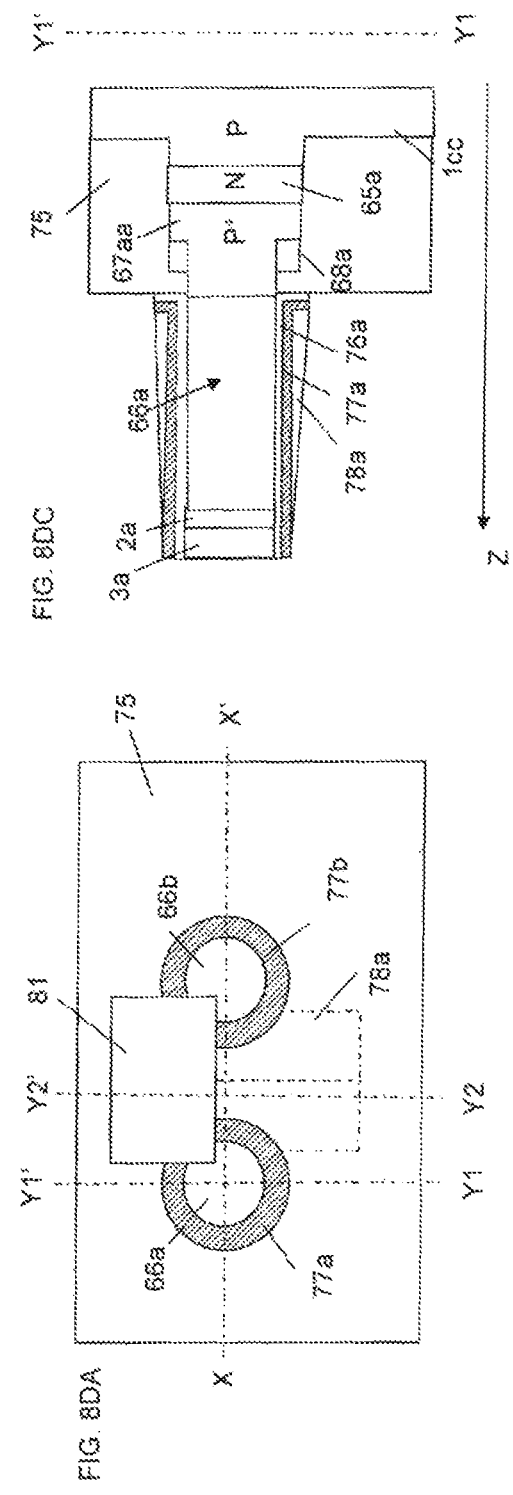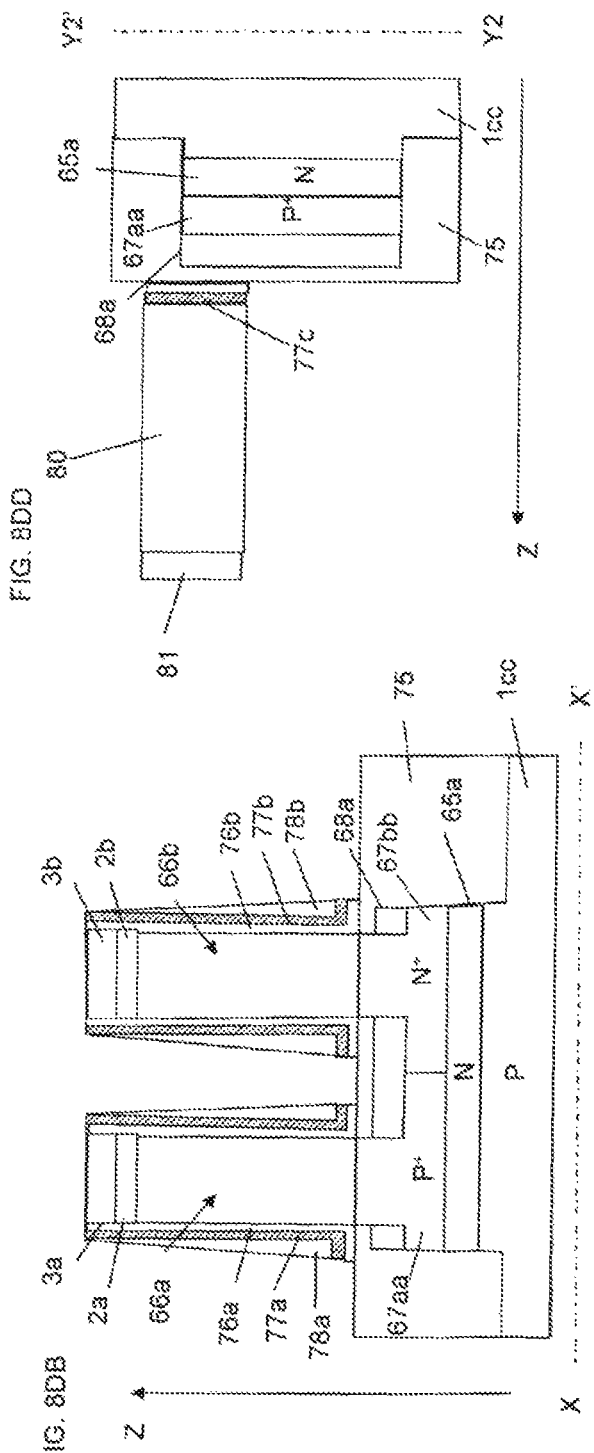

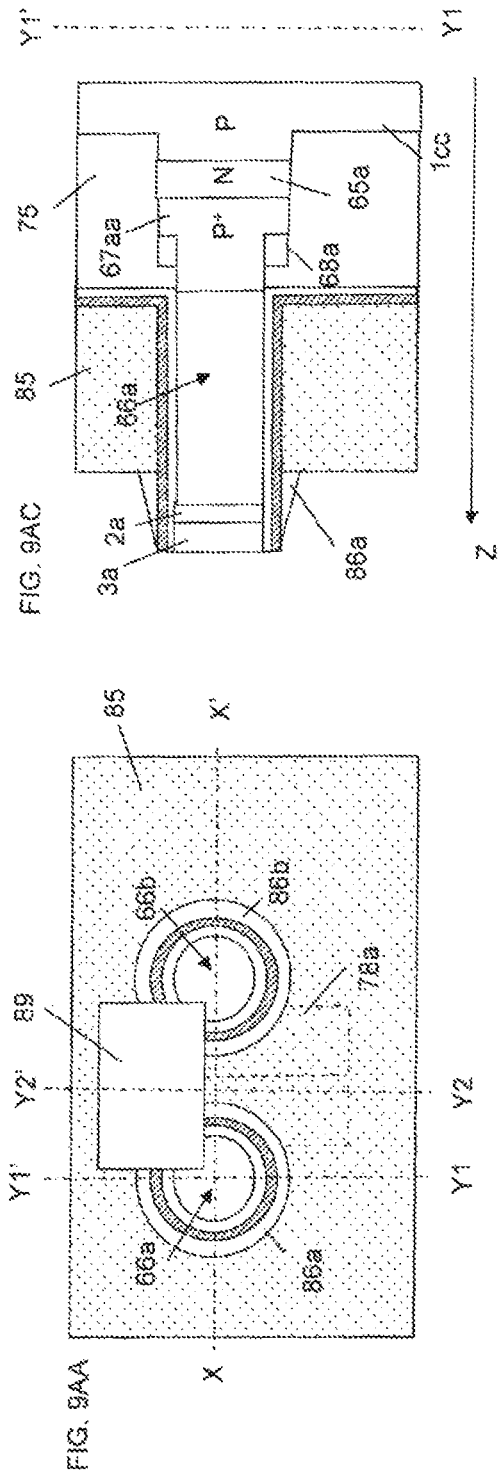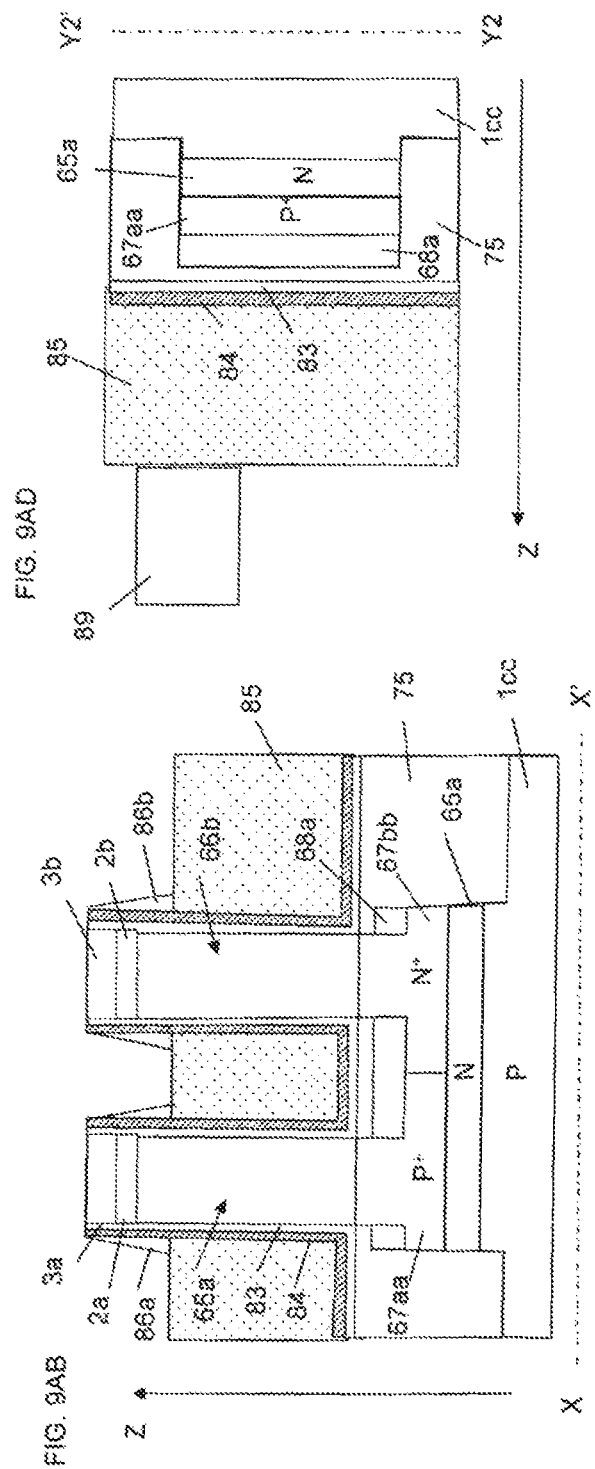

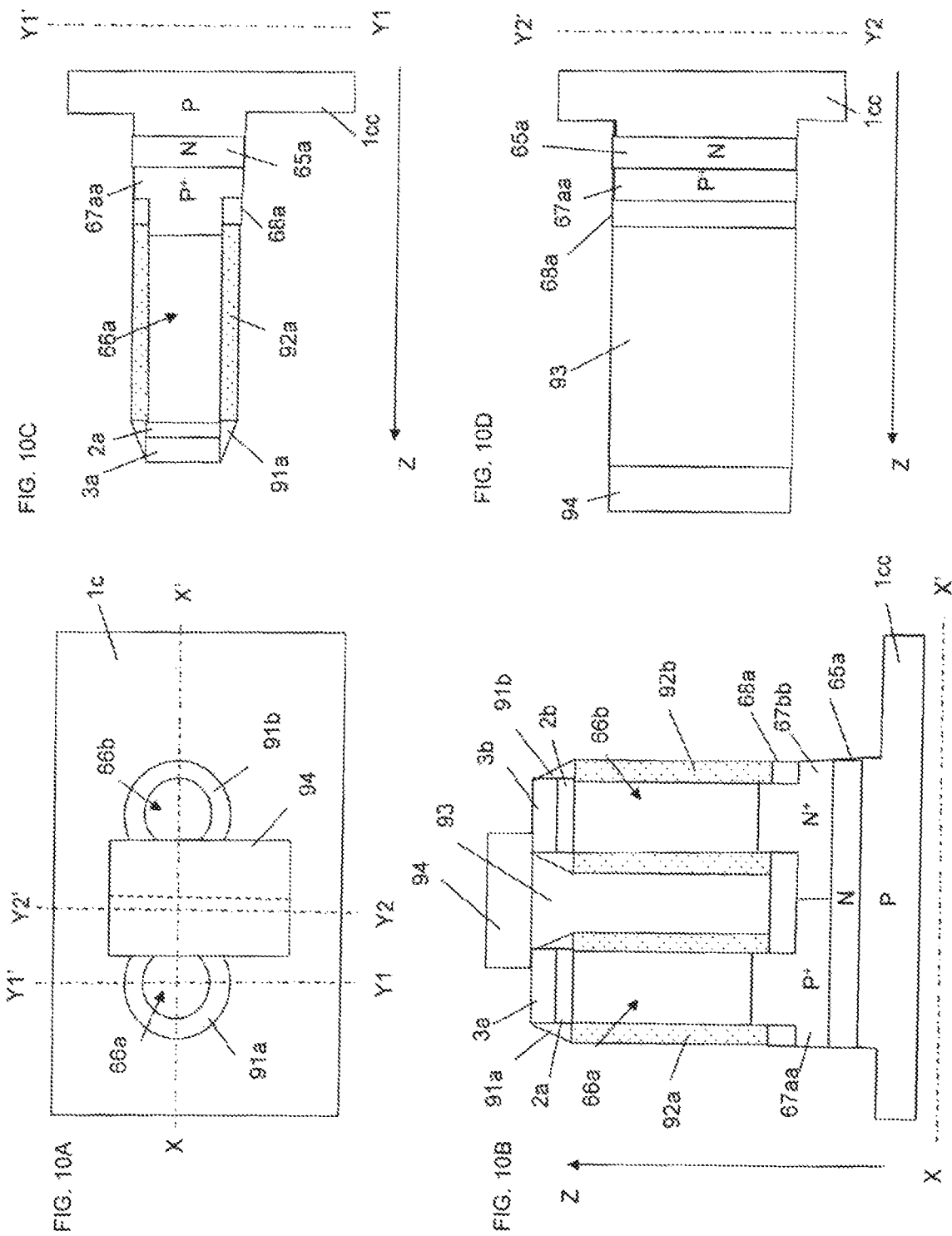

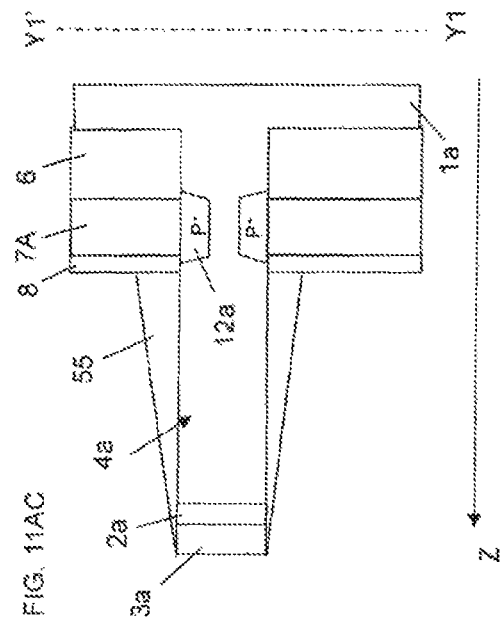
FIG. 11AA
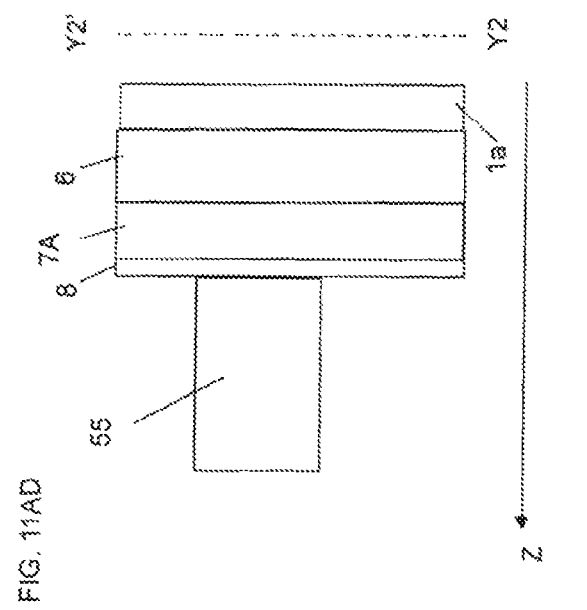
FIG. 11AC
FIG. 11AD
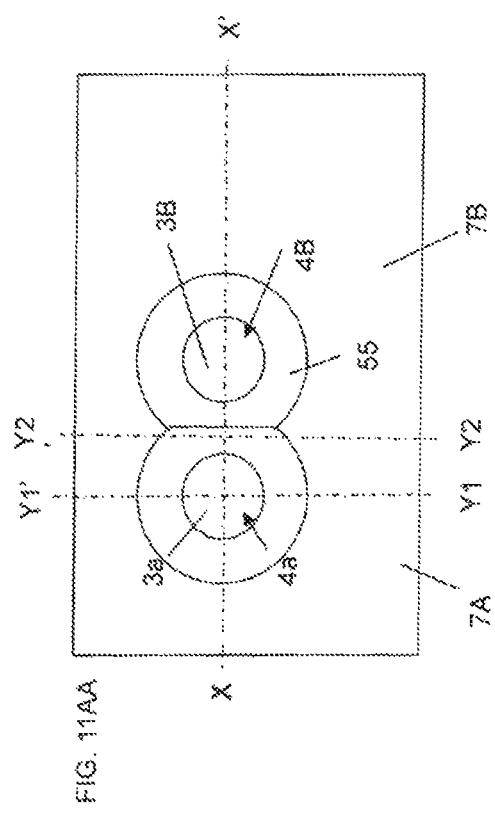
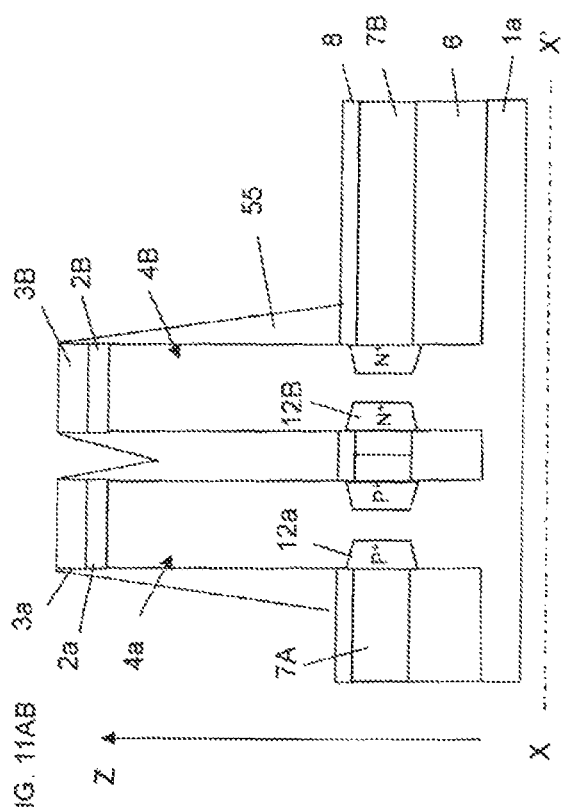
FIG. 11AB

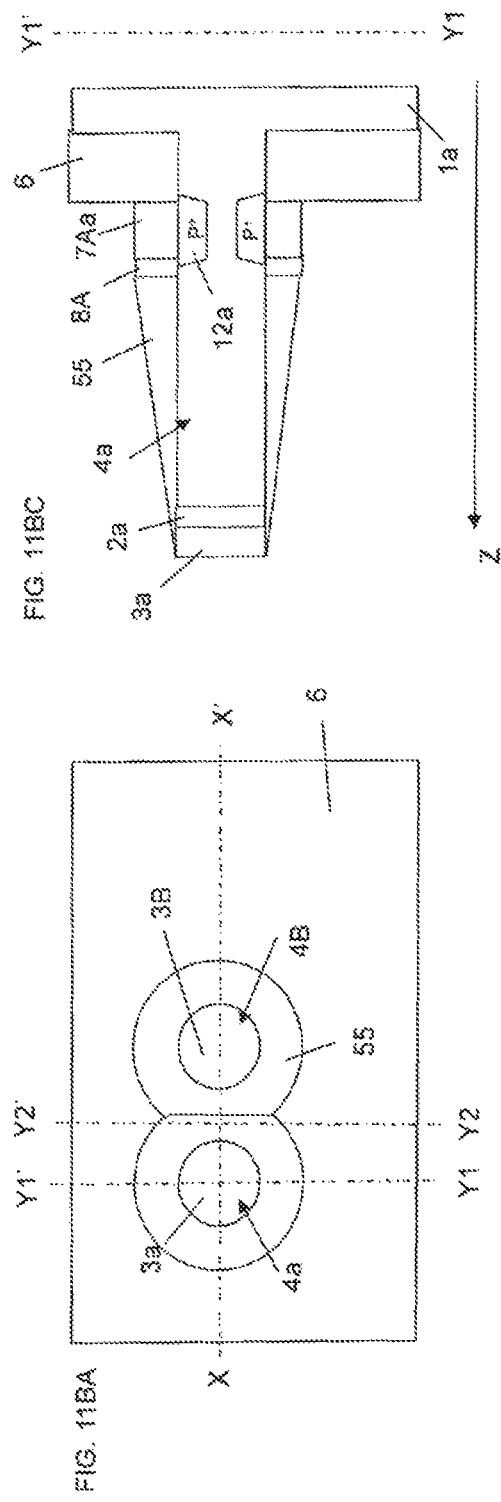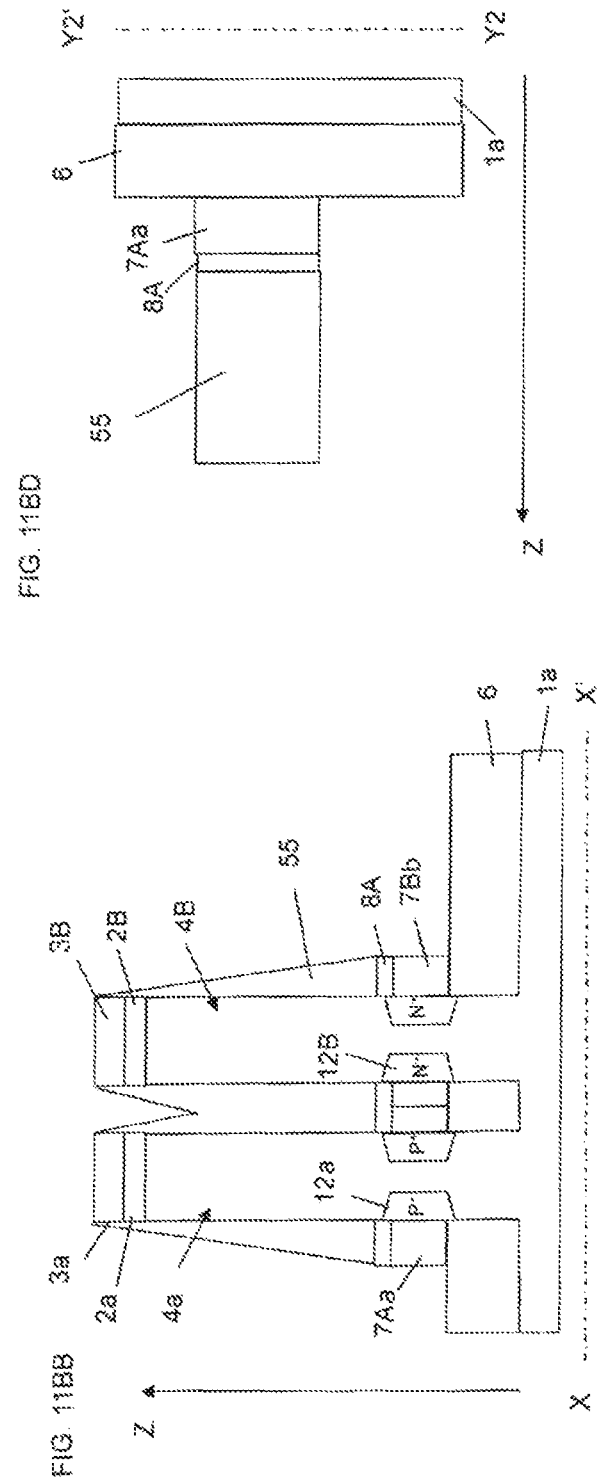

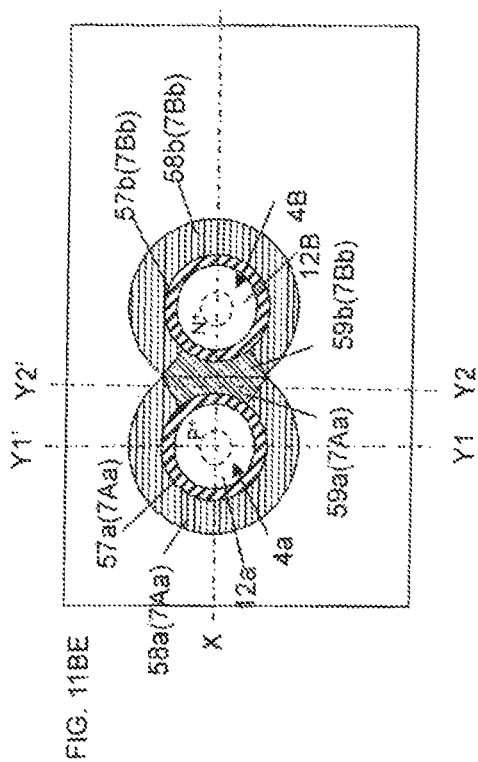

SEMICONDUCTOR DEVICE INCLUDING SGT

RELATED APPLICATIONS

This application is a divisional patent application of U.S. application Ser. No. 15/917,168, filed Mar. 9, 2018, which is a continuation-in-part application of PCT/JP2015/085469, filed Dec. 18, 2015, the entire contents of which are incorporated herein by reference.

BACKGROUND OF THE INVENTION

1. Field of the Invention

The present invention relates to a semiconductor device including a surrounding gate MOS transistor (SGT) and a method for producing the semiconductor device.

2. Description of the Related Art

In recent years, semiconductor devices including SGTs have been required to have higher density and higher performance.

In planar MOS transistors, the channel of a P- or N-channel MOS transistor is formed in a horizontal direction along the surface of a semiconductor substrate between the source and the drain. In contrast, the channel of an SGT is formed in a direction vertical to the surface of a semiconductor substrate (e.g., refer to Japanese Unexamined Patent Application Publication No. 2-188966 and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)).

FIG. 12 schematically illustrates a structure of an N-channel SGT. $N^+$ regions 116a and 116b are formed in a lower portion and an upper portion of a P-type or i-type (intrinsic) Si pillar 115 (hereafter a silicon semiconductor pillar is referred to as a "Si pillar"). When one of the $N^+$ regions 116a and 116b functions as a source, the other functions as a drain. A portion of the Si pillar 115 between the source and drain $N^+$ regions 116a and 116b is a channel region 117. A gate insulating layer 118 is formed so as to surround the channel region 117, and a gate conductor layer 119 is formed so as to surround the gate insulating layer 118. In an SGT, the source and drain $N^+$ regions 116a and 116b, the channel region 117, the gate insulating layer 118, and the gate conductor layer 119 are formed in a single Si pillar 115. Therefore, the area of the surface of the SGT appears to be equal to the area of one source or drain $N^+$ region of a planar MOS transistor. Thus, circuit chips including SGTs can achieve further chip-size reduction compared with circuit chips including planar MOS transistors.

FIG. 13 is a sectional view of a CMOS inverter circuit including SGTs (e.g., refer to FIG. 38(b) in U.S. Patent Application Publication No. 2010/0264484).

In this CMOS inverter circuit, an i layer 121 (the "i layer" refers to an intrinsic Si layer) is formed on an insulating layer substrate 120, and a Si pillar SP1 for a P-channel SGT and a Si pillar SP2 for an N-channel SGT are formed on the i layer 121.

A drain $P^+$ region 122 of the P-channel SGT is formed in the same layer as the i layer 121 so as to surround a lower portion of the Si pillar SP1 in plan view. A drain $N^+$ region 123 of the N-channel SGT is formed in the same layer as the i layer 121 so as to surround a lower portion of the Si pillar SP2 in plan view.

A source $P^+$ region 124 of the P-channel SGT is formed in a top portion of the Si pillar SP1, and a source $N^+$ region 125 of the N-channel SGT is formed in a top portion of the Si pillar SP2.

Gate insulating layers 126a and 126b are formed on upper surfaces of the $P^+$ region 122 and $N^+$ region 123 so as to extend along and surround the Si pillars SP1 and SP2. A gate conductor layer 127a of the P-channel SGT and a gate conductor layer 127b of the N-channel SGT are formed so as to surround the gate insulating layers 126a and 126b.

Sidewall nitride films 128a and 128b serving as insulating layers are formed so as to surround the gate conductor layers 127a and 127b. Similarly, sidewall nitride films 128c and 128d serving as insulating layers are formed so as to surround a $P^+$ region and an $N^+$ region in top portions of the Si pillars SP1 and SP2.

The drain $P^+$ region 122 of the P-channel SGT and the drain $N^+$ region 123 of the N-channel SGT are connected to each other through a silicide layer 129b. A silicide layer 129a is formed on the source $P^+$ region 124 of the P-channel SGT, and a silicide layer 129c is formed on the source $N^+$ region 125 of the N-channel SGT. Furthermore, silicide layers 129d and 129e are formed in top portions of the gate conductor layers 127a and 127b.

An i layer 130a of the Si pillar SP1 that lies between the $P^+$ regions 122 and 124 functions as a channel of the P-channel SGT. An i layer 130b of the Si pillar SP2 that lies between the $N^+$ regions 123 and 125 functions as a channel of the N-channel SGT.

A $SiO_2$ layer 131 is formed so as to cover the insulating layer substrate 120, the i layer 121, and the Si pillars SP1 and SP2. Furthermore, contact holes 132a, 132b, and 132c are formed so as to extend through the $SiO_2$ layer 131. The contact hole 132a is formed on the Si pillar SP1, the contact hole 132c is formed on the Si pillar SP2, and the contact hole 132b is formed on the drain $P^+$ region 122 of the P-channel SGT and the $N^+$ region 123 of the N-channel SGT.

A power supply wiring metal layer Vd formed on the $SiO_2$ layer 131 is connected to the source $P^+$ region 124 of the P-channel SGT and the silicide layer 129a through the contact hole 132a. An output wiring metal layer Vo formed on the $SiO_2$ layer 131 is connected to the drain $P^+$ region 122 of the P-channel SGT, the drain $N^+$ region 123 of the N-channel SGT, and the silicide layer 129b through the contact hole 132b. A ground wiring metal layer Vs formed on the $SiO_2$ layer 131 is connected to the source $N^+$ region 125 of the N-channel SGT and the silicide layer 129c through the contact hole 132c.

The gate conductor layer 127a of the P-channel SGT and the gate conductor layer 127b of the N-channel SGT are connected to an input wiring metal layer (not illustrated) while being connected to each other.

In this CMOS inverter circuit, the P-channel SGT and the N-channel SGT are formed in the Si pillars SP1 and SP2. Therefore, the circuit area is reduced when vertically viewed in plan. As a result, a further reduction in the size of the circuit is achieved compared with CMOS inverter circuits including known planar MOS transistors.

The CMOS inverter circuit including SGTs illustrated in FIG. 13 has also been required to have higher density and higher performance. However, the following problems arise when the density and performance of this circuit are further improved.

1. In the mask design for the Si pillars SP1 and SP2 and the i layer 121, margins need to be left in terms of shape and positional relationship to accurately form the Si pillars SP1 and SP2 on the i layer 121 with certainty. This inhibits the increase in the density of the circuit.

2. The resistances between the end of the silicide layer 129b and the P$^+$ region 122 directly below the Si pillar SP1 and between the end of the silicide layer 129b and the N$^+$ region 123 directly below the Si pillar SP2 decrease the driving current and the driving speed.

3. A thin gate insulating layer 126a lies between the gate conductor layer 127a and the P$^+$ region 122. Therefore, a large coupling capacitance is present between the gate conductor layer 127a and the P$^+$ region 122. Similarly, a thin gate insulating layer 126b lies between the gate conductor layer 127b and the N$^+$ region 123. Therefore, a large coupling capacitance is present between the gate conductor layer 127b and the N$^+$ region 123. Such large coupling capacitances inhibit the increase in the speed.

4. Thin sidewall nitride films 128a and 128b lie between the contact hole 132b and the gate conductor layers 127a and 127b. Therefore, large coupling capacitances are present between the gate conductor layers 127a and 127b and the output wiring metal layer Vo. Such large coupling capacitances inhibit the increase in the speed. If the coupling capacitance is decreased by increasing the thicknesses of the sidewall nitride films 128a and 128b, the circuit area increases.

Accordingly, the density and performance of the circuit need to be improved by addressing the above problems.

SUMMARY OF THE INVENTION

It is an object of the present invention to provide a semiconductor device including an SGT for improving the density and performance of a circuit and a method for producing the semiconductor device.

A semiconductor device including an SGT according to a first aspect of the present invention includes a first semiconductor pillar that stands on a substrate in a direction vertical to a plane of the substrate; a first gate insulating layer that surrounds the first semiconductor pillar; a first gate conductor layer that surrounds the first gate insulating layer; a first impurity region that is positioned below the gate conductor layer in the vertical direction and is connected to a portion inside the first semiconductor pillar or to a side surface of the first semiconductor pillar; a first conductive layer that surrounds an entire periphery of the first impurity region in plan view; a second conductive layer that is partly connected to a periphery of the first conductive layer in plan view and extends in a direction horizontal to the plane of the substrate; a third conductive layer that surrounds an entire periphery of the first gate conductor layer in plan view; and a fourth conductive layer that is partly connected to a periphery of the third conductive layer in plan view, extends in a direction horizontal to the plane of the substrate, and partly overlaps the second conductive layer or does not overlap the second conductive layer in plan view, wherein at least one of the first conductive layer and the third conductive layer has an equal width in plan view.

In the semiconductor device, a center line of the fourth conductive layer that extends in a belt-like shape with an equal width from a portion in contact with the third conductive layer in plan view preferably extends in an extension direction of the fourth conductive layer so as not to pass through a center point of the first semiconductor pillar.

In the semiconductor device, the first conductive layer, the second conductive layer, and the first impurity region preferably contain the same donor or acceptor impurity atom.

In the semiconductor device, the first conductive layer and the first impurity region are preferably connected to each other in a self-aligned manner.

In the semiconductor device, the first gate conductor layer and the third conductive layer are preferably connected to each other in a self-aligned manner.

The semiconductor device preferably further includes a fifth conductive layer that is in contact with an inner side surface of the first conductive layer, is positioned between the first conductive layer and the first impurity region, and contains the same metal atom and donor or acceptor impurity atom as the first conductive layer.

The semiconductor device preferably includes a second semiconductor pillar that vertically stands so as to be adjacent to the first semiconductor pillar; a second gate insulating layer that surrounds the second semiconductor pillar; a second gate conductor layer that surrounds the second gate insulating layer; a second impurity region that is positioned below the second gate conductor layer in the vertical direction and is connected to a portion inside the second semiconductor pillar or to a side surface of the second semiconductor pillar; a sixth conductive layer that surrounds the second impurity region in plan view; and a seventh conductive layer that surrounds the second gate conductor layer in plan view. Preferably, at least one of the sixth conductive layer and the seventh conductive layer has an equal width, the second conductive layer is partly in contact with the sixth conductive layer, and the fourth conductive layer is partly in contact with the seventh conductive layer.

The semiconductor device preferably includes an eighth conductive layer that partly surrounds a periphery of the first conductive layer with an equal width in plan view; a ninth conductive layer that partly surrounds a periphery of the sixth conductive layer with an equal width in plan view; and a tenth conductive layer that lies between the first semiconductor pillar and the second semiconductor pillar in plan view so as to be in contact with the first conductive layer, the sixth conductive layer, the eighth conductive layer, and the ninth conductive layer.

The semiconductor device preferably includes an eleventh conductive layer that partly surrounds a periphery of the third conductive layer with an equal width in plan view; a twelfth conductive layer that partly surrounds a periphery of the seventh conductive layer with an equal width in plan view; and a thirteenth conductive layer that lies between the first semiconductor pillar and the second semiconductor pillar in plan view so as to be in contact with the third conductive layer, the seventh conductive layer, the eleventh conductive layer, and the twelfth conductive layer.

The semiconductor device preferably includes the first impurity region that surrounds a side surface of the first semiconductor pillar with an equal width in plan view; and the first conductive layer that surrounds the first impurity region with an equal width in plan view.

In the semiconductor device, at least one of the first conductive layer and the third conductive layer is preferably constituted by a plurality of material layers having an equal width in plan view.

In the semiconductor device, the first conductive layer and the second conductive layer are preferably formed of the same material and/or the third conductive layer and the fourth conductive layer are preferably formed of the same material.

A method for producing a semiconductor device including an SGT according to a second aspect of the present invention includes a step of forming a first semiconductor pillar that stands on a substrate in a vertical direction; a step of forming a first gate insulating layer that surrounds the first semiconductor pillar; a step of forming a first gate conductor layer that surrounds the first gate insulating layer; a step of forming a first impurity region that is positioned below the first gate conductor layer in the vertical direction, is connected to a portion inside the first semiconductor pillar or to a side surface of the first semiconductor pillar, and contains a donor or acceptor impurity; a step of forming a first conductive layer that surrounds a periphery of the first semiconductor pillar in plan view and is in contact with the first gate conductor layer or the first impurity region; a step of forming, on the first conductive layer, a first material layer that surrounds a side surface of a periphery of the first semiconductor pillar with an equal width in plan view; a step of forming, on the first conductive layer, a second material layer that is partly in contact with the first material layer in plan view; and a step of etching the first conductive layer using the first material layer and the second material layer as masks, wherein, as a result of the etching of the first conductive layer, a second conductive layer that is in contact with the first gate conductor layer or the first impurity region and surrounds a side surface of a periphery of the first gate conductor layer or the first impurity region with an equal width in plan view and a third conductive layer that is partly in contact with the second conductive layer are formed.

The method preferably includes a step of forming the first impurity region by introducing a donor or acceptor impurity atom into the first conductive layer or the second conductive layer and the third conductive layer and performing heat treatment to force the donor or acceptor impurity atom toward an inside of the first semiconductor pillar from the first conductive layer or the second conductive layer and the third conductive layer.

The method preferably includes a step of forming the first impurity region by performing heat treatment after formation of the first conductive layer containing a donor or acceptor impurity atom or before or after formation of the second conductive layer and the third conductive layer, and forming a fourth conductive layer containing a metal atom and a donor or acceptor impurity atom between the second conductive layer and the first impurity region.

The method preferably includes a step of forming a third material layer that surrounds a side surface of the first semiconductor pillar and is formed of one or more layers after formation of the first material layer; and a step of forming the second conductive layer and the third conductive layer by etching the third material layer and the first conductive layer using the first material layer, the second material layer, and the top material layer as masks.

In the method, a fifth conductive layer that is the third conductive layer connected to the first impurity region and a sixth conductive layer that is the third conductive layer connected to the first gate conductor layer are preferably formed so as to be away from each other or partly overlap each other in plan view.

The method preferably includes a step of forming a second semiconductor pillar that is adjacent to the first semiconductor pillar; a step of forming a second gate insulating layer that surrounds the second semiconductor pillar and has the same height as the first gate insulating layer in the vertical direction; a step of forming a second gate conductor layer that surrounds the second gate insulating layer; a step of forming, around the second semiconductor pillar, a second impurity region that has the same height as the first impurity region in the vertical direction and contains a donor or acceptor impurity; a step of forming a seventh conductive layer that is in contact with the second impurity region in plan view; and a step of forming an eighth conductive layer that is in contact with the second gate conductor layer in plan view. At least one of the seventh conductive layer and the eighth conductive layer preferably has an equal width in plan view, the fifth conductive layer and the seventh conductive layer are preferably formed so as to be connected to each other on the same plane, and the sixth conductive layer and the eighth conductive layer are preferably formed so as to be connected to each other on the same plane.

The method preferably includes a step of forming fourth material layers that surround peripheries of the first semiconductor pillar and the second semiconductor pillar and are connected to each other in a portion between the first semiconductor pillar and the second semiconductor pillar; and a step of etching the first conductive layer using the fourth material layer as an etching mask to form a ninth conductive layer that surrounds an entire periphery of the first impurity region or the first gate conductor layer with an equal width in plan view, a tenth conductive layer that surrounds an entire periphery of the second impurity region or the second gate conductor layer with an equal width, an eleventh conductive layer that is partly connected to peripheries of the ninth conductive layer and the tenth conductive layer and extends in parallel with a surface of the substrate, and a twelfth conductive layer that is partly in contact with peripheries of the ninth conductive layer and the tenth conductive layer in plan view and has an equal width in plan view.

The method preferably includes a step of forming a fifth material layer that partly overlaps the fourth material layer in plan view after formation of the fourth material layer; and a step of etching the first impurity region or the first gate conductor layer using the fourth material layer and the fifth material layer as masks.

The method preferably includes a step of forming a sixth material layer on a periphery of the first semiconductor pillar after formation of the first material layer; a step of forming, on the sixth material layer, the second material layer that partly overlaps the first material layer in plan view; and a step of etching the sixth material layer and the first conductive layer using the first material layer and the second material layer as masks.

The method preferably includes a step of forming a seventh material layer that surrounds the first semiconductor pillar or the gate conductor layer, has an upper surface positioned lower than a top of the semiconductor pillar, and has a conductive or insulating property; a step of forming, on the seventh material layer, an eighth material layer that surrounds a top portion of the semiconductor pillar with an equal width; a step of forming a ninth material layer with an equal width in plan view by etching the seventh material layer using the eighth material layer as a mask; and a step of etching the first conductive layer using the eighth material layer and the ninth material layer as masks.

The method preferably includes a step of forming the first impurity region that surrounds a side surface of the first semiconductor pillar with an equal width in plan view; and a step of forming the first conductive layer that surrounds the first impurity region with an equal width in plan view.

In the method, the second conductive layer is preferably formed of a plurality of material layers having an equal width in plan view.

The method preferably includes a step of forming, on a top of the first semiconductor pillar, a top material layer to serve as an etching mask for the first conductive layer before the second material layer is formed.

The present invention can provide a semiconductor device including an SGT for improving the density and performance of a circuit and a method for producing the semiconductor device.

BRIEF DESCRIPTION OF THE DRAWINGS

FIGS. 1AA to 1AD are a plan view and sectional views illustrating a CMOS inverter circuit for describing a method for producing a semiconductor device including an SGT according to a first embodiment.

FIGS. 1GA to 1GD are a plan view and sectional views illustrating a CMOS inverter circuit for describing a method for producing a semiconductor device including an SGT according to a first embodiment.

FIGS. 1IA to 1ID are a plan view and sectional views illustrating a CMOS inverter circuit for describing a method for producing a semiconductor device including an SGT according to a first embodiment.

FIGS. 1JA to 1JE are plan views and sectional views illustrating a CMOS inverter circuit for describing a method for producing a semiconductor device including an SGT according to a first embodiment.

FIGS. 2BA to 2BD are a plan view and sectional views illustrating a CMOS inverter circuit for describing a method for producing a semiconductor device including an SGT according to a second embodiment.

FIGS. 2CA to 2CE are plan views and sectional views illustrating a CMOS inverter circuit for describing a method for producing a semiconductor device including an SGT according to a second embodiment.

FIGS. 3CA to 3CD are a plan view and sectional views illustrating a CMOS inverter circuit for describing a method for producing a semiconductor device including an SGT according to a third embodiment.

FIGS. 3DA to 3DD are a plan view and sectional views illustrating a CMOS inverter circuit for describing a method for producing a semiconductor device including an SGT according to a third embodiment.

FIGS. 4BA to 4BD are a plan view and sectional views illustrating a CMOS inverter circuit for describing a method for producing a semiconductor device including an SGT according to a fourth embodiment.

FIGS. 4CA to 4CD are a plan view and sectional views illustrating a CMOS inverter circuit for describing a method for producing a semiconductor device including an SGT according to a fourth embodiment.

FIGS. 4DA to 4DD are a plan view and sectional views illustrating a CMOS inverter circuit for describing a method for producing a semiconductor device including an SGT according to a fourth embodiment.

FIGS. 5BA to 5BD are a plan view and sectional views illustrating a CMOS inverter circuit for describing a method for producing a semiconductor device including an SGT according to a fifth embodiment.

FIGS. 5CA to 5CD are a plan view and sectional views illustrating a CMOS inverter circuit for describing a method for producing a semiconductor device including an SGT according to a fifth embodiment.

FIGS. 5DA to 5DD are a plan view and sectional views illustrating a CMOS inverter circuit for describing a method for producing a semiconductor device including an SGT according to a fifth embodiment.

FIGS. 7AA to 7AD are a plan view and sectional views illustrating a CMOS inverter circuit for describing a method for producing a semiconductor device including an SGT according to a seventh embodiment.

FIGS. 7BA to 7BD are a plan view and sectional views illustrating a CMOS inverter circuit for describing a method for producing a semiconductor device including an SGT according to a seventh embodiment.

FIGS. 8BA to 8BD are a plan view and sectional views illustrating a CMOS inverter circuit for describing a method for producing a semiconductor device including an SGT according to an eighth embodiment.

FIGS. 8CA to 8CD are a plan view and sectional views illustrating a CMOS inverter circuit for describing a method for producing a semiconductor device including an SGT according to an eighth embodiment.

FIGS. 8DA to 8DD are a plan view and sectional views illustrating a CMOS inverter circuit for describing a method for producing a semiconductor device including an SGT according to an eighth embodiment.

FIGS. 9AA to 9AD are a plan view and sectional views illustrating a CMOS inverter circuit for describing a method for producing a semiconductor device including an SGT according to a ninth embodiment.

FIGS. 10A to 10D are a plan view and sectional views illustrating a CMOS inverter circuit for describing a method for producing a semiconductor device including an SGT according to a tenth embodiment.

DETAILED DESCRIPTION OF THE PREFERRED EMBODIMENTS

Hereafter, a semiconductor device including an SGT and a method for producing the semiconductor device according to embodiments of the present invention will be described with reference to the attached drawings.

First Embodiment

FIG. 1AA to FIG. 1JE illustrate a method for producing a CMOS inverter circuit including an SGT according to a first embodiment of the present invention.

FIGS. 1AA to 1AD are a plan view and sectional views for describing the first production process of the CMOS inverter circuit including an SGT. FIG. 1AA is a plan view, FIG. 1AB is a sectional view taken along line X-X' in FIG. 1AA, FIG. 1AC is a sectional view taken along line Y1-Y1' in FIG. 1AA, and FIG. 1AD is a sectional view taken along line Y2-Y2' in FIG. 1AA. In other figures referred to in the description below, the same applies to the relationship of views indicated by the suffixes A, B, C, and D.

As illustrated in FIGS. 1AA to 1AD, SiN layers $2a$ and $2b$, $SiO_2$ layers $3a$ and $3b$, and resist layers $5a$ and $5b$ are formed by depositing, from the bottom, a silicon nitride layer (SiN layer, not illustrated) and a $SiO_2$ layer (not illustrated) on an i layer substrate 1 and using a lithography technique such as reactive ion etching (RIE). The SiN layer $2a$, the $SiO_2$ layer $3a$, and the resist layer $5a$ are stacked on the i layer substrate 1 in this order. The SiN layer $2b$, the $SiO_2$ layer $3b$, and the resist layer $5b$ are stacked on the i layer substrate 1 in this order. A thin $SiO_2$ layer is desirably formed between the i layer substrate 1 and the SiN layer (not illustrated) to improve the processability of the SiN layer.

Figure 1B:
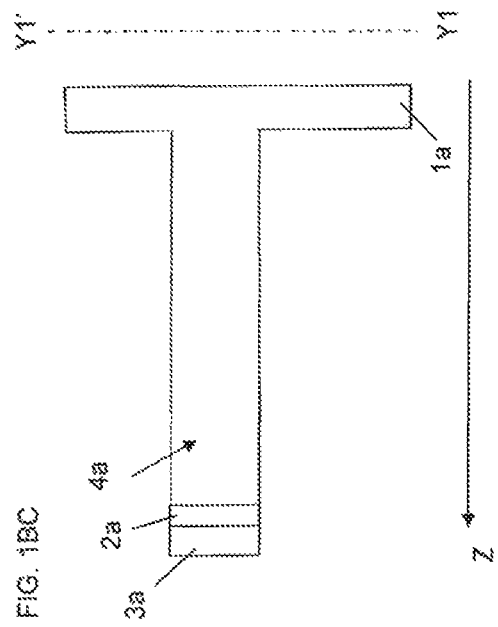
FIGS. 1BA to 1BD are a plan view and sectional views illustrating a CMOS inverter circuit for describing a method for producing a semiconductor device including an SGT according to a first embodiment.
Figure 1B:
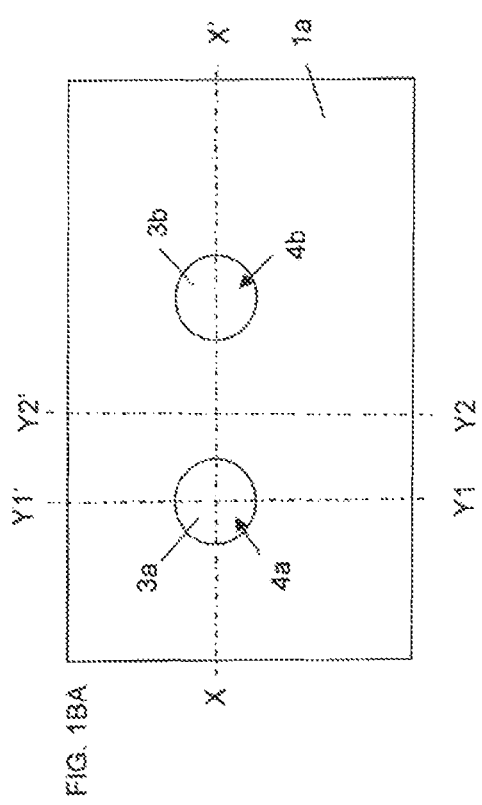
Figure 1B:
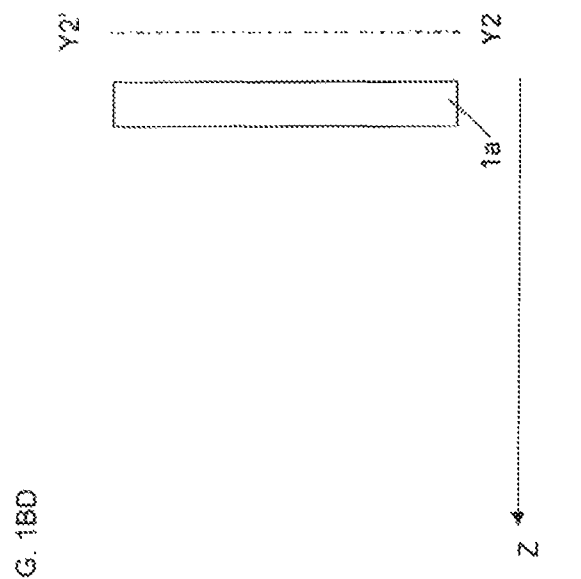
Figure 1B:
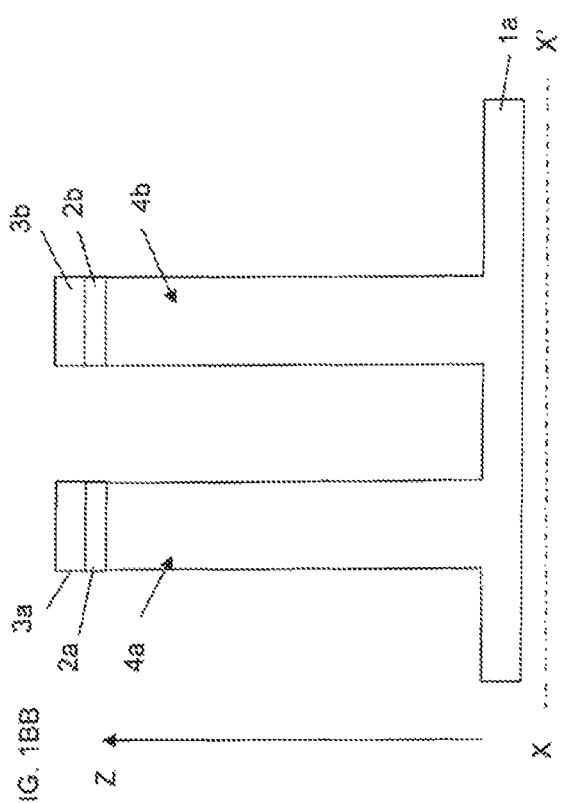

Next, as illustrated in FIGS. 1BA to 1BD, the i layer substrate 1 is etched by, for example, RIE using the SiN layers $2a$ and $2b$, the $SiO_2$ layers $3a$ and $3b$, and the resist layers $5a$ and $5b$ as etching masks. Thus, a lower portion of the i layer substrate 1 is left as an i layer substrate $1a$ and Si pillars $4a$ and $4b$ are formed on the i layer substrate $1a$. Then, the resist layers $5a$ and $5b$ are removed. The Si pillar $4a$ is located below the SiN layer $2a$ and the $SiO_2$ layer $3a$ and the Si pillar $4b$ is located below the SiN layer $2b$ and the $SiO_2$ layer $3b$.

Figure 1C:
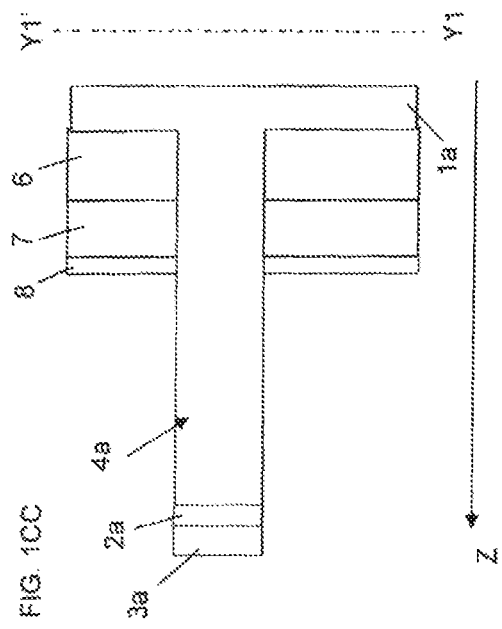
FIGS. 1CA to 1CD are a plan view and sectional views illustrating a CMOS inverter circuit for describing a method for producing a semiconductor device including an SGT according to a first embodiment.
Figure 1C:
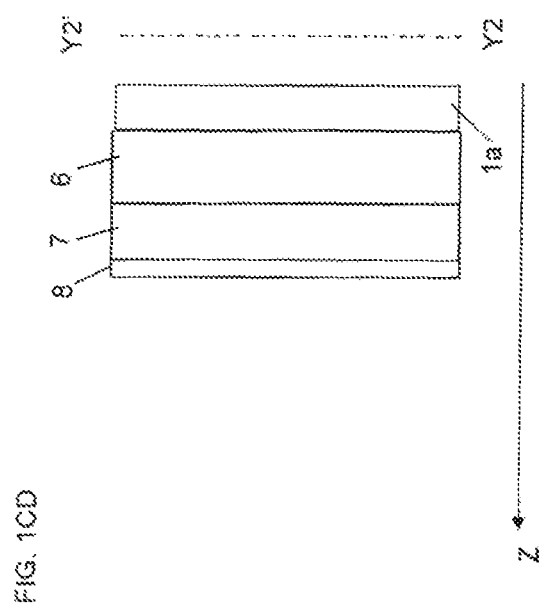
Figure 1C:
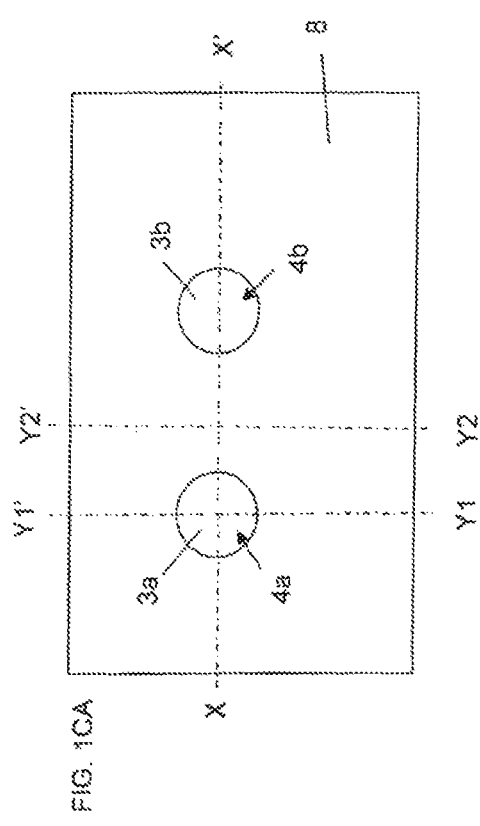
Figure 1C:
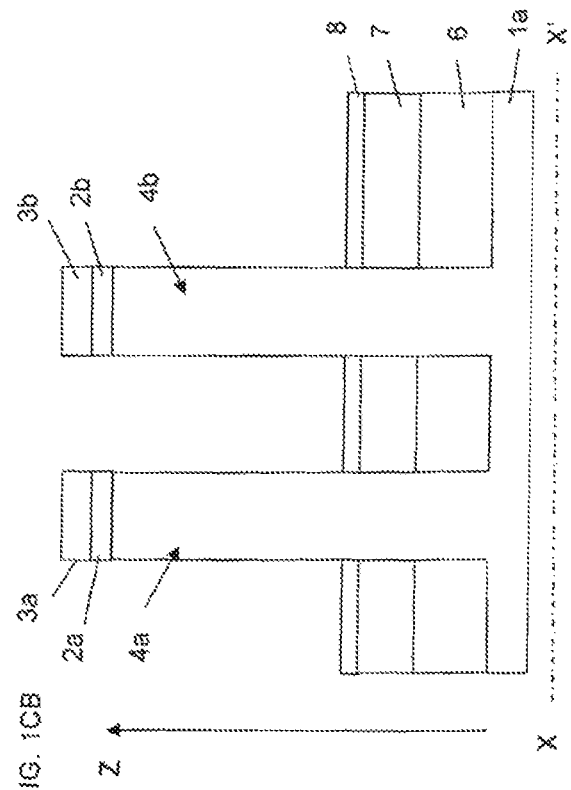

Next, as illustrated in FIGS. 1CA to 1CD, for example, a bias sputtering process is carried out in the following manner: a substrate metal plate on which the i layer substrate $1a$ is disposed and a facing metal plate located away from the substrate metal plate are provided; a direct-current voltage is applied to the substrate metal plate, and an RF voltage is applied across these two parallel metal plates, to thereby sputter the material atoms of the facing metal plate onto the i layer substrate $1a$. Thus, a $SiO_2$ layer 6, a $WSi_2$ layer 7, and a SiN layer 8 are formed. Subsequently, a lower $SiO_2$ layer (not illustrated), a $WSi_2$ layer (not illustrated), and an upper SiN layer (not illustrated) formed on the Si pillars $4a$ and $4b$ as a result of the bias sputtering process are removed. Since the Si pillars $4a$ and $4b$ are formed by RIE, the side surfaces of the Si pillars $4a$ and $4b$ are substantially vertical to the plane of the i layer substrate $1a$. Therefore, a $SiO_2$ film, a $WSi_2$ film, and a SiN film are not formed on the side surfaces of the Si pillars $4a$ and $4b$ (for the mechanism in which material atoms do not adhere to the side surfaces, refer to C. Y. Ting, V. J. Vivalda, and H. G. Schaefer: "Study of planarized sputter-deposited $SiO_2$," J. Vac. Sci. Technology, 15(3), May/June (1978)).

Figure 1D:
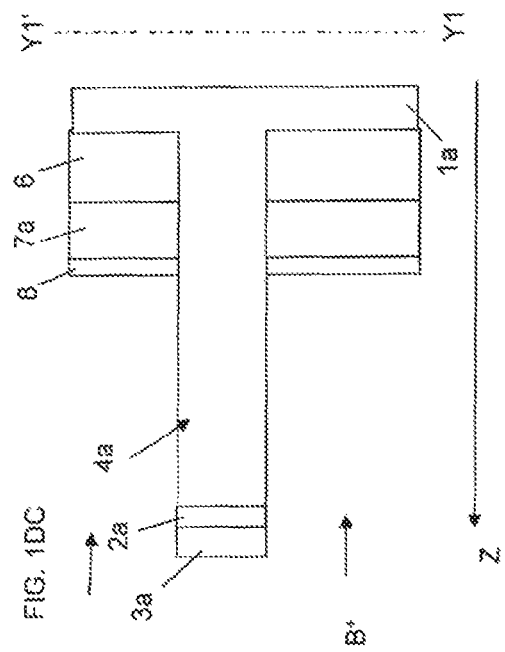
FIGS. 1DA to 1DD are a plan view and sectional views illustrating a CMOS inverter circuit for describing a method for producing a semiconductor device including an SGT according to a first embodiment.
Figure 1D:
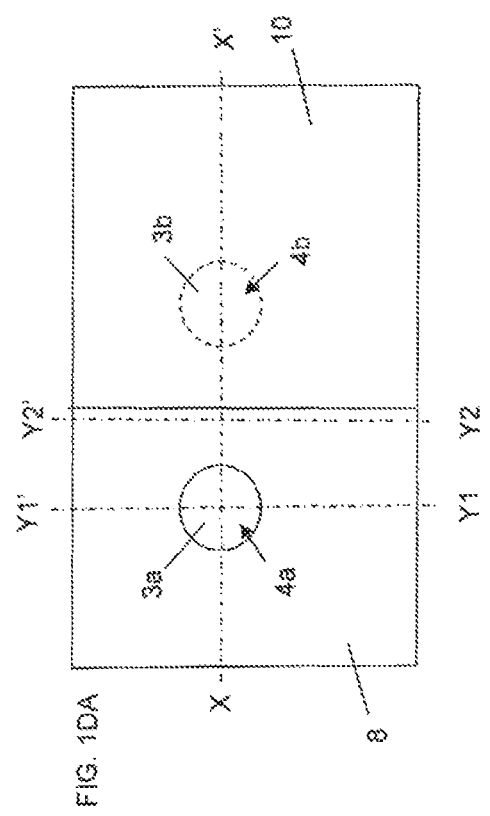
Figure 1D:
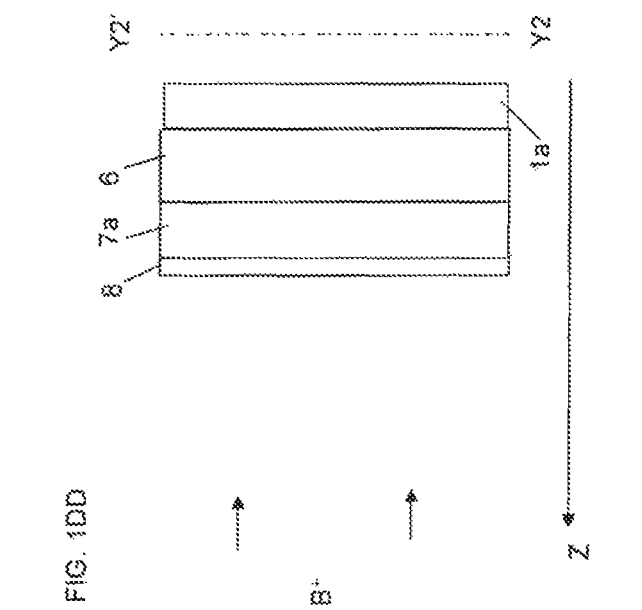
Figure 1D:
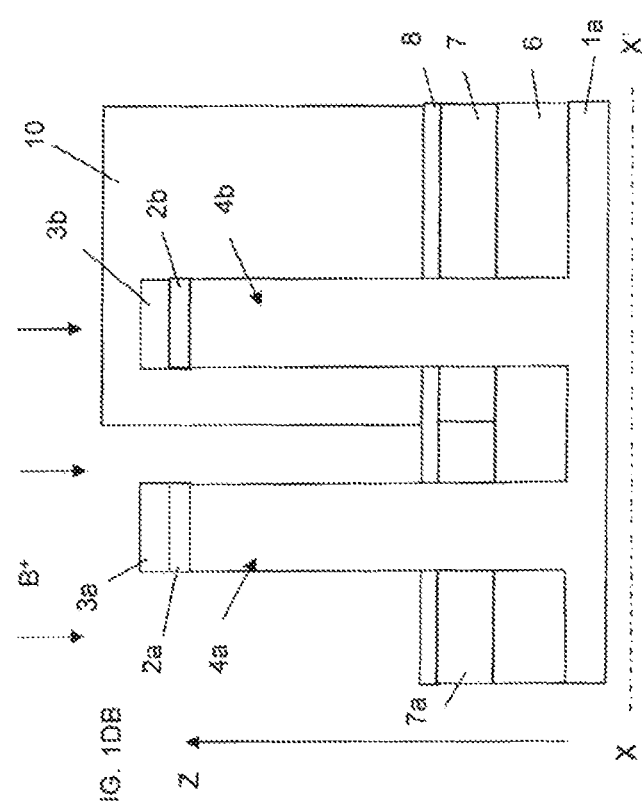

Next, as illustrated in FIGS. 1DA to 1DD, a resist layer 10 is formed so as to cover the Si pillar $4b$. Boron ions ($B^+$) are implanted in a direction toward the upper surface of the i layer substrate $1a$ using the resist layer 10 as a mask to form a $WSi_2$ layer $7a$ containing B atoms on the periphery of the Si pillar $4a$. Then, the resist layer 10 is removed. Herein, a thin oxide film (not illustrated) serving as a protective film is desirably formed on the side surfaces of the Si pillars $4a$ and $4b$ by an oxidation process or an atomic layer deposition (ALD) process before the formation of the resist layer 10.

Figure 1E:
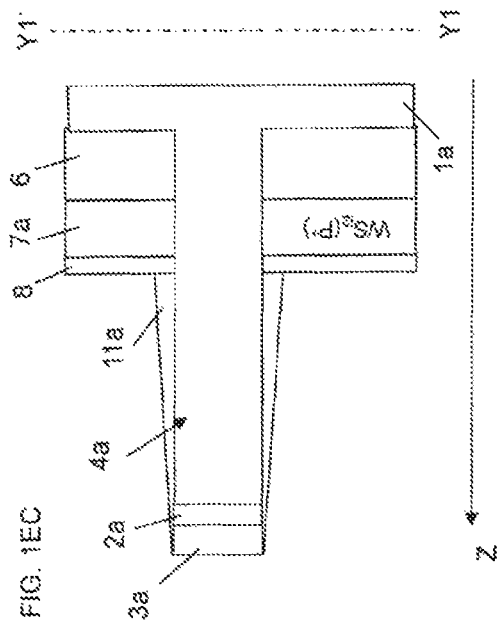
FIGS. 1EA to 1ED are a plan view and sectional views illustrating a CMOS inverter circuit for describing a method for producing a semiconductor device including an SGT according to a first embodiment.
Figure 1E:
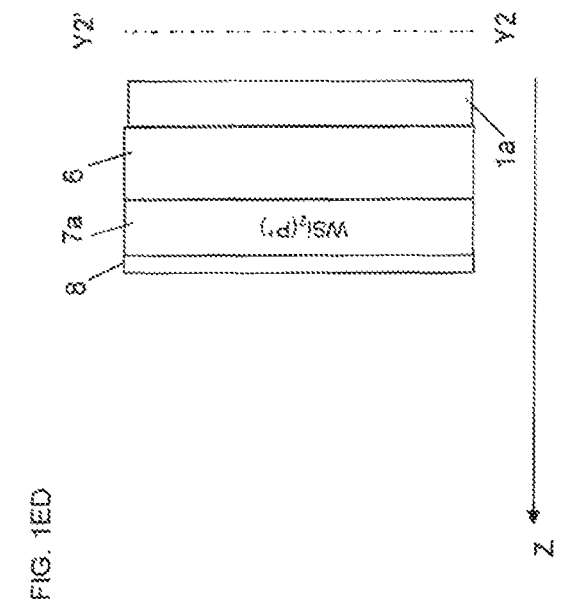
Figure 1E:
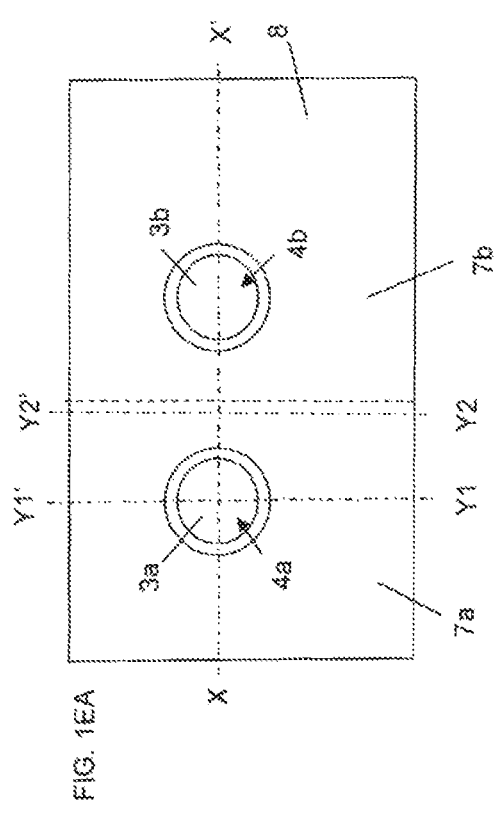
Figure 1E:
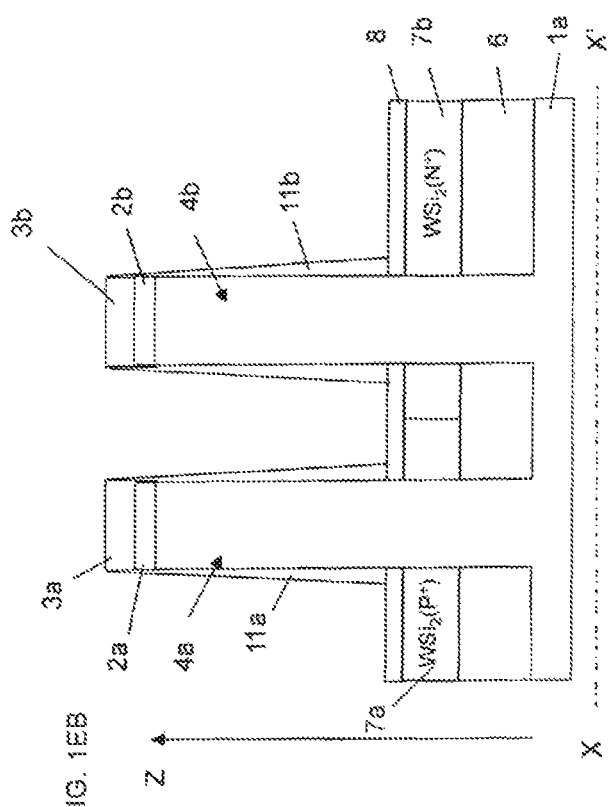

Subsequently, arsenic ions (Ask) are implanted using, as a mask, a resist layer (not illustrated) formed so as to cover the Si pillar $4a$. Thus, a $WSi_2$ layer $7b$ containing As atoms is formed on the periphery of the Si pillar $4b$. Then, the resist layer is removed. A $SiO_2$ film (not illustrated) is entirely deposited by chemical vapor deposition (CVD). The $SiO_2$ film is etched by RIE so that a part of the $SiO_2$ film is left on the side surfaces of the Si pillars $4a$ and $4b$. Thus, as illustrated in FIGS. 1EA to 1ED, $SiO_2$ layers $11a$ and $11b$ are formed on the side surfaces of the Si pillars $4a$ and $4b$.

Figure 1F:
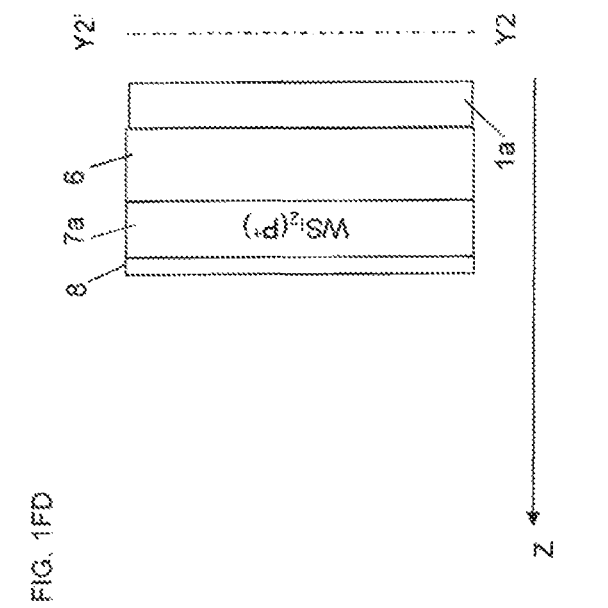
FIGS. 1FA to 1FD are a plan view and sectional views illustrating a CMOS inverter circuit for describing a method for producing a semiconductor device including an SGT according to a first embodiment.
Figure 1F:
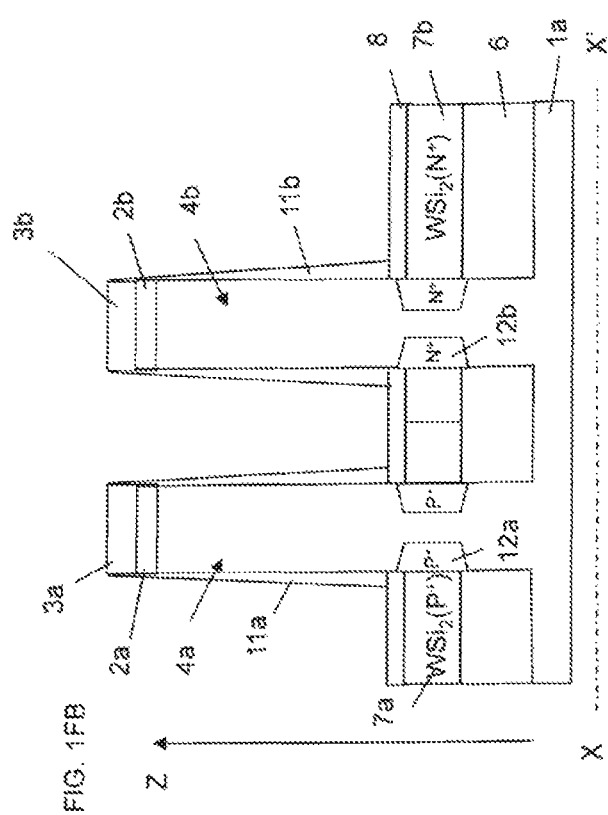
Figure 1F:
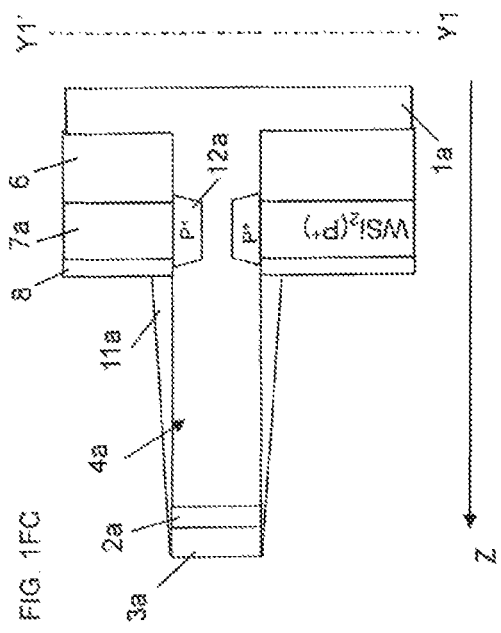
Figure 1F:
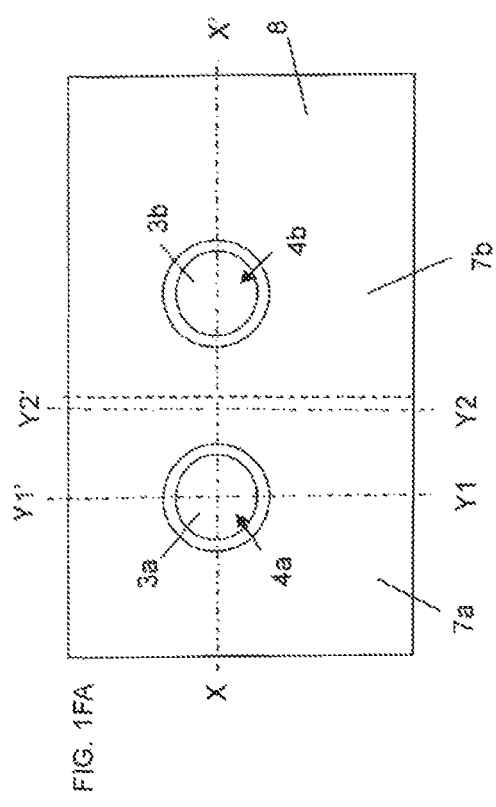

Next, as illustrated in FIGS. 1FA to 1FD, by performing heat treatment, the B atoms are forced toward the inside of the Si pillar $4a$ from the $WSi_2$ layer $7a$ to form a P$^+$ region $12a$ in the Si pillar $4a$, and the As atoms are forced toward the inside of the Si pillar $4b$ from the $WSi_2$ layer $7b$ to form an N$^+$ region $12b$ in the Si pillar $4b$ (for the mechanism in which the P$^+$ region $12a$ and the N$^+$ region $12b$ are formed through the forcing phenomenon of impurity atoms, refer to V. Probst, H. Schaber, A. Mitwalsky, and H. Kabza: "$WSi_2$ and $CoSi_2$ as diffusion sources for shallow-junction formation in silicon", J. Appl. Phys. Vol. 70(2), No. 15, pp. 708-719 (1991)).

Next, as illustrated in FIGS. 1GA to 1GD, a resist layer $13$ that partly overlaps the Si pillars $4a$ and $4b$ in plan view is formed. The SiN layer $8$ and the $WSi_2$ layers $7a$ and $7b$ are etched by RIE using the resist layer $13$, the $SiO_2$ layers $11a$ and $11b$, the $SiO_2$ layers $2a$ and $2b$, and the SiN layers $3a$ and $3b$ as masks to form a SiN layer $8a$ and $WSi_2$ layers $7aa$ and $7bb$. In this case, the $WSi_2$ layers $7aa$ and $7bb$ lie below the $SiO_2$ layers $11a$ and $11b$, and are constituted by first alloy regions that surround the entire peripheries of the Si pillars $4a$ and $4b$ in plan view and a second alloy region that is connected to the first alloy regions and lies below the resist layer $13$. The first alloy regions of the $WSi_2$ layers $7a$ and $7b$ are self-aligned with the P$^+$ region $12a$ and the N$^+$ region $12b$. That is, the first alloy regions of the $WSi_2$ layers $7aa$ and $7bb$ that lie below the $SiO_2$ layers $11a$ and $11b$ are formed in a tubular shape with an equal width so as to surround the entire peripheries of the P$^+$ region $12a$ and the N$^+$ region $12b$ regardless of the mask misalignment in lithography during formation of the resist layer $13$.

Figure 1H:
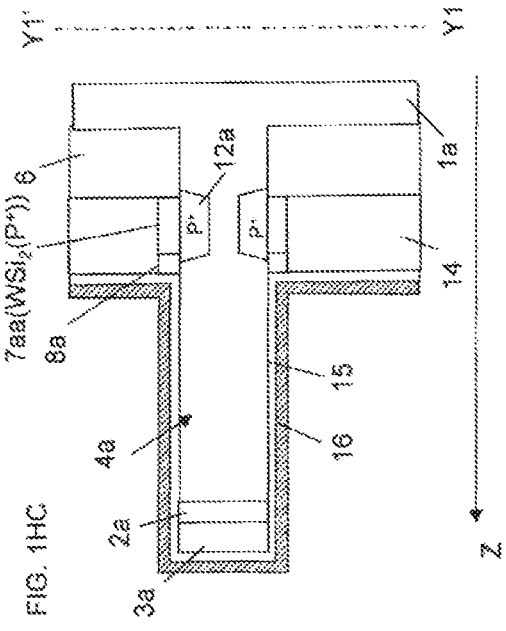
FIGS. 1HA to 1HD are a plan view and sectional views illustrating a CMOS inverter circuit for describing a method for producing a semiconductor device including an SGT according to a first embodiment.
Figure 1H:
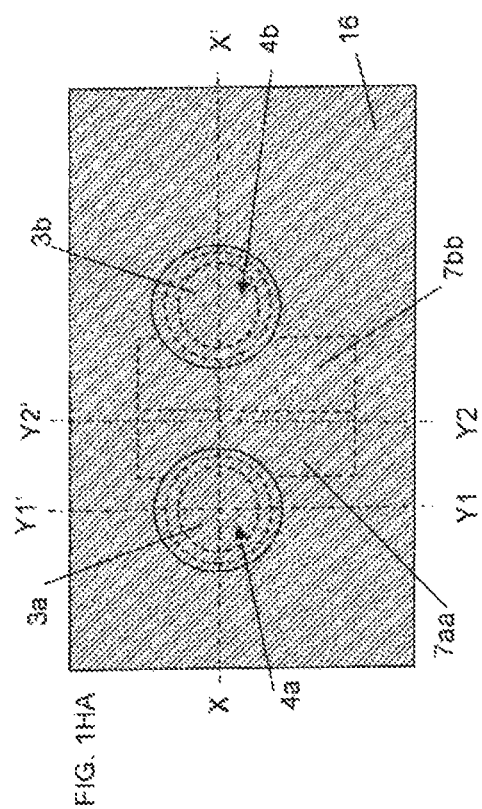
Figure 1H:
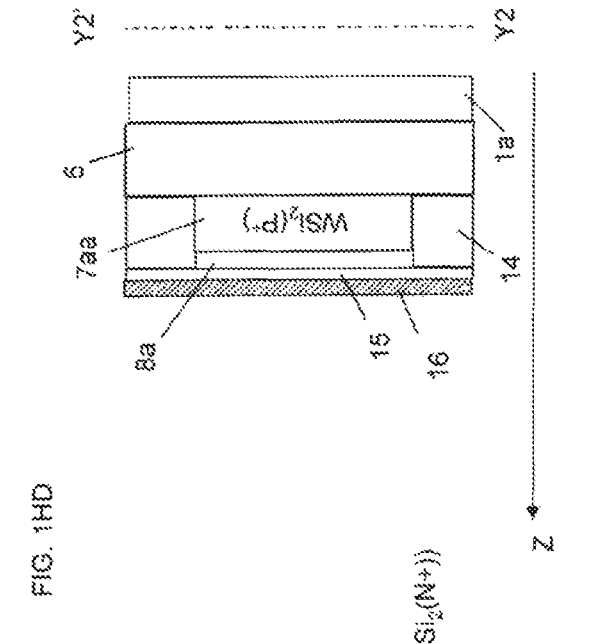
Figure 1H:
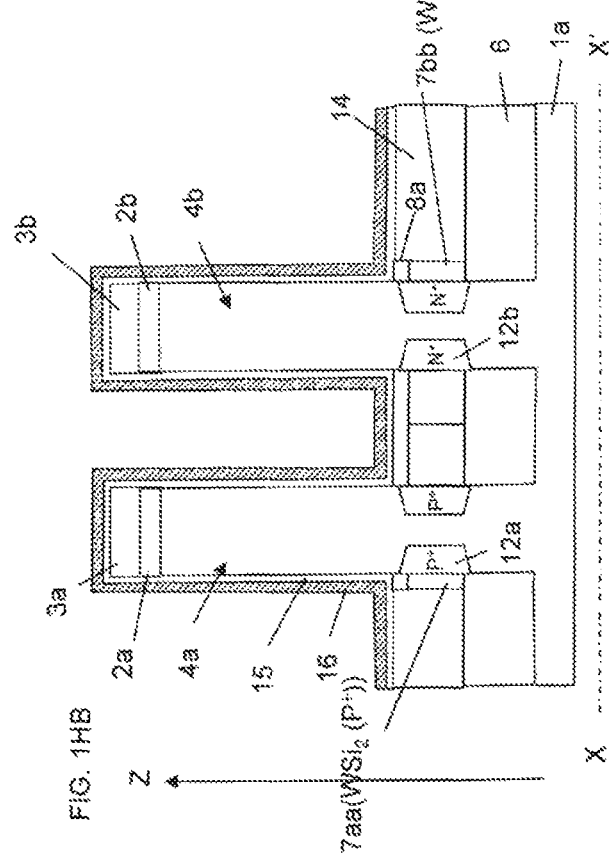

Next, the resist layer $13$ and the $SiO_2$ layers $11a$ and $11b$ are removed. Then, as illustrated in FIGS. 1HA to 1HD, a $SiO_2$ film (not illustrated) is entirely deposited by CVD and etched back to a position of an upper surface of the SiN layer $8a$ to form a $SiO_2$ layer $14$. Then, a $HfO_2$ layer $15$ and a TiN layer $16$ are entirely deposited by atomic layer deposition (ALD).

Next, as illustrated in FIGS. 1IA to 1ID, a $SiO_2$ film (not illustrated) is entirely deposited by CVD and etched back until the upper surface of the $SiO_2$ film is positioned lower than the tops of the Si pillars $4a$ and $4b$ to form a $SiO_2$ layer $18$. Then, portions of the TiN layer $16$, the $HfO_2$ layer $15$, the $SiO_2$ layers $3a$ and $3b$, and the SiN layers $2a$ and $2b$ positioned higher than the upper surface of the $SiO_2$ layer $18$ are removed. The remaining portions of the TiN layer $16$ and the $HfO_2$ layer $15$ are referred to as a TiN layer $16a$ and a $HfO_2$ layer $15a$. By performing lithography and ion implantation, a P$^+$ region $19a$ is formed in a top portion of the Si pillar $4a$ and an N$^+$ region $19b$ is formed in a top portion of the Si pillar $4b$.

Next, as illustrated in FIGS. 1JA to 1JD, a $SiO_2$ layer $21$ is formed on the $SiO_2$ layer $18$ so as to cover the P$^+$ region $19a$ and the N$^+$ region $19b$. Then, a contact hole $22a$ is formed on the P$^+$ region $19a$, a contact hole $22b$ is formed on the N$^+$ region $19b$, a contact hole $22c$ is formed on the TiN layer $16a$, and a contact hole $22d$ that is connected to the upper surfaces and side surfaces of the $WSi_2$ layers $7aa$ and $7bb$ is formed. The half-length of one side of the contact hole $22d$ is desirably smaller than the thickness of the $WSi_2$ layers $7aa$ and $7bb$ in plan view. A power supply wiring metal layer Vdd connected to the P$^+$ region $19a$ through the contact hole $22a$ is formed on the $SiO_2$ layer $21$. A ground wiring metal layer Vss connected to the N$^+$ region $19b$ through the contact hole $22b$ is formed on the $SiO_2$ layer $21$. An input wiring metal layer Vin connected to the TiN layer $16a$ through the contact hole $22c$ is formed on the $SiO_2$ layer $21$. An output wiring metal layer Vout connected to the $WSi_2$ layers $7aa$ and $7bb$ through the contact hole $22d$ is formed on the $SiO_2$ layer $21$.

Thus, a CMOS inverter circuit constituted by a P-channel SGT for load and an N-channel SGT for drive is formed. The P-channel SGT for load includes the P$^+$ region $12a$ as a source, the P$^+$ region $19a$ as a drain, the $HfO_2$ layer $15a$ as a gate insulating layer, the TiN layer $16a$ as a gate conductor layer, and a portion of the Si pillar $4a$ between the P$^+$ regions $12a$ and $19a$ as a channel. The N-channel SGT for drive includes the N$^+$ region $12b$ as a source, the N$^+$ region $19b$ as a drain, the $HfO_2$ layer $15a$ as a gate insulating layer, the TiN layer $16a$ as a gate conductor layer, and a portion of the Si pillar $4b$ between the N$^+$ regions $12b$ and $19b$ as a channel.

FIG. 1JE illustrates the relationship between the Si pillars $4a$ and $4b$, the P$^+$ region $12a$, the N$^+$ region $12b$, and the $WSi_2$ layers $7aa$ and $7bb$ in plan view. The diagonally shaded area indicates the $WSi_2$ layers $7aa$ and $7bb$. The $WSi_2$ layer $7aa$ is constituted by a $WSi_2$ layer $7Aa$ serving as a first alloy region that surrounds the entire periphery of the Si pillar $4a$ in a tubular shape with an equal width and is formed in a self-aligned manner with the P$^+$ region $12a$ and a $WSi_2$ layer $7Ab$ serving as a second alloy region that is partly in contact with the periphery of the $WSi_2$ layer $7Aa$ in a connected manner. Similarly, the $WSi_2$ layer $7bb$ is constituted by a $WSi_2$ layer $7Ba$ serving as a first alloy region that surrounds the entire periphery of the Si pillar $4b$ in a tubular shape with an equal width and is formed in a self-aligned manner with the N$^+$ region $12b$ and a $WSi_2$ layer $7Bb$ serving as a second alloy region that is partly in contact with the periphery of the $WSi_2$ layer $7Ba$ in a connected manner. The $WSi_2$ layers $7Ab$ and $7Bb$ are in contact with each other.

The first embodiment provides the following advantages.

1. In the related art, there has been a need to form the Si pillars SP1 and SP2 on the i layer $121$ and introduce an impurity into the i layer $121$ to form the P$^+$ region $122$ and the N$^+$ region $123$ as illustrated in FIG. $13$. Therefore, in the mask design for the Si pillars SP1 and SP2 and the i layer $121$, margins need to be left in terms of shape and positional relationship to accurately form the Si pillars SP1 and SP2 on the i layer $121$ with certainty. This inhibits the increase in the density of the circuit. In contrast, in this embodiment, a marginal region for mask alignment that has been required is unnecessary. Furthermore, as illustrated in FIGS. 1GA to 1GD, the planar shape of the resist layer $13$ in lithography, the resist layer $13$ being formed for forming the $WSi_2$ layers $7aa$ and $7bb$ that surround the outer peripheries of the P$^+$ region $12a$ and the N$^+$ region $12b$ in a connected manner, may be a rectangle, which is the simplest shape. This can further increase the density of a circuit and can simplify the production process.

2. In this embodiment, as illustrated in FIG. 1JE, the $WSi_2$ layers $7Aa$ and $7Ba$ are formed as first alloy regions that are directly in contact with the side surfaces of the Si pillars $4a$ and $4b$, that surround the entire peripheries of the Si pillars $4a$ and $4b$ in a tubular shape with an equal width in plan view, and that are in contact with the P$^+$ region $12a$ and the N$^+$ region $12b$ in a self-aligned manner. The presence of the $WSi_2$ layers $7Aa$ and $7Ba$ serving as low-resistance first alloy regions that surround the entire peripheries of the Si pillars $4a$ and $4b$ can generate a uniform electric field in the P$^+$ region $12a$ and the N$^+$ region $12b$ during circuit operation. This uniform electric field can be generated regardless of the planar shape of the $WSi_2$ layers $7Ab$ and $7Bb$ serving as second alloy regions. The $WSi_2$ layers $7Ab$ and $7Bb$ serving as second alloy regions may be connected to any parts of the WSi₂ layers 7Aa and 7Ba serving as first alloy regions. Thus, in terms of design, the WSi₂ layers 7Ab and 7Bb serving as second alloy regions may be formed without surrounding the Si pillars 4a and 4b. This can increase the density of a circuit and improve the performance of the circuit.

3. In this embodiment, the WSi₂ layers 7a and 7b containing acceptor and donor impurities, which will be changed into the WSi₂ layers 7aa and 7bb in a process performed later, are source layers for supplying acceptor and donor impurities used for forming the P⁺ regions 12a and the N⁺ region 12b in the Si pillars 4a and 4b. The WSi₂ layers 7aa and 7bb in a completed circuit are formed in a self-aligned manner with the P⁺ region 12a and the N⁺ region 12b and serve as wiring conductor layers directly connected to the P⁺ region 12a and the N⁺ region 12b. This simplifies the production process of a circuit.

Figure 13:
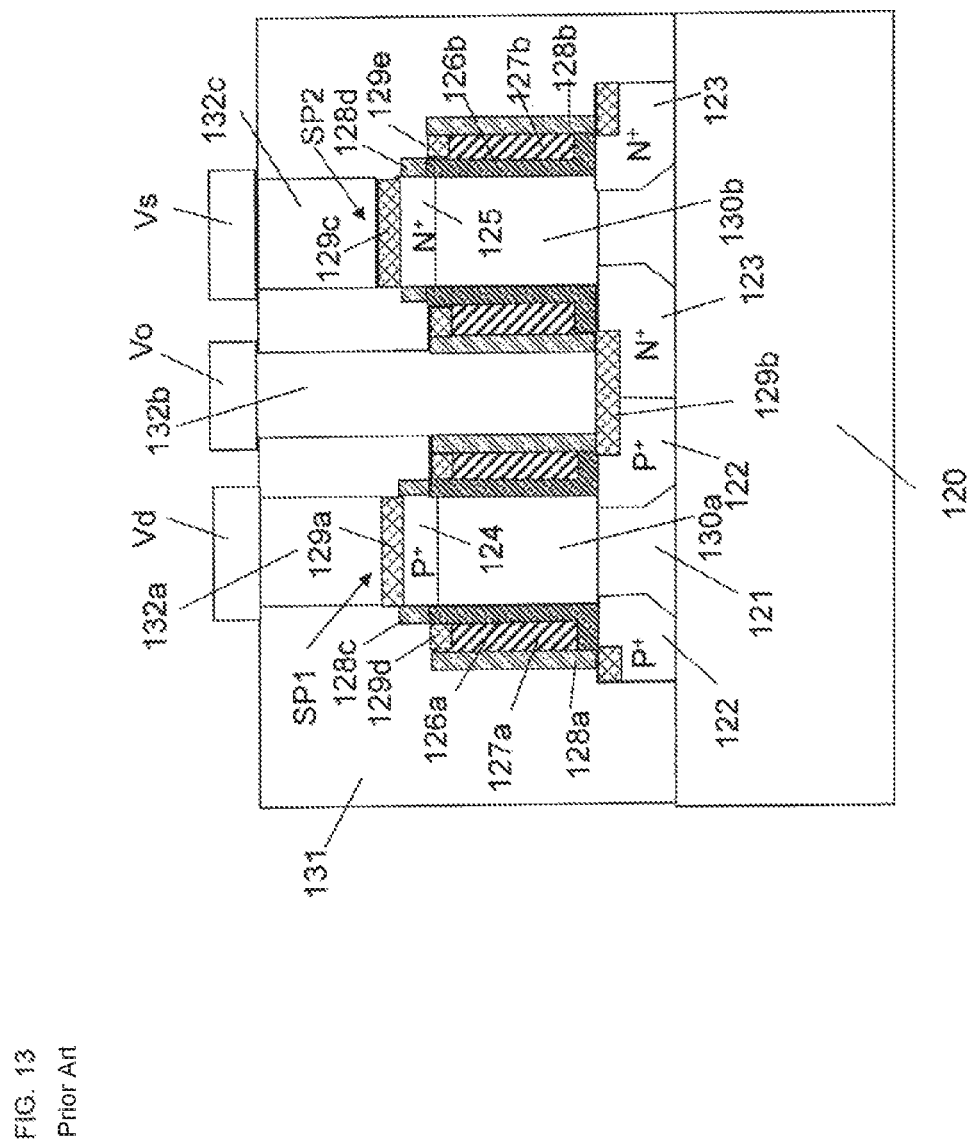
FIG. 13 is a sectional view of a CMOS inverter circuit including a known SGT.

4. In the related art, as illustrated in FIG. 13, the P⁺ region 122 and the N⁺ region 123 formed in the i layer 121 are formed so as to expand to the bottom portions of the Si pillars SP1 and SP2 and are connected to the wiring metal layer Vo through the contact hole 132a formed on the low-resistance silicide layer 129b formed on the upper surface of the i layer 121. Therefore, a resistance is generated in a portion of the P⁺ region 122 between the end of the silicide layer 129b and a position directly below the Si pillar SP1 and in a portion of the N⁺ region 123 between the end of the silicide layer 129b and a position directly below the Si pillar SP2, which reduces the driving current and the driving speed. In contrast, in this embodiment, the WSi₂ layers 7aa and 7bb serving as low-resistance silicide layers are directly connected to the P⁺ region 12a and the N⁺ region 12b on the side surfaces of the Si pillars 4a and 4b. This prevents formation of a resistance region formed in a portion of the P⁺ region 122 between the end of the silicide layer 129b and a position directly below the Si pillar SP1 and in a portion of the N⁺ region 123 between the end of the silicide layer 129b and a position directly below the Si pillar SP2 in the related art.

5. In the related art, as is clear from FIG. 13, the planar area of the contact hole 132b that connects the output wiring metal layer Vo and the P⁺ region 122 and N⁺ region 123 decreases with increasing the density of the circuit, which increases the contact resistance. In particular, when a high-density semiconductor circuit is formed, the contact hole is formed with a minimum size in plan view to increase the density. Therefore, the increase in the contact resistance is disadvantageous. In contrast, in this embodiment, the output wiring metal layer Vout is connected to the upper surfaces and side surfaces of the WSi₂ layers 7aa and 7bb in the contact hole 22d. Since the entire WSi₂ layers 7aa and 7bb are formed of a low-resistance silicide material, the contact resistance can be reduced by increasing the thicknesses of the WSi₂ layers 7aa and 7bb in the vertical direction without enlarging the shape of the contact hole 22d in plan view.

6. In the description of this embodiment, the contact hole 22d connected to the output wiring metal layer Vout is disposed so as to be in contact with both the WSi₂ layers 7aa and 7bb. However, the WSi₂ layer 7aa containing an acceptor impurity atom and the WSi₂ layer 7bb containing a donor impurity atom are both low-resistance silicide layers, and therefore even if the contact hole 22d is formed on only one of the WSi₂ layers 7aa and 7bb, the P⁺ region 12a and N⁺ region 12b can be connected to the output wiring metal layer Vout at a low resistance. This can increase the degree of freedom of the position of the contact hole 22d in the circuit design, which increases the density of the circuit.

Second Embodiment

Figure 2A:
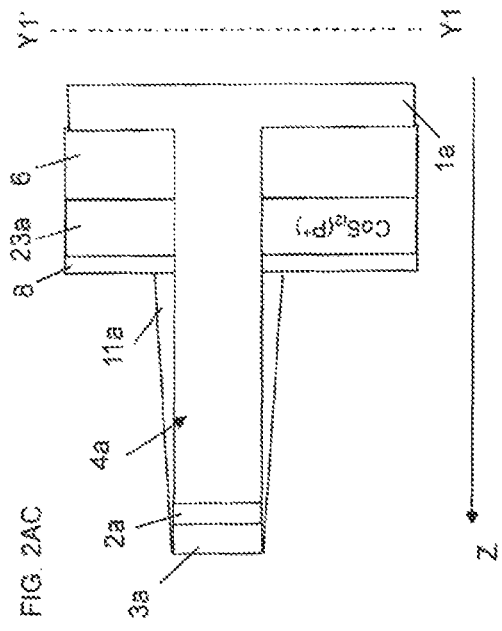
FIGS. 2AA to 2AD are a plan view and sectional views illustrating a CMOS inverter circuit for describing a method for producing a semiconductor device including an SGT according to a second embodiment.
Figure 2A:
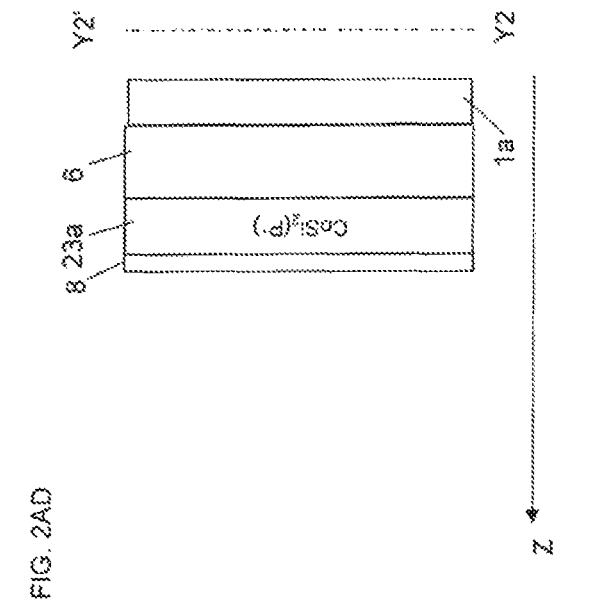
Figure 2A:
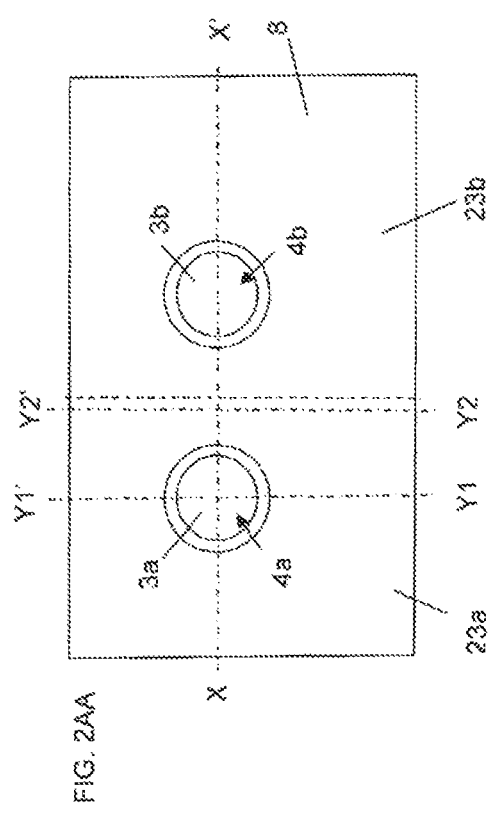
Figure 2A:
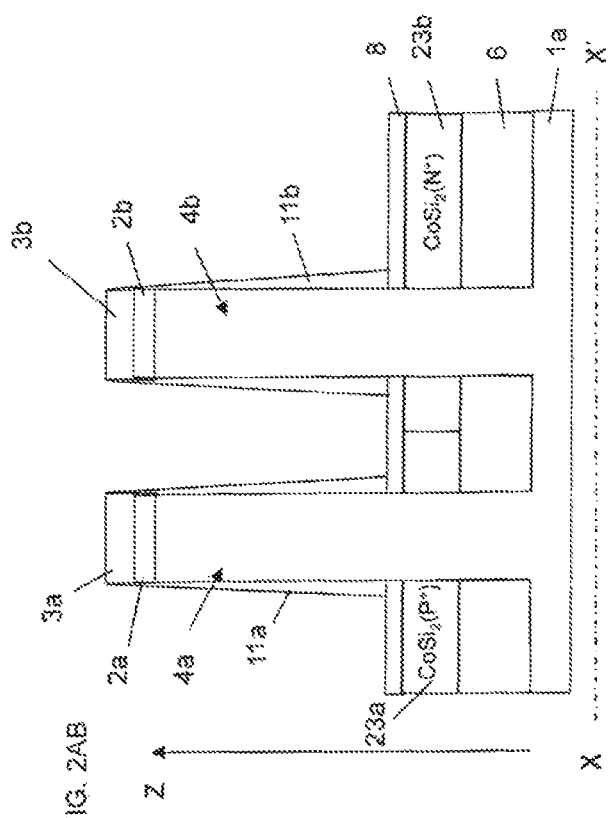

FIG. 2AA to FIG. 2CE illustrate a method for producing a CMOS inverter circuit including an SGT according to a second embodiment of the present invention. Among FIG. 2AA to FIG. 2CD, figures suffixed with A are plan views, figures suffixed with B are sectional views taken along line X-X' in the corresponding figures suffixed with A, figures suffixed with C are sectional views taken along line Y1-Y1' in the corresponding figures suffixed with A, and figures suffixed with D are sectional views taken along line Y2-Y2' in the corresponding figures suffixed with A. FIG. 2CE illustrates the relationship between Si pillars 4a and 4b, a P⁺ region 12a, an N⁺ region 12b, and CoSi₂ layers 23aa and 23bb in plan view.

As illustrated in FIGS. 2AA to 2AD, instead of the WSi₂ layers 7a and 7b in FIGS. 1EA to 1ED of the first embodiment, a CoSi₂ layer 23a containing an acceptor impurity is formed on the periphery of the Si pillar 4a and a CoSi₂ layer 23b containing a donor impurity is formed on the periphery of the Si pillar 4b.

Next, as illustrated in FIGS. 2BA to 2BD, by performing heat treatment, CoSi₂ layers 24a and 24b are formed on the side surfaces of the Si pillars 4a and 4b through silicidation. A P⁺ region 12a is formed in the Si pillar 4a through the forcing phenomenon of B atoms from the CoSi₂ layers 23a and 24a. An N⁺ region 12b is formed in the Si pillar 4b through the forcing phenomenon of As atoms from the CoSi₂ layers 23b and 24b (for the mechanism in which the CoSi₂ layers 24a and 24b, the P⁺ region 12a, and the N⁺ region 12b are formed through the forcing phenomenon of impurity atoms, refer to V. Probst, H. Schaber, A. Mitwalsky, and H. Kabza: "WSi₂ and CoSi₂ as diffusion sources for shallow-junction formation in silicon", J. Appl. Phys. Vol. 70(2), No. 15, pp. 708-719 (1991)).

Then, by performing the same processes as those in the first embodiment, a CMOS inverter circuit illustrated in FIGS. 2CA to 2CD is formed. The P⁺ region 12a and the N⁺ region 12b are formed in lower portions of the Si pillars 4a and 4b. The CoSi₂ layers 24a and 24b are formed on the side surfaces of the Si pillars 4a and 4b so as to surround the entire peripheries of the P⁺ region 12a and the N⁺ region 12b. The CoSi₂ layers 23aa and 23bb are formed so as to surround the entire peripheries of the CoSi₂ layers 24a and 24b.

FIG. 2CE illustrates the relationship between the Si pillars 4a and 4b, the P⁺ region 12a, the N⁺ region 12b, the CoSi₂ layers 24a and 24b formed inside the Si pillars 4a and 4b, and the CoSi₂ layers 23aa and 23bb that surround the entire peripheries of the Si pillars 4a and 4b in plan view. The diagonally shaded area indicates the CoSi₂ layers 23aa and 23bb. The CoSi₂ layer 23aa is constituted by a CoSi₂ layer 23Aa serving as a first alloy region that surrounds the entire periphery of the Si pillar 4a in a tubular shape with an equal width and is formed in a self-aligned manner with the P⁺ region 12a and a CoSi₂ layer 23Ab serving as a second alloy region that is partly connected to the periphery of the CoSi₂ layer 23Aa. The CoSi₂ layer 23bb is constituted by a CoSi₂ layer 23Ba serving as a first alloy region that surrounds the entire periphery of the Si pillar 4b in a tubular shape with an equal width and is formed in a self-aligned manner with the N⁺ region 12b and a CoSi₂ layer 23Bb serving as a second alloy region that is partly connected to the periphery of the CoSi₂ layer 23Ba. The CoSi₂ layer 24a serving as a third alloy layer is formed inside the Si pillar 4a so as to be connected to the entire inner periphery of the CoSi₂ layer 23Aa serving as a first alloy region. At the same time, the CoSi$_2$ layer 24b serving as a third alloy layer is formed inside the Si pillar 4b so as to be connected to the entire inner periphery of the CoSi$_2$ layer 23Ba.

In this embodiment, the CoSi$_2$ layer 24a serving as a third alloy layer that surrounds the entire periphery of the P$^+$ region 12a in a tubular shape with an equal width and the CoSi$_2$ layer 23Aa serving as a second alloy region are formed. Similarly, the CoSi$_2$ layer 24b serving as a third alloy layer that surrounds the entire periphery of the N$^+$ region 12b in a tubular shape with an equal width and the CoSi$_2$ layer 23Ba serving as a second alloy region are formed. Thus, an electric field is uniformly applied to the P$^+$ regions 12a and the N$^+$ region 12b, and the source or drain resistance in the bottom portion of the Si pillar can be reduced compared with in the first embodiment.

Third Embodiment

Figure 3A:
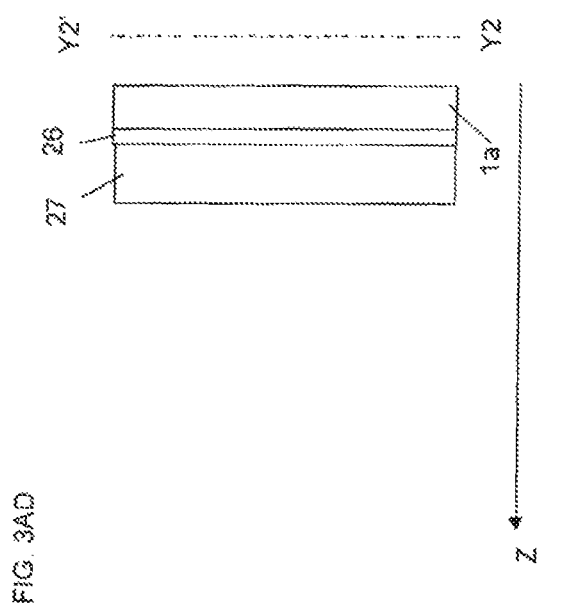
FIGS. 3AA to 3AD are a plan view and sectional views illustrating a CMOS inverter circuit for describing a method for producing a semiconductor device including an SGT according to a third embodiment.
Figure 3A:
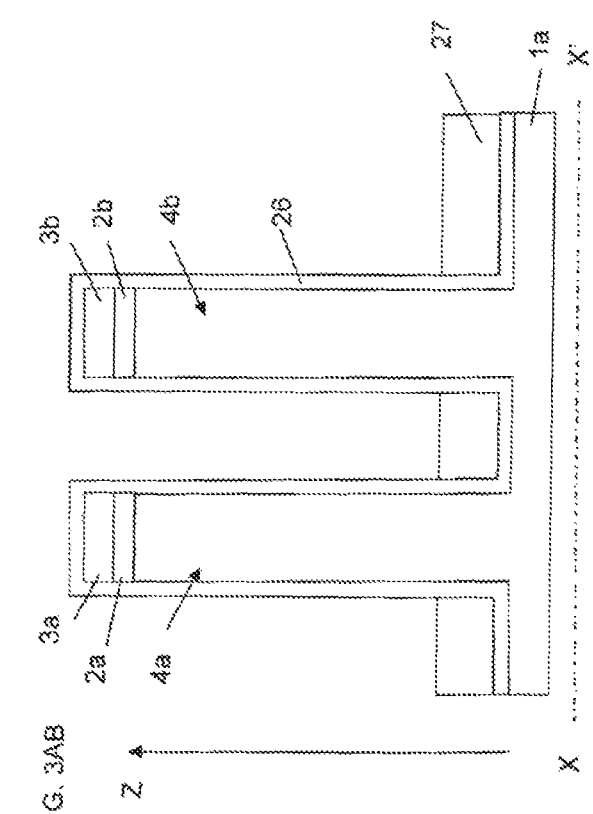
Figure 3A:
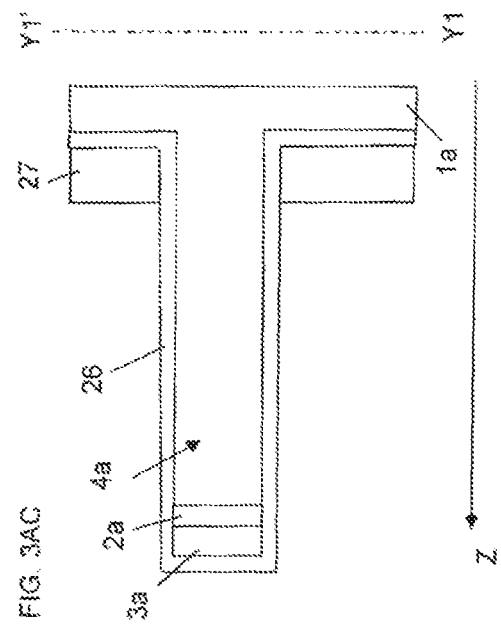
Figure 3A:
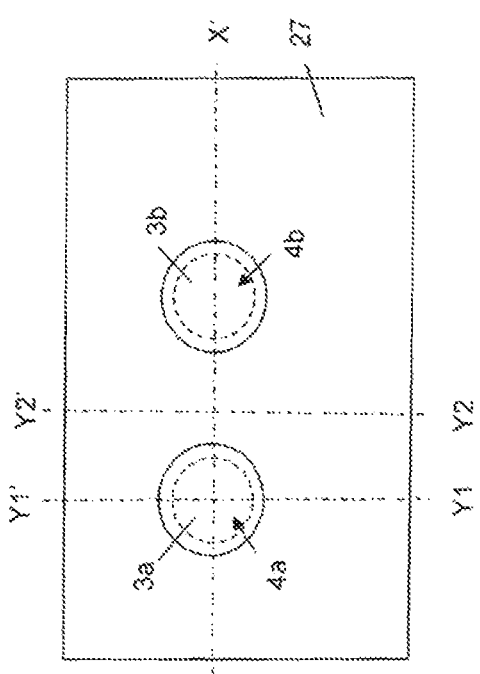
Figure 3B:
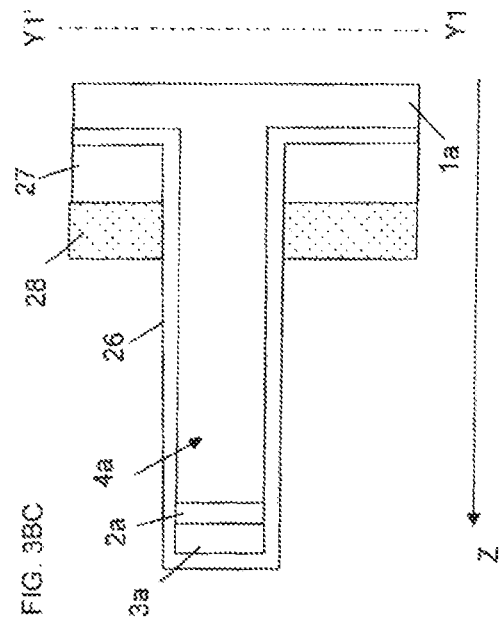
FIGS. 3BA to 3BD are a plan view and sectional views illustrating a CMOS inverter circuit for describing a method for producing a semiconductor device including an SGT according to a third embodiment.
Figure 3B:
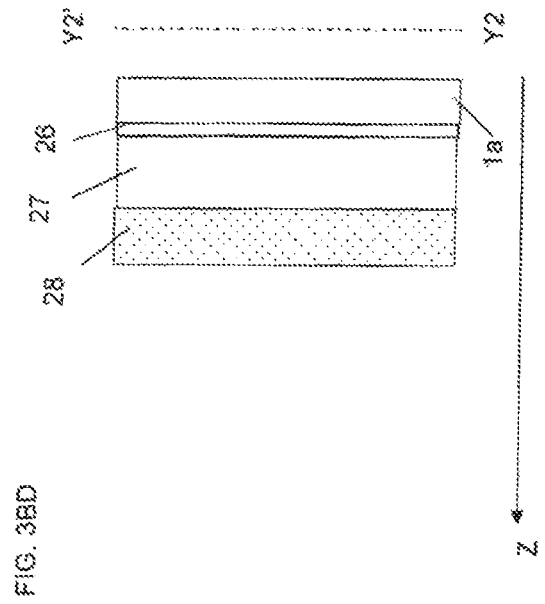
Figure 3B:
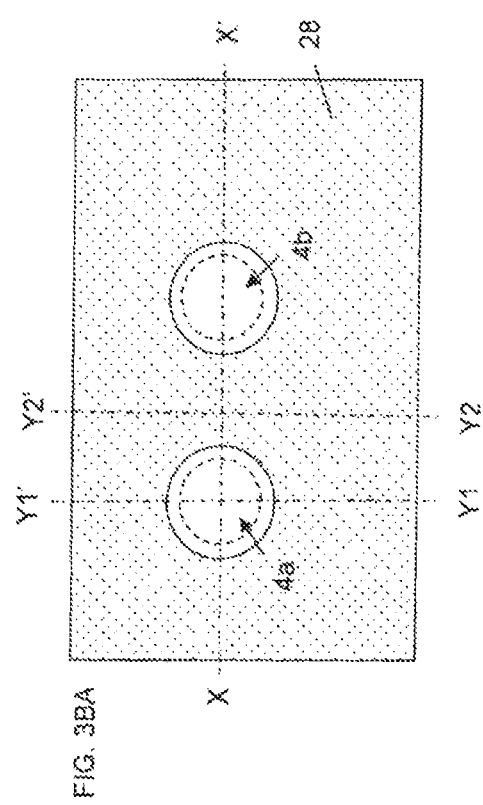
Figure 3B:
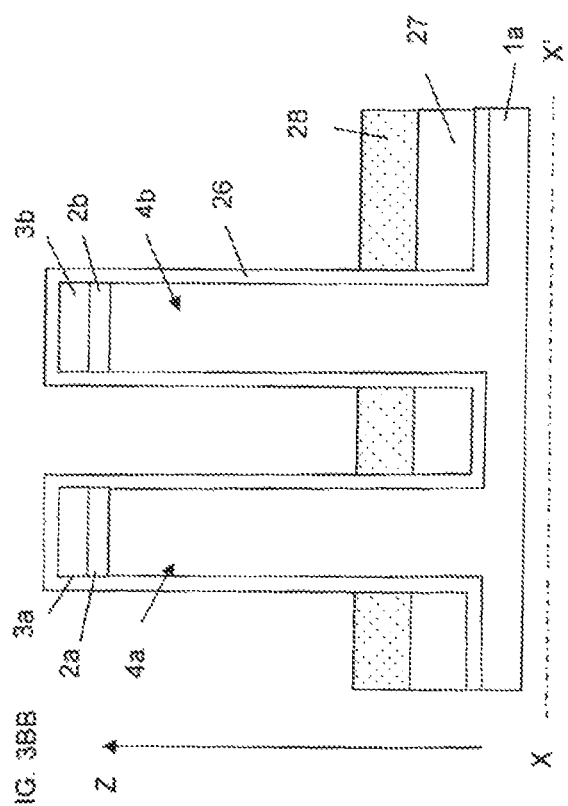
Figure 3E:
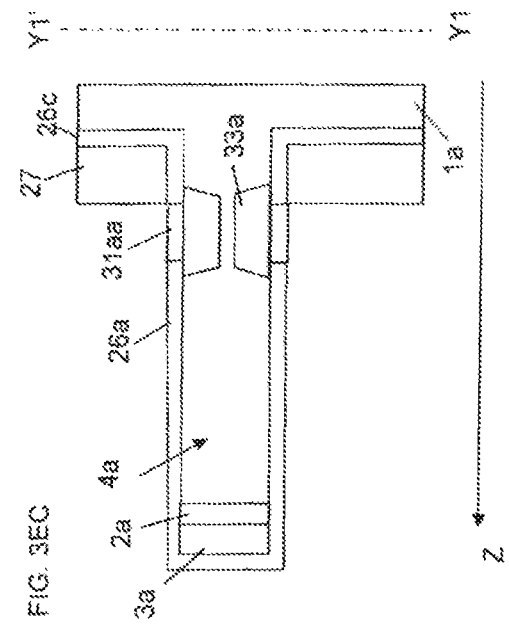
FIGS. 3EA to 3ED are a plan view and sectional views illustrating a CMOS inverter circuit for describing a method for producing a semiconductor device including an SGT according to a third embodiment.
Figure 3E:
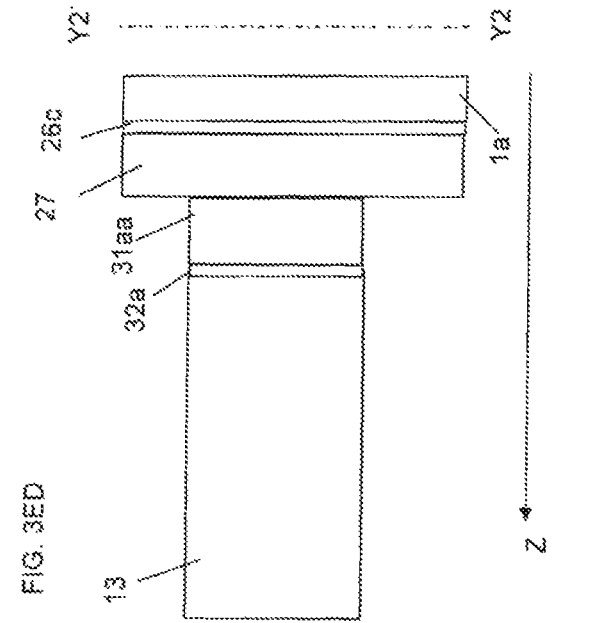
Figure 3E:
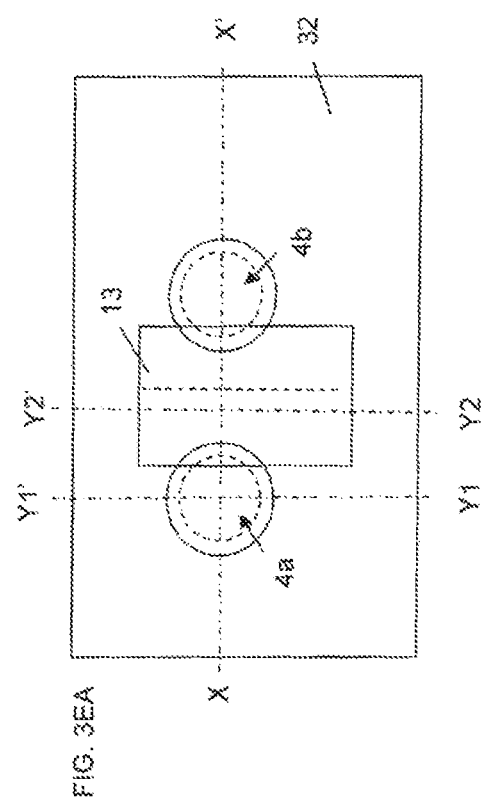
Figure 3E:
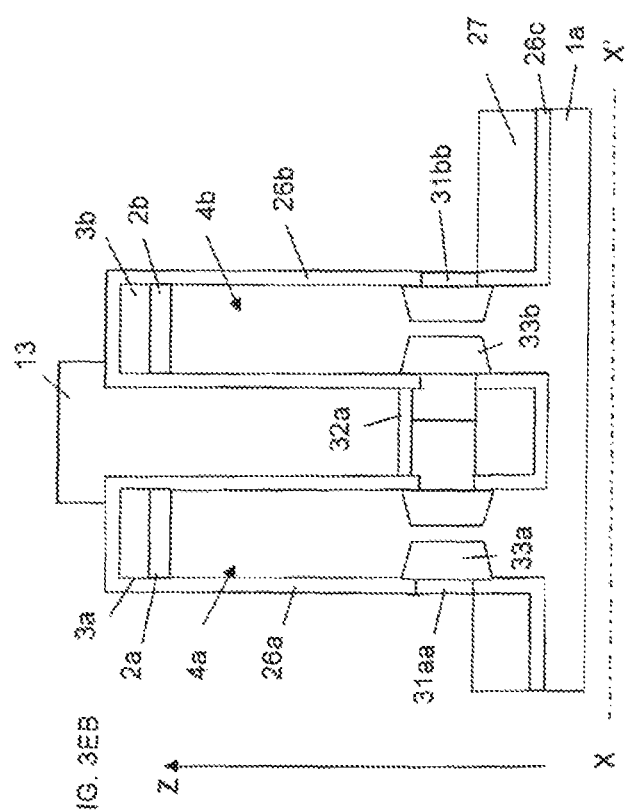
Figure 3F:
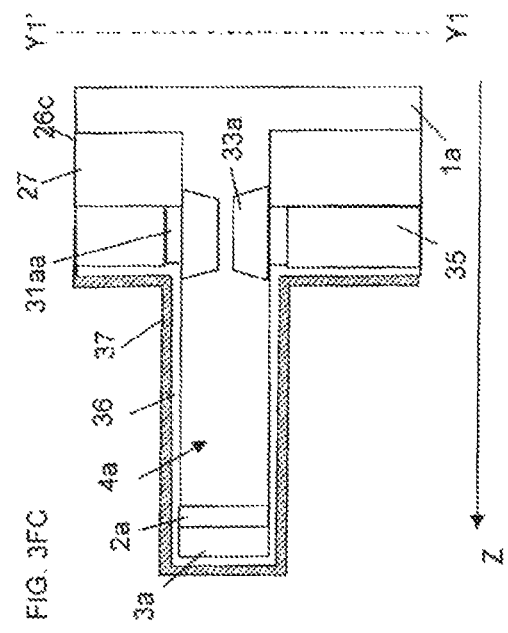
FIGS. 3FA to 3FD are a plan view and sectional views illustrating a CMOS inverter circuit for describing a method for producing a semiconductor device including an SGT according to a third embodiment.
Figure 3F:
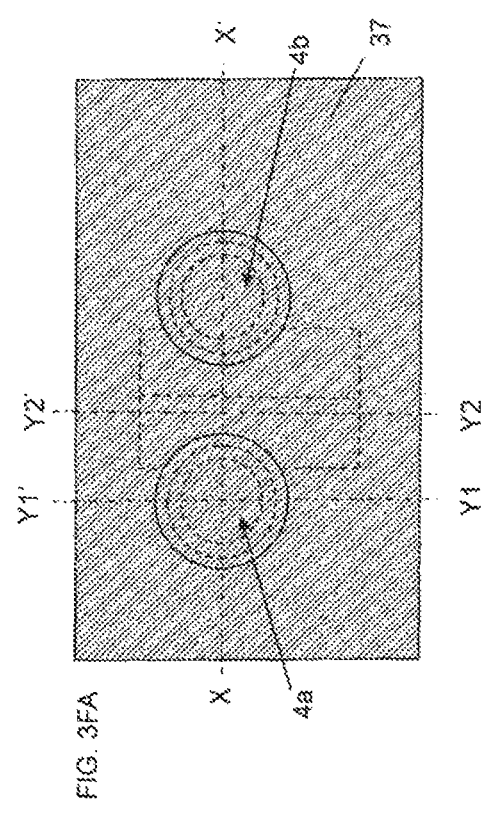
Figure 3F:
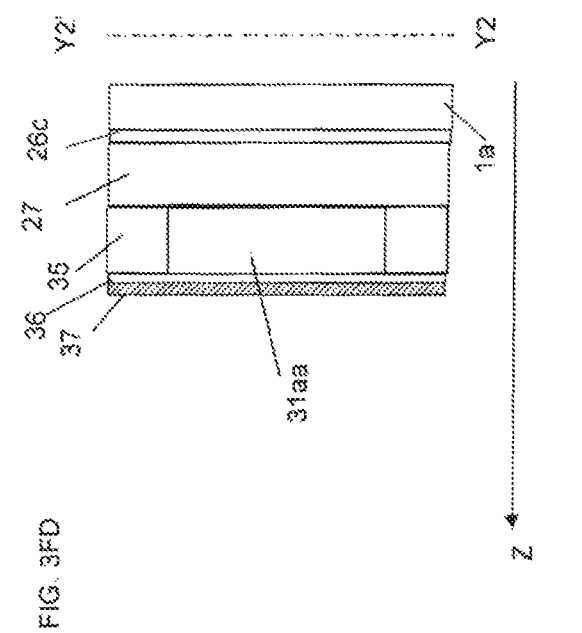
Figure 3F:
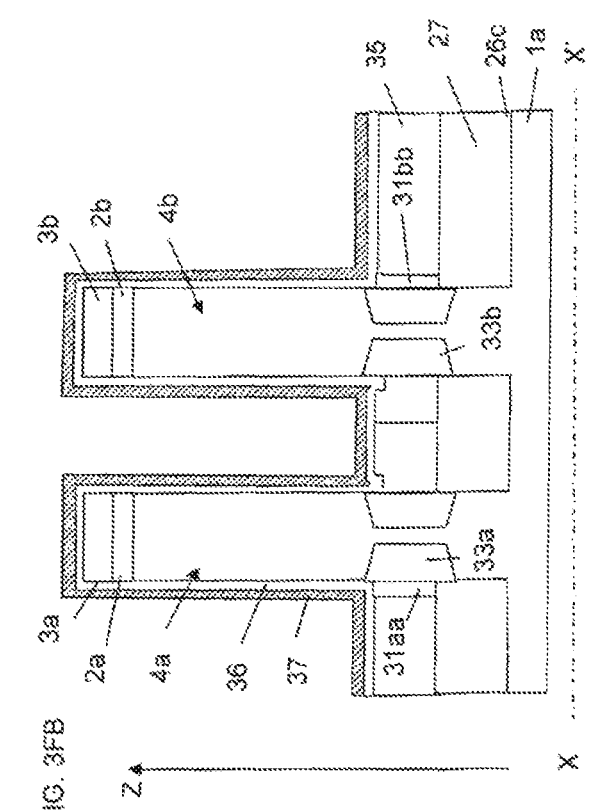

FIG. 3AA to FIG. 3FD illustrate a method for producing a CMOS inverter circuit including an SGT according to a third embodiment of the present invention. Among FIG. 3AA to FIG. 3FD, figures suffixed with A are plan views, figures suffixed with B are sectional views taken along line X-X' in the corresponding figures suffixed with A, figures suffixed with C are sectional views taken along line Y1-Y1' in the corresponding figures suffixed with A, and figures suffixed with D are sectional views taken along line Y2-Y2' in the corresponding figures suffixed with A.

As illustrated in FIGS. 3AA to 3AD, Si pillars 4a and 4b are formed on the i layer substrate 1a by RIE using the resist layer (not illustrated), the SiO$_2$ layers 3a and 3b, and the SiN layers 2a and 2b as masks. Then, a SiO$_2$ layer 26 is entirely deposited by ALD. A SiN layer 27 is formed on the peripheries of the Si pillars 4a and 4b.

Next, as illustrated in FIGS. 3BA to 3BD, a resist layer 28 is formed on the SiN layer 27. Hydrogen fluoride (HF) gas is caused to flow throughout the substrate to etch the SiO$_2$ layer 26 that is in contact with the resist layer 28 (for the etching mechanism, refer to Tadashi Shibata, Susumu Kohyama, and Hisakazu Iizuka: "A New Field Isolation Technology for High Density MOS LSI", Japanese Journal of Applied Physics, Vol. 18, pp. 263-267 (1979)).

Next, as illustrated in FIG. 3CA to 3CD, as a result of the etching of the SiO$_2$ layer 26, holes 30a and 30b are formed in the SiO$_2$ layer 26 at lower portions of the Si pillars 4a and 4b in a tubular shape. Thus, the SiO$_2$ layer 26 is divided into SiO$_2$ layers 26a and 26b that surround upper portions of the Si pillars 4a and 4b and a SiO$_2$ layer 26c that surrounds lower portions of the Si pillars 4a and 4b and lies on the i layer substrate 1a. Then, the resist layer 28 is removed. A WSi$_2$ layer 31 is formed on the SiN layer 27 so as to have an upper surface positioned higher than the holes 30a and 30b formed as a result of the etching of the SiO$_2$ layer 26. A SiO$_2$ layer 32 is formed on the WSi$_2$ layer 31.

Next, as illustrated in FIGS. 3DA to 3DD, a WSi$_2$ layer 31a containing B atoms and a WSi$_2$ layer 31b containing As atoms are formed through the same processes as those described in FIG. 1DA to FIG. 1ED of the first embodiment. By performing heat treatment, the B atoms in the WSi$_2$ layer 31a are forced toward the inside of the Si pillar 4a to form a P$^+$ region 33a and the As atoms in the WSi$_2$ layer 31b are forced toward the inside of the Si pillar 4b to form an N$^+$ region 33b.

Next, as illustrated in FIG. 3EA to 3ED, a resist layer 13 that partly covers the Si pillars 4a and 4b in plan view is formed through the same process as that described in FIGS. 1GA to 1GD of the first embodiment. The SiO$_2$ layer 32 and the WSi$_2$ layers 31a and 31b are etched by RIE using, as masks, the resist layer 13 and the SiO$_2$ layers 26a and 26b that cover the entire peripheries of the Si pillars 4a and 4b in plan view. Thus, WSi$_2$ layers 31aa and 31bb are formed below the SiO$_2$ layers 26a and 26b and the resist layer 13. A SiO$_2$ layer 32a is left below the resist layer 13.

Next, as illustrated in FIGS. 3FA to 3FD, the resist layer 13 and the SiO$_2$ layers 26a, 26b, and 32a are removed. A SiO$_2$ layer 35, a HfO$_2$ layer 36, and a TiN layer 37 are formed as in the case of the SiO$_2$ layer 14, the HfO$_2$ layer 15, and the TiN layer 16. Then, a CMOS inverter circuit is formed on the i layer substrate 1a by performing the same processes as those in FIG. 1HA to FIG. 1JD of the first embodiment.

In this embodiment, the WSi$_2$ layers 31aa and 31bb, which are similar to the WSi$_2$ layers 7aa and 7bb, can be formed without forming the SiO$_2$ layers 11a and 11b on the side surfaces of the Si pillars 4a and 4b unlike in the first embodiment. Thus, the same advantages as those of the first embodiment are obtained.

Fourth Embodiment

Figure 4A:
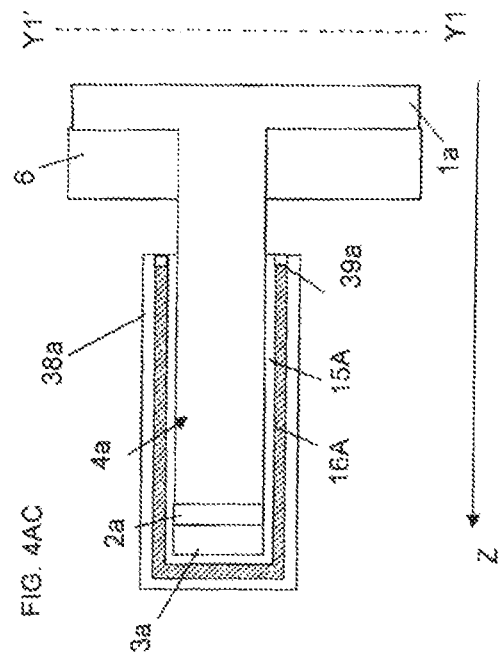
FIGS. 4AA to 4AD are a plan view and sectional views illustrating a CMOS inverter circuit for describing a method for producing a semiconductor device including an SGT according to a fourth embodiment.
Figure 4A:
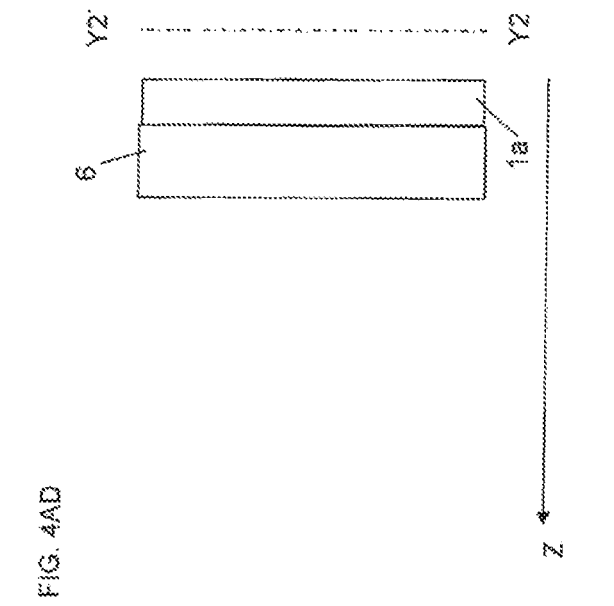
Figure 4A:
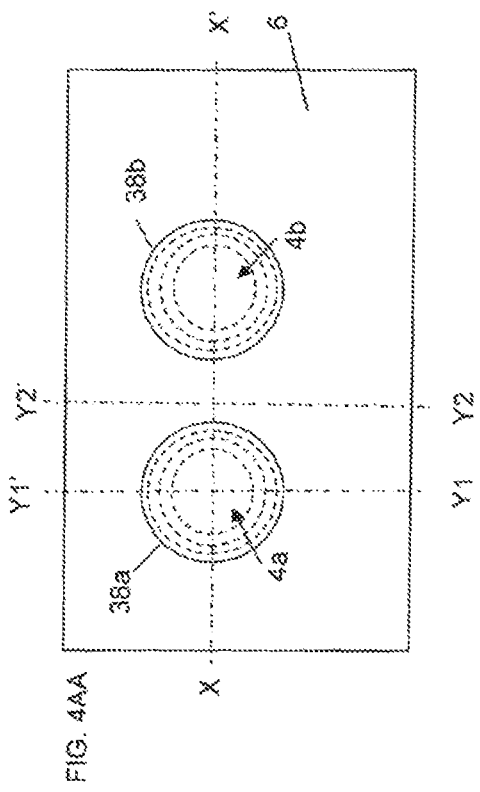
Figure 4A:
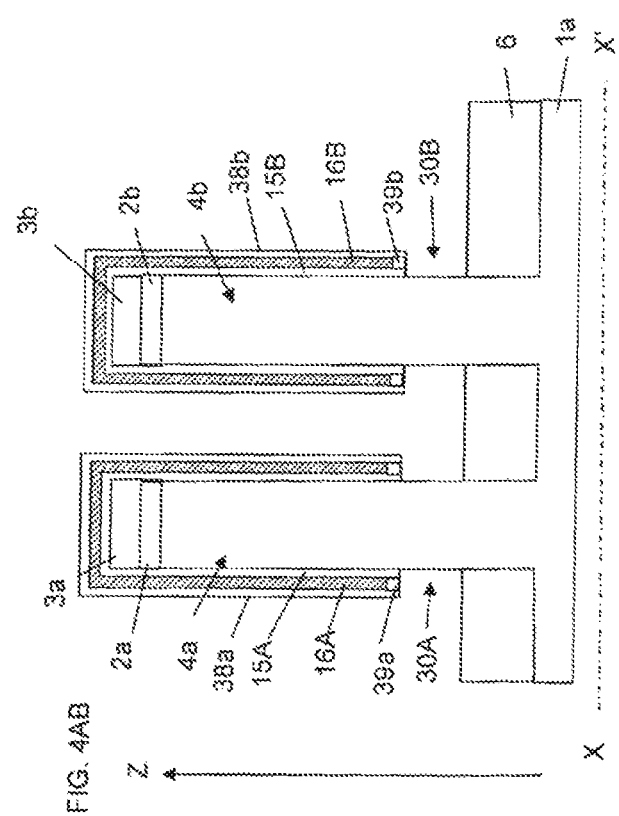

FIG. 4AA to FIG. 4DD illustrate a method for producing a CMOS inverter circuit including an SGT according to a fourth embodiment of the present invention. Among FIG. 4AA to FIG. 4DD, figures suffixed with A are plan views, figures suffixed with B are sectional views taken along line X-X' in the corresponding figures suffixed with A, figures suffixed with C are sectional views taken along line Y1-Y1' in the corresponding figures suffixed with A, and figures suffixed with D are sectional views taken along line Y2-Y2' in the corresponding figures suffixed with A.

In the third embodiment, as illustrated in FIGS. 3CA to 3CD, the holes 30a and 30b are formed, in a tubular shape, in the lower portions of the SiO$_2$ layers 26a and 26b that cover the Si pillars 4a and 4b. In contrast, in this embodiment, as illustrated in FIGS. 4AA to 4AD, a HfO$_2$ layer (not illustrated), a TiN layer (not illustrated), and a SiO$_2$ layer (not illustrated) that cover the Si pillars 4a and 4b and are formed on the SiN layer 6 are etched to form tubular holes 30A and 30B in the SiO$_2$ layers 26a and 26b at lower portions of the Si pillars 4a and 4b. Thus, HfO$_2$ layers 15A and 15B serving as gate insulating layers, TiN layers 16A and 16B serving as gate conductor layers, and SiO$_2$ layers 38a and 38b are formed so as to cover the Si pillars 4a and 4b. Titanium oxide (TiO) layers 39a and 39b are formed on surfaces of the TiN layers 16A and 16B, the surfaces facing the holes 30A and 30B.

Next, as illustrated in FIGS. 4BA to 4BD, for example, a CoSi$_2$ layer (not illustrated) and a SiO$_2$ layer 40 are formed on the SiN layer 6 so as to each have an upper surface positioned higher than the holes 30A and 30B. As in the second embodiment, a CoSi$_2$ layer 41a that surrounds the Si pillar 4a and contains B atoms and a CoSi$_2$ layer 41b that surrounds the Si pillar 4b and contains As atoms are formed by ion implantation. By performing heat treatment, the B atoms in the CoSi$_2$ layer 41a are forced toward the inside of the Si pillar 4a to form a P$^+$ region 42a, and the As atoms in the CoSi$_2$ layer 41b are forced toward the inside of the Si pillar 4b to form an N$^+$ region 42b. At the same time, CoSi$_2$ layers 43a and 43b are formed in the peripheral portions of the Si pillars 4a and 4b that are in contact with the CoSi$_2$ layers 41a and 41b.

Next, as illustrated in FIGS. 4CA to 4CD, a resist layer 13 that partly overlaps the top portions of the SiO$_2$ layers 38a and 38b that cover the Si pillars 4a and 4b is formed as in the first embodiment. The SiO₂ layer 40 and the CoSi₂ layers 41a and 41b are etched by RIE using the resist layer 13 and the SiO₂ layers 38a and 38b as masks to form a SiO₂ layer 40a and CoSi₂ layers 41aa and 41bb.

Subsequently, the resist layer 13 is removed. As illustrated in FIGS. 4DA to 4DD, a SiN layer 45 is then formed on the peripheries of the Si pillars 4a and 4b so as to have an upper surface positioned higher than the P⁺ region 42a and the N⁺ region 42b. Holes that surround the TiN layers 16A and 16B are formed in the SiO₂ layers 38A and 38B so that the upper surface of the SiN layer 45 is flush with the lower ends of the holes. A NiSi layer (not illustrated) is formed on the SiN layer 45 so as to be connected to the TiN layers 16A and 16B. NiSi layers 46a and 46b that surround the TiN layers 16A and 16B in a tubular shape with an equal width and a NiSi layer 46c connected to the NiSi layers 46a and 46 are formed by the same method as the P⁺ region 42a and the N⁺ region 42b using the SiO₂ layers 38A and 38B as etching masks. A SiO₂ layer 47 is formed on the SiN layer 45 and the NiSi layer 46c so as to have an upper surface positioned lower than the tops of the Si pillars 4a and 4b. A P⁺ region 19a is formed in a top portion of the Si pillar 4a and an N⁺ region 19b is formed in a top portion of the Si pillar 4b. A SiO₂ layer 21 is entirely formed. A contact hole 22a is formed on the P⁺ region 19a. A contact hole 22b is formed on the N⁺ region 19b. A contact hole 22C is formed on the NiSi layer 46c. A contact hole 22d that is connected to the upper surfaces and side surfaces of the CoSi₂ layers 41aa and 41bb is formed. A power supply wiring metal layer Vdd connected to the P⁺ region 19a through the contact hole 22a, a ground wiring metal layer Vss connected to the N⁺ region 19b through the contact hole 22b, an input wiring metal layer Vin connected to the NiSi layer 46c through the contact hole 22C, and an output wiring metal layer Vout connected to the CoSi₂ layers 41aa and 41bb through the contact hole 22d are formed on the SiO₂ layer 21. Thus, a CMOS inverter circuit is formed on the i layer substrate 1a.

This embodiment provides the following advantages.

1. In this embodiment, the CoSi₂ layers 41aa and 41bb connected to the P⁺ region 42a and the N⁺ region 42b through the CoSi₂ layers 43a and 43b are formed on the peripheries of the Si pillars 4a and 4b using the SiO₂ layers 38a and 38b and the resist layer 13 as etching masks. As in the first embodiment, the CoSi₂ layers 41aa and 41bb are constituted by first alloy regions that are directly in contact with the side surfaces of the Si pillars 4a and 4b, that surround the entire peripheries of the Si pillars 4a and 4b in a tubular shape with an equal width, and that are in contact with the P⁺ region 42a and the N⁺ region 42b in a self-aligned manner and a second alloy region partly connected to the peripheries of the first alloy regions. In this embodiment, the peripheries of the first alloy regions are aligned with the peripheries of the SiO₂ layers 38a and 38b that surround the TiN layers 16A and 16B serving as gate conductor layers in plan view. This increases the density of a circuit including an SGT.

2. In this embodiment, the NiSi layers 46a and 46b serving as first alloy regions connected to the TiN layers 16A and 16B serving as gate conductor layers are directly in contact with the side surfaces of the TiN layers 16A and 16B, surround the entire peripheries of the TiN layers 16A and 16B in a tubular shape with an equal width, and are formed in a self-aligned manner with the TiN layers 16A and 16B. This increases the density of a circuit including an SGT.

3. In the first embodiment, the thin SiN layer 8a and the thin HfO₂ layer 15a lie between the WSi₂ layers 7aa and 7bb connected to the P⁺ region 12a and the N⁺ region 12b serving as drain layers and the TiN layer 16a serving as a gate conductor layer. Therefore, there is a large capacitance between the drain P⁺ region 12a and N⁺ region 12b and the gate TiN layer 16a. This inhibits the increase in the speed of the CMOS inverter circuit. In contrast, in this embodiment, a thick SiN layer 45 is formed between the NiSi layers 46a, 46b, and 46c connected to the gate TiN layers 16A and 16B and the CoSi₂ layers 41aa and 41bb connected to the drain P⁺ region 42a and N⁺ region 42b. This can reduce the capacitance between the NiSi layers 46a, 46b, and 46c connected to the gate TiN layers 16A and 16B and the drain P⁺ region 42a and N⁺ region 42b. This increases the speed of the CMOS inverter circuit.

Fifth Embodiment

Figure 5A:
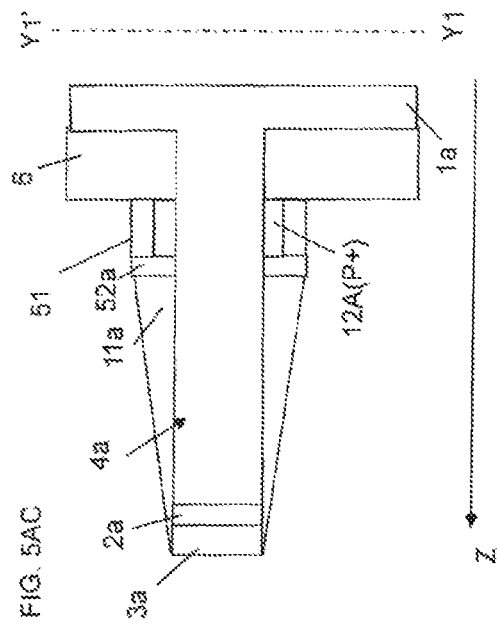
FIGS. 5AA to 5AD are a plan view and sectional views illustrating a CMOS inverter circuit for describing a method for producing a semiconductor device including an SGT according to a fifth embodiment.
Figure 5A:
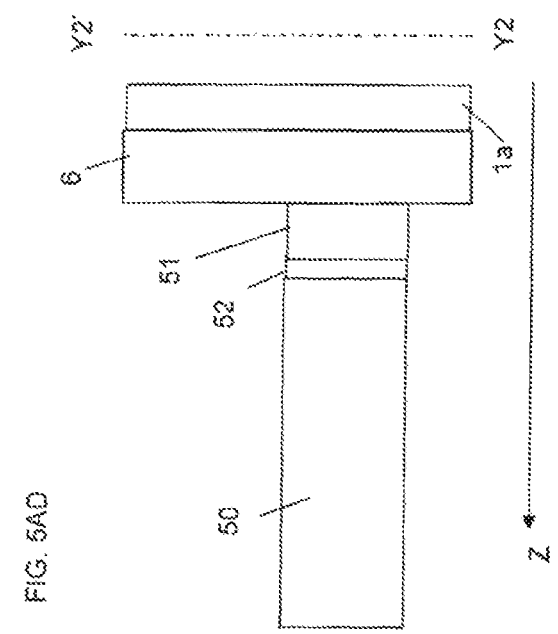
Figure 5A:
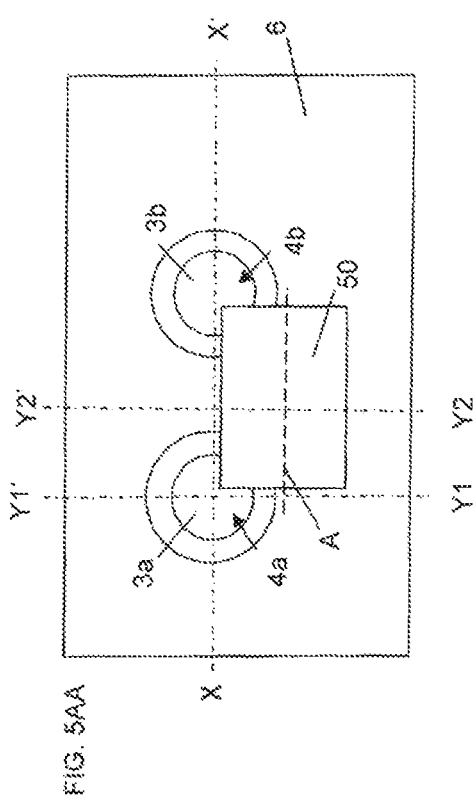
Figure 5A:
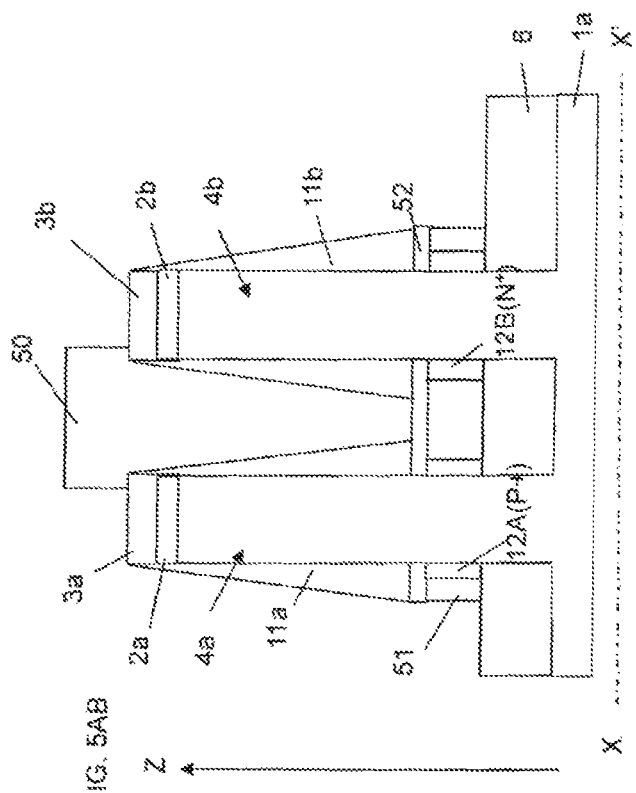

FIG. 5AA to FIG. 5DD illustrate a method for producing a CMOS inverter circuit including an SGT according to a fifth embodiment of the present invention. Among FIG. 5AA to FIG. 5DD, figures suffixed with A are plan views, figures suffixed with B are sectional views taken along line X-X' in the corresponding figures suffixed with A, figures suffixed with C are sectional views taken along line Y1-Y1' in the corresponding figures suffixed with A, and figures suffixed with D are sectional views taken along line Y2-Y2' in the corresponding figures suffixed with A.

As illustrated in FIGS. 5AA to 5AD, a P⁺ region 12A is formed so as to be connected to the side surface of the bottom portion of the Si pillar 4a, and an N⁺ region 12B is also formed so as to be connected to the side surface of the bottom portion of the Si pillar 4b. A W layer (not illustrated) is formed so as to surround the peripheries of the P⁺ region 12A and the N⁺ region 12B. A SiO₂ layer (not illustrated) is formed on the P⁺ region 12A, the N⁺ region 12B, and the W layer (not illustrated) and on the peripheries of the Si pillars 4a and 4b.

Subsequently, SiO₂ layers 11a and 11b each having an equal width in plan view are formed on the SiO₂ layer (not illustrated) so as to surround the Si pillars 4a and 4b by the same method as described in FIGS. 1EA to 1ED. The SiO₂ layers 11a and 11b are formed so that the peripheries of the bottom portions of the SiO₂ layers 11a and 11b protrude more outward than those of the P⁺ region 12A and the N⁺ region 12B in plan view. A resist layer 50 is formed so as to partly cover the Si pillars 4a and 4b and to taper in a downward direction in the drawing compared with the resist layer 13 in FIGS. 1GA to 1GD of the first embodiment in plan view. A center line A extending in a horizontal direction of the rectangular resist layer 50 in plan view does not pass through the centers of the Si pillars 4a and 4b. A W layer 51 and a SiO₂ layer 52 are formed by RIE using, as masks, the resist layer 50 and the SiO₂ layers 11a and 11b formed on the side surfaces of the peripheries of the Si pillars 4a and 4b as in the first embodiment. The resist layer 50 is removed.

Next, as illustrated in FIGS. 5BA to 5BD, a SiO₂ layer 14 is formed on the SiN layer 6 so as to have an upper surface that is flush with the upper surface of the SiO₂ layer 52. A HfO₂ layer 15, a TiN layer 16, and a SiO₂ layer (not illustrated) are entirely deposited. SiO₂ layers 52a and 52b are formed on the side surface of the TiN layer 16 that surrounds the Si pillars 4a and 4b by performing an etchback process. A rectangular resist layer 53 that is connected to the Si pillars 4a and 4b in the upper part of the drawing so as to partly cover the Si pillars 4a and 4b in plan view is formed. A center line B extending in a horizontal direction of the resist layer 53 in plan view does not pass through the centers of the Si pillars 4a and 4b.

Next, as illustrated in FIGS. 5CA to 5CD, the TiN layer 16 is etched by RIE using, as masks, the resist layer 53 and the SiO$_2$ layers 52a and 52b formed on the side surfaces of the peripheries of the Si pillars 4a and 4b. Thus, a TiN layer 16a is formed that is connected to the side surface of the HfO$_2$ layer 15 surrounding the Si pillars 4a and 4b and to a portion of the surface of the HfO$_2$ layer 15 on the SiO$_2$ layer 14. The resist layer 53 is removed. Consequently, the TiN layer 16a is constituted by first alloy regions that are directly in contact with the side surface of the HfO$_2$ layer 15 surrounding the side surfaces of the Si pillars 4a and 4b and that are formed in a self-aligned manner so as to surround the entire periphery of the HfO$_2$ layer 15 in a tubular shape with an equal width and a second alloy region that is partly connected to the peripheries of the first alloy regions. The second alloy region of the TiN layer 16a is formed so as to be, in plan view, away from the W layer 51 positioned below the resist layer 50 in FIGS. 5AA to 5AD.

Next, as illustrated in FIGS. 5DA to 5DD, a SiO$_2$ layer 18, a P$^+$ region 19a, an N$^+$ region 19b, and a SiO$_2$ layer 21 are formed as in the first embodiment. A contact hole 22a is formed on the P$^+$ region 19a. A contact hole 22b is formed on the N$^+$ region 19b. A contact hole 22e is formed on the TiN layer 16a. A contact hole 22d is formed so as to be connected to the upper and side surfaces of the W layer 51. A power supply wiring metal layer VDD connected to the P$^+$ region 19a through the contact hole 22a, a ground wiring metal layer VSS connected to the N$^+$ region 19b through the contact hole 22b, an input wiring metal layer VIN connected to the TiN layer 16a through the contact hole 22e, and an output wiring metal layer VOUT connected to the W layer 51 through the contact hole 22d are formed on the SiO$_2$ layer 21. Thus, a CMOS inverter circuit is formed on the i layer substrate 1a.

This embodiment provides the following advantages.

1. In the first embodiment, the majority of the second alloy region of the WSi$_2$ layers 7aa and 7bb overlaps the second alloy region of the TiN layer 16a in plan view. On the other hand, according to this embodiment, the W layer 51 corresponding to the second alloy region of the WSi$_2$ layers 7aa and 7bb does not overlap the second alloy region of the TiN layer 16a in plan view, only a portion of the W layer 51 that surrounds the Si pillars 4a and 4b with an equal width overlaps the first alloy regions of the TiN layer 16a in plan view. This can reduce the capacitance between the gate TiN layer 16a, the drain P$^+$ region 12A, and the N$^+$ region 12B, which increases the speed of the CMOS inverter circuit.

2. As a result of formation of the P$^+$ region 12A and the N$^+$ region 12B connected to the side surfaces of the bottom portions of the Si pillars 4a and 4b, impurity regions serving as a source and a drain of an SGT are not necessarily formed inside the Si pillars. A W layer 51 is formed with an equal width so as to surround the P$^+$ region 12A and the N$^+$ region 12B in plan view. This simplifies the production of an SGT.

Sixth Embodiment

Figure 6A:
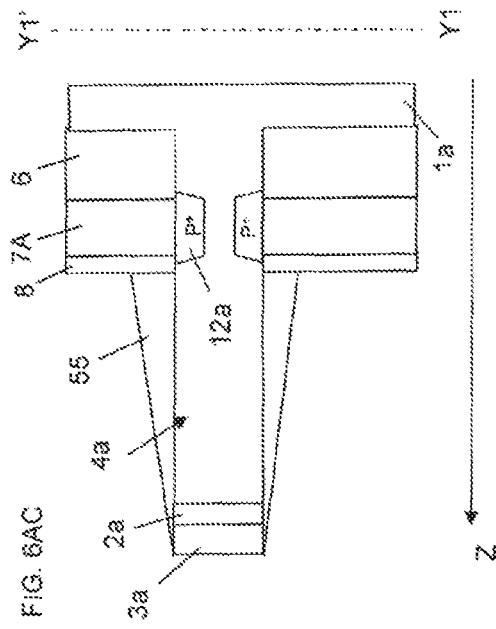
FIGS. 6AA to 6AD are a plan view and sectional views illustrating a CMOS inverter circuit for describing a method for producing a semiconductor device including an SGT according to a sixth embodiment.
Figure 6A:
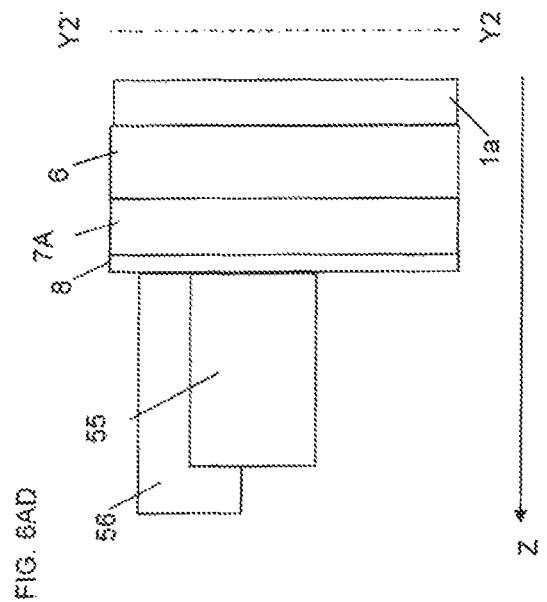
Figure 6A:
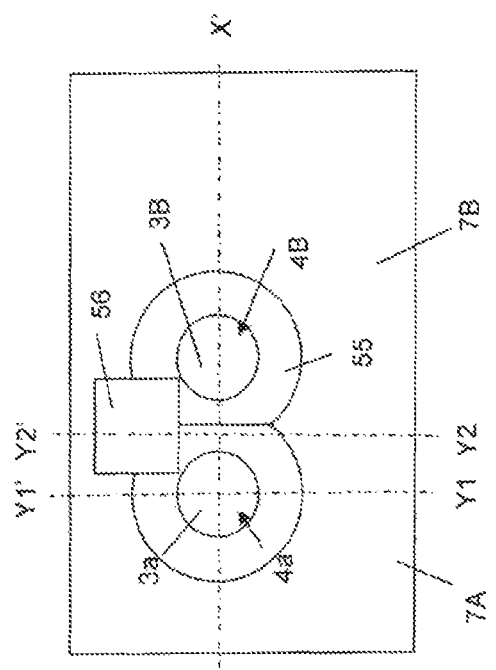
Figure 6A:
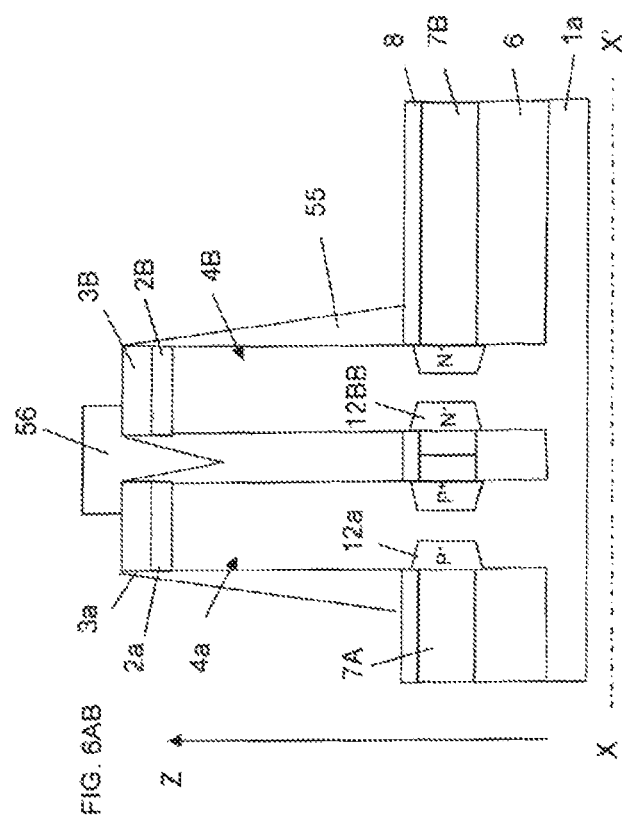
Figure 6B:
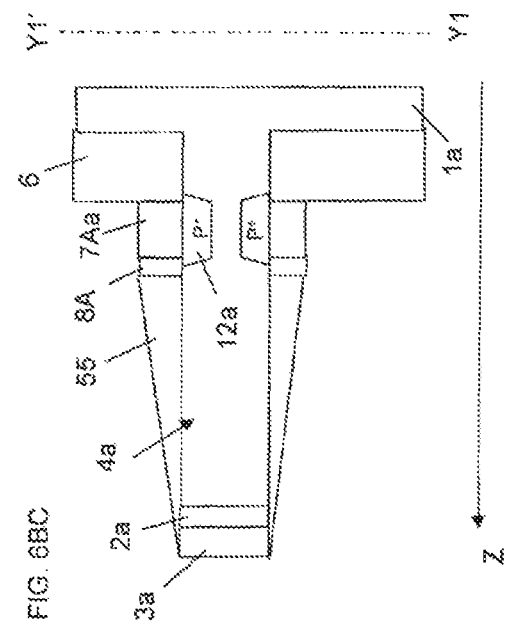
FIGS. 6BA to 6BE are plan views and sectional views illustrating a CMOS inverter circuit for describing a method for producing a semiconductor device including an SGT according to a sixth embodiment.
Figure 6B:
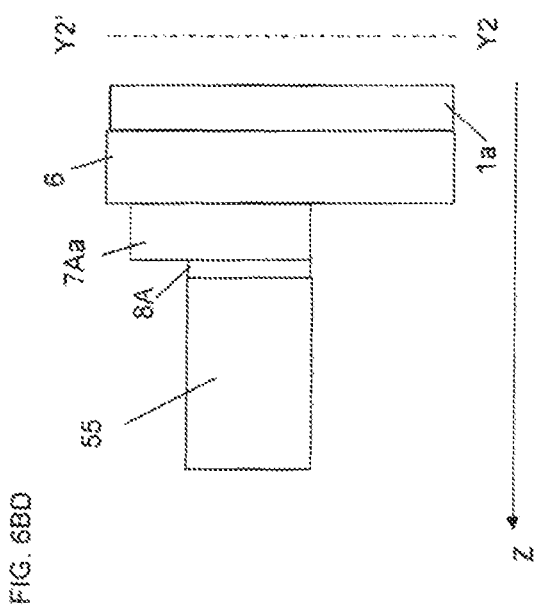
Figure 6B:
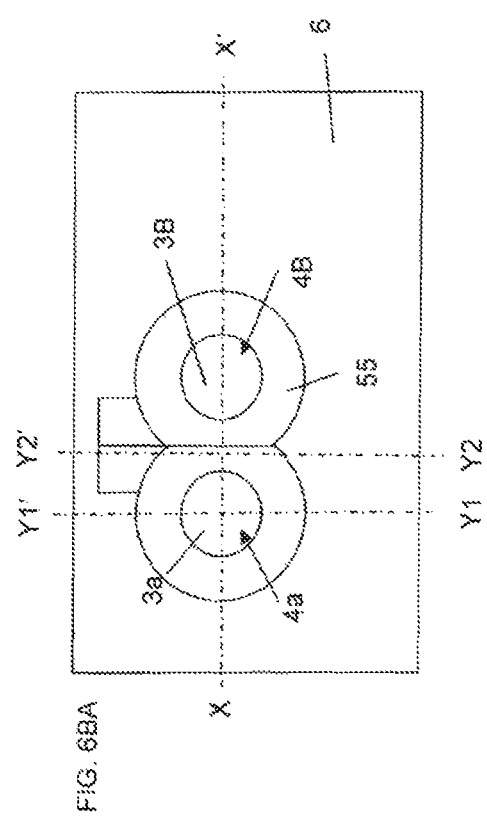
Figure 6B:
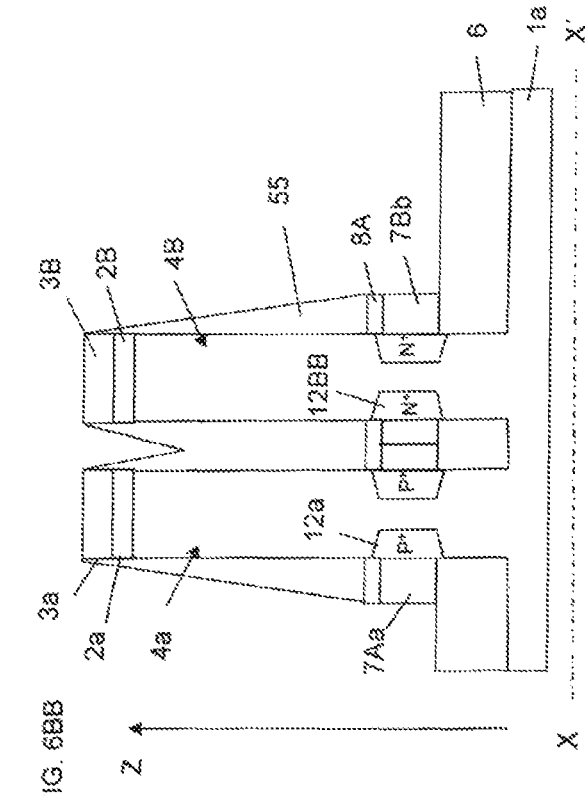

FIGS. 6AA to 6AD and FIGS. 6BA to 6BE illustrate a method for producing a CMOS inverter circuit including an SGT according to a sixth embodiment of the present invention. Among FIG. 6AA to FIG. 6BD, figures suffixed with A are plan views, figures suffixed with B are sectional views taken along line X-X' in the corresponding figures suffixed with A, figures suffixed with C are sectional views taken along line Y1-Y1' in the corresponding figures suffixed with A, and figures suffixed with D are sectional views taken along line Y2-Y2' in the corresponding figures suffixed with A.

As illustrated in FIGS. 6AA to 6AD, Si pillars 4a and 4B are formed on the i layer substrate 1a. The Si pillar 4B is formed closer to the Si pillar 4a than the Si pillar 4b in the first embodiment. A SiN layer 2a and a SiO$_2$ layer 3a are formed on the Si pillar 4a. A SiN layer 2B and a SiO$_2$ layer 3B are formed on the Si pillar 4B. A SiO$_2$ layer 6, a WSi$_2$ layer 7A containing B atoms, a WSi$_2$ layer 7B containing As atoms, and a SiN layer 8 are formed on the peripheries of the Si pillars 4a and 4B. By performing heat treatment, a P$^+$ region 12a is formed in a portion of the Si pillar 4a that is in contact with the WSi$_2$ layer 7A, and an N$^+$ region 12BB is formed in a portion of the Si pillar 4b that is in contact with the WSi$_2$ layer 7B. A SiO$_2$ film (not illustrated) is entirely deposited by CVD. The SiO$_2$ film is etched back by RIE to form SiO$_2$ layers 55 on the side surfaces of the Si pillars 4a and 4B. The SiO$_2$ layers 55 are formed so as to be connected to each other in a portion between the Si pillars 4a and 4B. A resist layer 56 that is partly in contact with the SiO$_2$ layers 55 in plan view is formed.

Next, as illustrated in FIGS. 6BA to 6BD, the SiN layer 8 and the WSi$_2$ layers 7A and 7B are etched using the SiO$_2$ layers 55 and the resist layer 56 as masks to form a SiN layer 8A and WSi$_2$ layers 7Aa and 7Bb. Subsequently, the same processes as those in the first embodiment are performed to form a CMOS inverter circuit.

FIG. 6BE illustrates the relationship between the Si pillars 4a and 4B, the P$^+$ region 12a, the N$^+$ region 12BB, and the WSi$_2$ layers 7Aa and 7Bb in plan view. The diagonally shaded area indicates the WSi$_2$ layers 7Aa and 7Bb. The WSi$_2$ layer 7Aa is constituted by WSi$_2$ layers 57a and 57b serving as first alloy regions that are formed in a self-aligned manner with the P$^+$ region 12a and the N$^+$ region 12BB so as to surround the entire periphery of the Si pillar 4a, WSi$_2$ layers 59a and 59b serving as second alloy regions that are partly in contact with the peripheries of the WSi$_2$ layers 57a and 57b so as to be connected to the WSi$_2$ layers 57a and 57b, WSi$_2$ layers 58a and 58b serving as third alloy regions that partly surround the peripheries of the WSi$_2$ layers 57a and 57b and are connected to the WSi$_2$ layers 59a and 59b, and a WSi$_2$ layer 58c serving as a fourth alloy region that is partly connected to the WSi$_2$ layers 58a and 58b. By performing the same processes as in FIG. 1HA to FIG. 1JE, a CMOS inverter circuit can be formed on the i layer substrate 1a.

This embodiment provides the following advantages.

1. In the first embodiment, as illustrated in FIGS. 1GA to 1GD, the SiO$_2$ layers 11a and 11b that surround the side surfaces of the Si pillars 4a and 4b are away from each other. In contrast, in this embodiment, the SiO$_2$ layers 55 are formed so as to surround the side surfaces of the Si pillars 4a and 4b and are connected to each other. Thus, even if the adjacent Si pillars 4a and 4b are brought close to each other, a CMOS inverter circuit can be formed on the i layer substrate 1a. This increases the degree of integration of a CMOS circuit.

2. This embodiment has been described using an example in which the present invention is applied to the formation of the WSi layers 7Aa and 7Bb connected to the P$^+$ region 12a and the N$^+$ region 12BB. Furthermore, the present invention is also applicable to the formation of the TiN layer 16a serving as a gate conductor layer in the fifth embodiment. This further increases the degree of integration of a CMOS circuit.

Seventh Embodiment

Figure 7C:
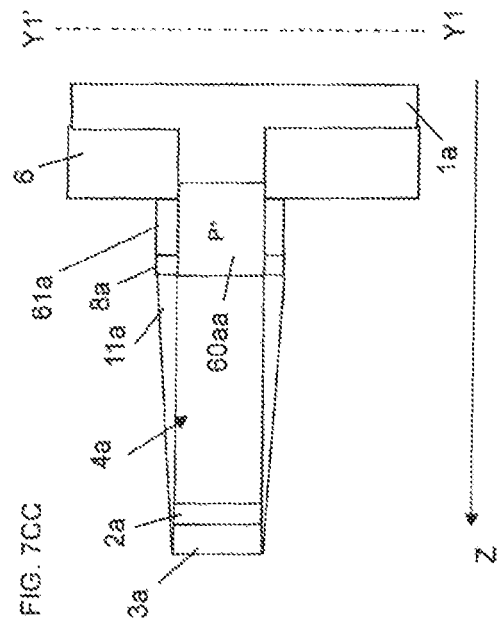
FIGS. 7CA to 7CD are a plan view and sectional views illustrating a CMOS inverter circuit for describing a method for producing a semiconductor device including an SGT according to a seventh embodiment.
Figure 7C:
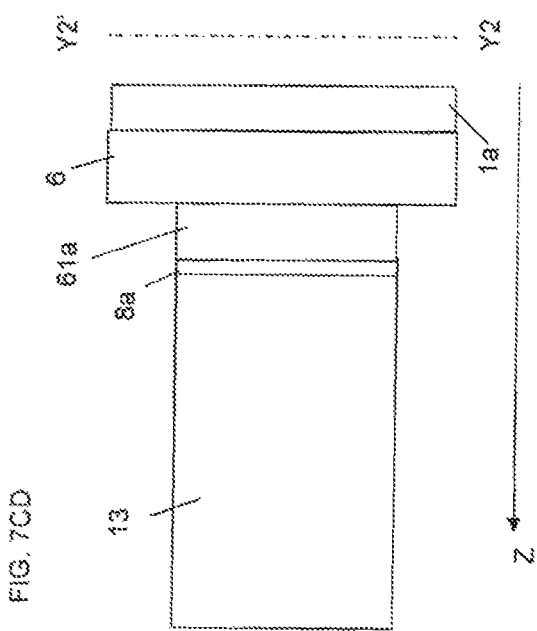
Figure 7C:
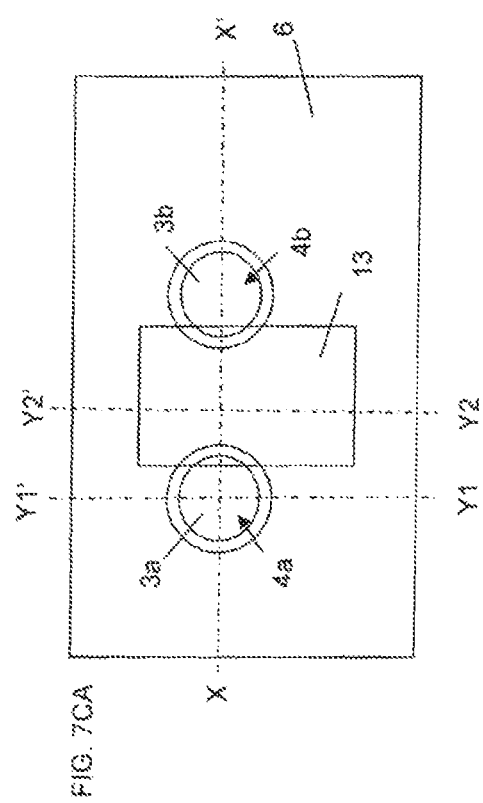
Figure 7C:
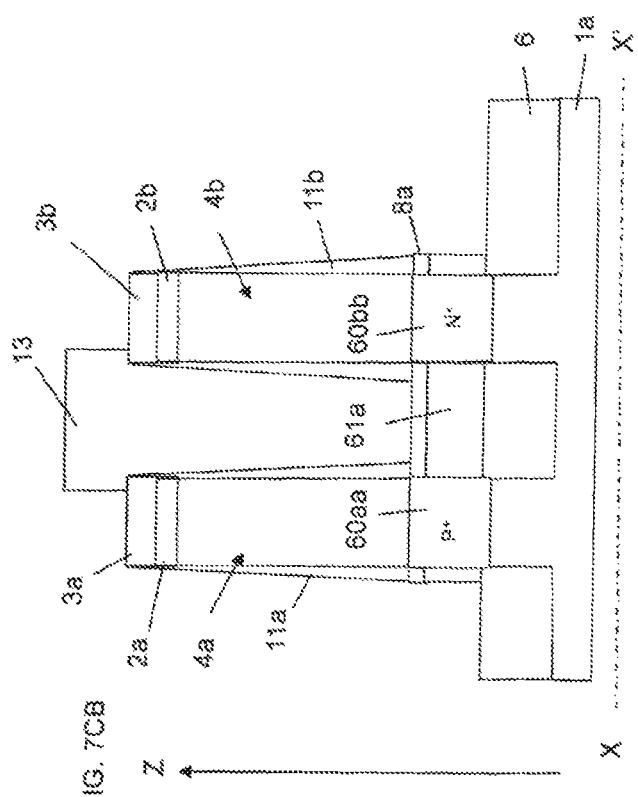

FIG. 7AA to FIG. 7CD illustrate a method for producing a CMOS inverter circuit including an SGT according to a seventh embodiment of the present invention. Among FIG. 7AA to FIG. 7CD, figures suffixed with A are plan views, figures suffixed with B are sectional views taken along line X-X' in the corresponding figures suffixed with A, figures suffixed with C are sectional views taken along line Y1-Y1' in the corresponding figures suffixed with A, and figures suffixed with D are sectional views taken along line Y2-Y2' in the corresponding figures suffixed with A.

As illustrated in FIGS. 7AA to 7AD, a P$^+$ region 60a and an N$^+$ region 60b are formed in a surface layer of an i layer substrate 1 by, for example, ion implantation. An i layer 1b is formed on the P$^+$ region 60a and the N$^+$ region 60b by, for example, a Si epitaxial process. As in the first embodiment, a SiN layer 2a, a SiO$_2$ layer 3a, and a resist layer 5a are formed on the i layer 1b above the P$^+$ region 60a, and a SiN layer 2b, a SiO$_2$ layer 3b, and a resist layer 5b are formed on the i layer 1b above the N$^+$ region 60b.

Next, as illustrated in FIGS. 7BA to 7BD, the i layer 1b, the P$^+$ region 60a, the N$^+$ region 60b, and the i layer substrate 1 are etched by RIE using the SiN layers 2a and 2b, the SiO$_2$ layers 3a and 3b, and the resist layers 5a and 5b on the i layer 1b as masks. Thus, as in the first embodiment, a lower portion of the i layer substrate 1 is left as an i layer substrate 1a and Si pillars 4a and 4b are formed on the i layer substrate 1a. As a result of the etching of the P$^+$ region 60a and the N$^+$ region 60b, a P$^+$ region 60aa and an N$^+$ region 60bb are formed inside the Si pillars 4a and 4b. A SiO$_2$ layer 6, a WSi$_2$ layer 61, and a SiN layer 8 are formed on the i layer substrate 1a on the peripheries of the Si pillars 4a and 4b.

Next, as illustrated in FIGS. 7CA to 7CD, the same processes as those in the first embodiment are performed. First, SiO$_2$ layers 11a and 11b are formed on the side surfaces of the peripheries of the Si pillars 4a and 4b. A resist layer 13 that partly covers the top portions of the Si pillars 4a and 4b so as to be connected to the Si pillars 4a and 4b is formed. The SiN layer 8 and the WSi$_2$ layer 61 are etched by RIE using the SiO$_2$ layers 11a and 11b and the resist layer 13 as masks to form a SiN layer 8a and a WSi$_2$ layer 61a.

Finally, the resist layer 13 is removed. Subsequently, by performing the same processes as those in the first embodiment, a CMOS inverter circuit is formed.

This embodiment provides the following advantages.

1. In this embodiment, before the formation of the WSi$_2$ layer 61, the P$^+$ region 60aa and the N$^+$ region 60bb are formed in the Si pillars 4a and 4b. Thus, as in the first embodiment, the WSi$_2$ layer 61a constituted by the first alloy regions that surround the entire peripheries of the P$^+$ region 60aa and the N$^+$ region 60bb and the second alloy region that is partly in contact with the peripheries of the first alloy regions so as to be connected to the first alloy regions can be formed without forming the WSi$_2$ layer 7a containing B atoms or the WSi$_2$ layer 7b containing As atoms.

2. In the first embodiment, by performing heat treatment, donor or acceptor impurity atoms are forced toward the inside of the Si pillars 4a and 4b from the WSi$_2$ layer 7a containing B atoms and WSi$_2$ layer 7b containing As atoms. Thus, the P$^+$ region 12a and the N$^+$ region 12b are formed. In this case, the heat treatment conditions such as temperature and time need to be set in consideration of, for example, separation of the WSi$_2$ layers 7a and 7b caused by generation of stress. In contrast, in this embodiment, such a problem does not arise because the P$^+$ region 60a and the N$^+$ region 60b are formed before the formation of the WSi$_2$ layer 61. Furthermore, the impurity concentration of the P$^+$ region 60a and the N$^+$ region 60b can be sufficiently increased. This can reduce the resistance of the drain P$^+$ region 60a and N$^+$ region 60b.

Herein, as in the first embodiment, a WSi$_2$ layer region containing B atoms (corresponding to the WSi$_2$ layer 7a in the first embodiment) and a WSi$_2$ layer region containing As atoms (corresponding to the WSi$_2$ layer 7b in the first embodiment) may be formed. In this case, the B atoms and the As atoms are forced toward the side surfaces of the peripheries of the P$^+$ region 60aa and the N$^+$ region 60bb from the WSi$_2$ layer region. Thus, the P$^+$ region 12a and the N$^+$ region 12b are formed as in the first embodiment, which can further reduce the contact resistances between the P$^+$ region 60aa and the WSi$_2$ layer 61a and between the N$^+$ region 60bb and the WSi$_2$ layer 61a. Furthermore, even if the P$^+$ region 12a and the N$^+$ region 12b are formed to positions close to the centers of the P$^+$ region 60a and the N$^+$ region 60b and thus the P$^+$ region 12a and the N$^+$ region 12b overlap the P$^+$ region 60a and the N$^+$ region 60b, no problems arise because a high-concentration donor or acceptor impurity region is formed in the Si pillars 4a and 4b. The same applies to other embodiments according to the present invention.

Eighth Embodiment

Figure 8A:
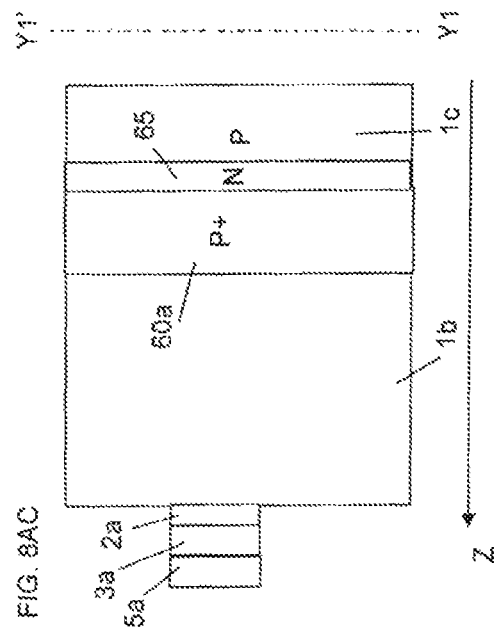
FIGS. 8AA to 8AD are a plan view and sectional views illustrating a CMOS inverter circuit for describing a method for producing a semiconductor device including an SGT according to an eighth embodiment.
Figure 8A:
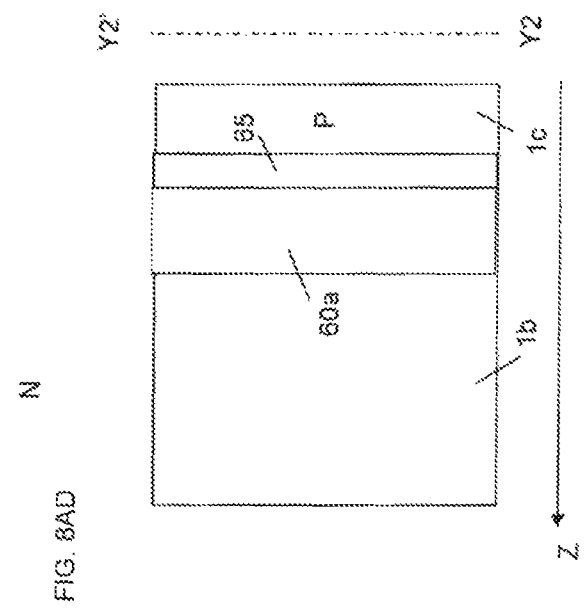
Figure 8A:
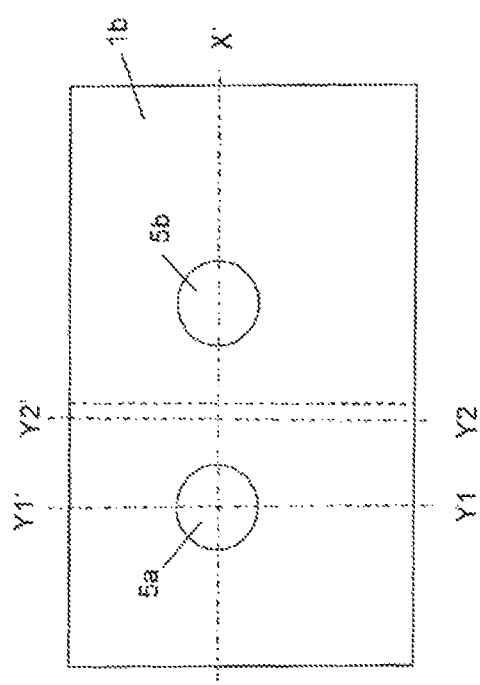
Figure 8A:
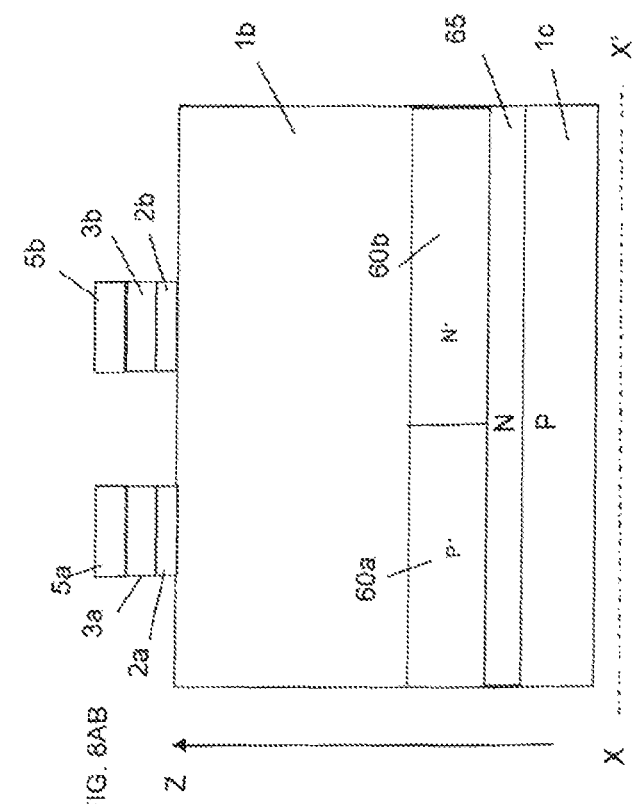

FIG. 8AA to FIG. 8DD illustrate a method for producing a CMOS inverter circuit including an SGT according to an eighth embodiment of the present invention. Among FIG. 8AA to FIG. 8DD, figures suffixed with A are plan views, figures suffixed with B are sectional views taken along line X-X' in the corresponding figures suffixed with A, figures suffixed with C are sectional views taken along line Y1-Y1' in the corresponding figures suffixed with A, and figures suffixed with D are sectional views taken along line Y2-Y2' in the corresponding figures suffixed with A.

As illustrated in FIGS. 8AA to 8AD, an N layer 65 is formed on a P-type substrate 1c by, for example, epitaxial crystal growth. A P$^+$ region 60a and an N$^+$ region 60b are formed in a surface layer of the N layer 65 by performing, for example, ion implantation of phosphorus and boron. An i layer 1b is formed on the P$^+$ region 60a and the N$^+$ region 60b by epitaxial crystal growth. As in FIGS. 1AA to 1AD, SiN layers 2a and 2b, SiO$_2$ layers 3a and 3b, and resist layers 5a and 5b are formed.

Next, as illustrated in FIGS. 8BA to 8BD, the i layer 1b, the P$^+$ region 60a, and the N$^+$ region 60b are etched to the intermediate position of the P$^+$ region 60a and the N$^+$ region 60b in the vertical direction using the SiN layers 2a and 2b, the SiO$_2$ layers 3a and 3b, and the resist layers 5a and 5b as etching masks. Thus, Si pillars 66a and 66b, a P$^+$ region 67a, and an N$^+$ region 67b are formed. A SiN layer 68 is formed on the peripheries of the Si pillars 66a and 66b so as to have an upper surface that is flush with the upper surfaces of the P$^+$ region 67a and the N$^+$ region 67b in the Si pillars 66a and 66b in the vertical direction.

Next, as illustrated in FIGS. 8CA to 8CD, SiO$_2$ layers 69a and 69b are formed so as to surround the side surfaces of the Si pillars with an equal width. A SiN layer (not illustrated) is formed on the peripheries of the Si pillars 66a and 66b so as to have an upper surface that is flush with the upper surfaces of the SiO$_2$ layers 3a and 3b in the vertical direction. A resist layer 71 is formed so as to be partly in contact with the SiO$_2$ layers 69a and 69b in plan view. The SiN layer (not illustrated), the SiN layer 68, the P$^+$ region 67a, the N$^+$ region 67b, the N layer 65, and the P layer 1c are etched using the SiO₂ layers 69a, 69b, 3a, and 3b and the resist layer 71 as masks. As a result of this etching, a SiN layer 70 below the resist layer, a SiN layer 68a, a P⁺ region 67aa, an N⁺ region 67bb, an N layer 65a, and a P layer 1cc are formed.

Next, as illustrated in FIGS. 8DA to 8DD, a SiO₂ layer 75 is formed on the peripheries of the Si pillars 66a and 66b so as to have an upper surface positioned higher than the upper surface of the SiN layer 68a. A HfO₂ layer (not illustrated) and a TiN layer (not illustrated) are formed on the SiO₂ layer 75 by ALD so as to cover the entire Si pillars 66a and 66b. SiO₂ layers 78a and 78b having an equal width in plan view are formed on the side surfaces of the Si pillars 66a and 66b so as to surround the TiN layer. A SiN layer (not illustrated) is formed on the peripheries of the Si pillars 66a and 66b so as to have an upper surface that is flush with the upper surfaces of the SiO₂ layers. A resist layer 81 is formed so as to partly overlap the SiO₂ layers 78a and 78b in plan view. The TiN layer and the HfO₂ layer are etched using the SiO₂ layers 78a and 78b, the SiO₂ layers 3a and 3b, and the resist layer 81 as masks to form TiN layers 77a and 77b and HfO₂ layers 76a and 76b. By performing the same processes as those in FIGS. 1IA to 1ID and FIGS. 1JA to 1JE, a CMOS inverter circuit including an SGT can be formed on the P layer substrate 1cc.

This embodiment provides the following advantages.

1. In the first embodiment, the P⁺ region 12a and the N⁺ region 12b that lie in the bottom portions of the Si pillars 4a and 4b are connected to the WSi₂ layers 7aa and 7bb. In contrast, in this embodiment, the P⁺ region 67aa and the N⁺ region 67bb serving as semiconductor layers are formed in which a region corresponding to the P⁺ region 12a, the N⁺ region 12b, and the WSi₂ layers 7aa and 7bb serving as alloy layers extends from the bottom portions of the Si pillars 66a and 66b. That is, the P⁺ region 67aa and the N⁺ region 67bb serving as semiconductor layers can be used that are connected to each other on the peripheries of the Si pillars 66a and 66b in plan view. In this case, alloy layers that are in contact with the side surfaces of the bottom portions of the Si pillars 66a and 66b are not necessarily formed. This simplifies the processes. Herein, a metal layer such as a W layer or an alloy layer such as a WSi layer is desirably attached to the upper surfaces of the P⁺ region 67aa and the N⁺ region 67bb because the contact resistance between the P⁺ region 67aa and the N⁺ region 67bb can be reduced.

2. In this embodiment, as illustrated in FIGS. 8CA to 8CD, the SiN layer (not illustrated) is formed on the peripheries of the Si pillars 66a and 66b so as to have an upper surface that is flush with the upper surfaces of the SiO₂ layers 3a and 3b in the vertical direction, and the resist layer 71 that is partly in contact with the SiO₂ layers 69a and 69b in plan view is formed. The resist layer 71 is formed by lithography. This lithography is performed on a resist layer (not illustrated) formed on the SiO₂ layers 3a and 3b having upper surfaces that are flush with each other and the SiN layer (not illustrated) that surrounds the peripheries of the SiO₂ layers 3a and 3b. Thus, lithography can be performed on the substrate having a small difference in level compared with in the first embodiment, and therefore the resist layer 71 can be formed with high forming precision.

Ninth Embodiment

Figure 9B:
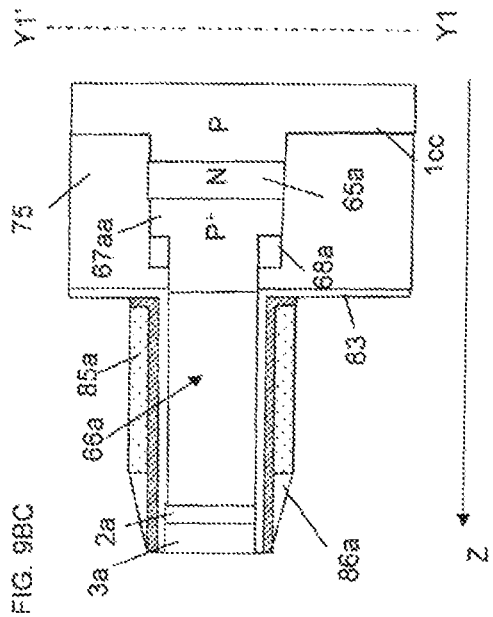
FIGS. 9BA to 9BD are a plan view and sectional views illustrating a CMOS inverter circuit for describing a method for producing a semiconductor device including an SGT according to a ninth embodiment.
Figure 9B:
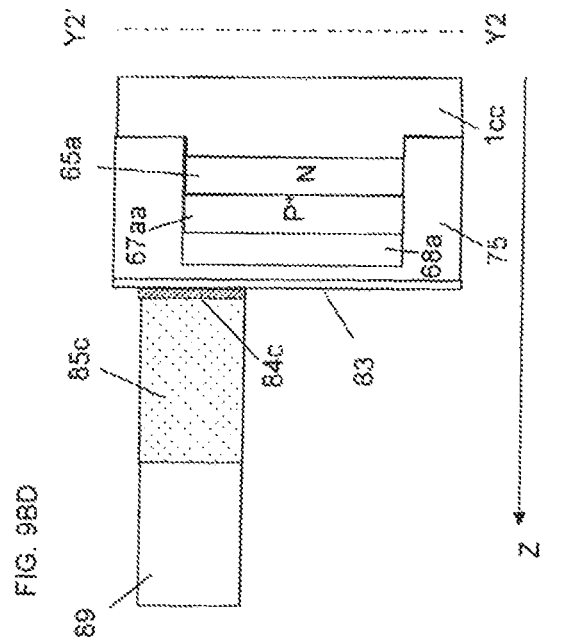
Figure 9B:
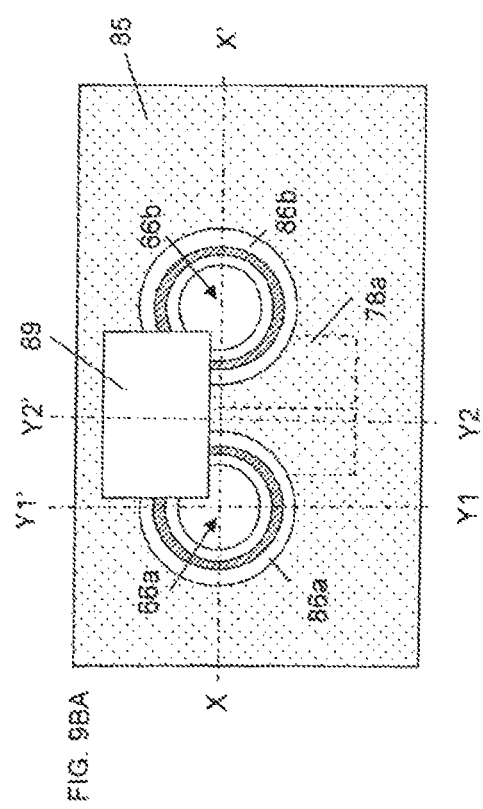
Figure 9B:
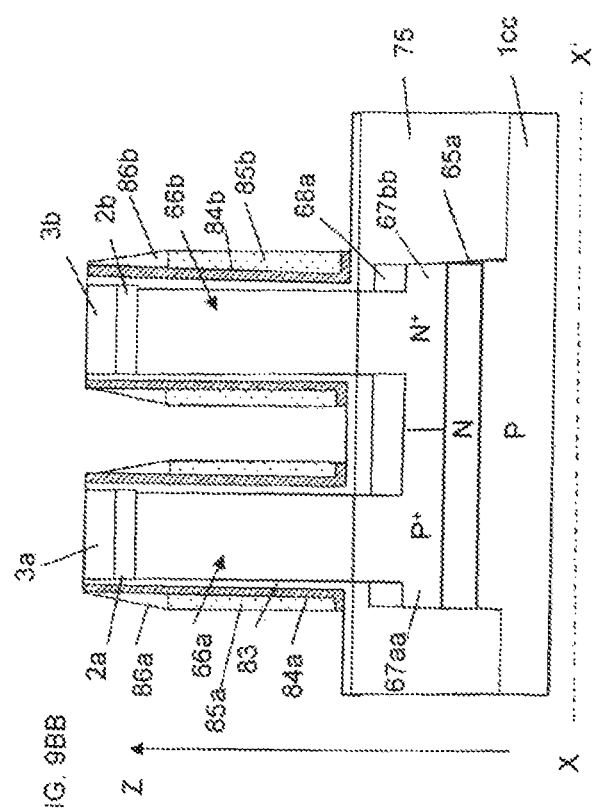
Figure 12:
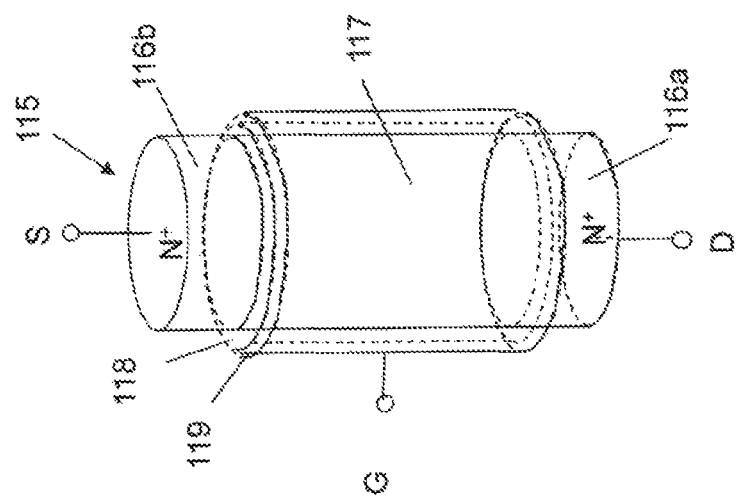
FIG. 12 schematically illustrates a structure of a known SGT.

FIG. 9AA to FIG. 9BD illustrate a method for producing a CMOS inverter circuit including an SGT according to a ninth embodiment of the present invention. Among FIG. 9AA to FIG. 9BD, figures suffixed with A are plan views, figures suffixed with B are sectional views taken along line X-X' in the corresponding figures suffixed with A, figures suffixed with C are sectional views taken along line Y1-Y1' in the corresponding figures suffixed with A, and figures suffixed with D are sectional views taken along line Y2-Y2' in the corresponding figures suffixed with A.

As illustrated in FIGS. 9AA to 9AD, a HfO₂ layer 83 and a TiN layer 84 are formed around the side surfaces of the Si pillars 66a and 66b and on the SiO₂ layer 75 by, for example, ALD. A W layer 85 is formed on the periphery of the TiN layer 84 so as to have an upper surface positioned lower than the tops of the Si pillars 66a and 66b. SiN layers 86a and 86b are formed so as to surround the side surface of the TiN layer 84 above the W layer 85 with an equal width in plan view. A resist layer 89 is formed so as to partly overlap the SiN layers 86a and 86b in plan view.

Next, as illustrated in FIGS. 9BA to 9BD, the W layer 85 and the TiN layer 84 are etched using the SiN layers 86a, 86b, 3a, and 3b and the resist layer 89 as masks. Thus, W layers 85a and 85b that surround the Si pillars 66a and 66b in a tubular shape with an equal width and a W layer 85c that is partly in contact with the W layers 85a and 85b below the resist layer 89 are formed. In this case, the W layers 85a, 85b, and 85c desirably function as etching masks for the TiN layer 84. By performing the same processes as those in FIGS. 1IA to 1ID and FIGS. 1JA to 1JE while the W layers 85a, 85b, and 85c are left, a CMOS inverter circuit including an SGT can be formed on the P layer substrate 1cc.

This embodiment provides the following advantages.

1. In the fifth embodiment, the SiO₂ layers 52a and 52b are formed so as to surround the entire TiN layer 16 on the side surfaces of the Si pillars 4a and 4b. In this case, the SiO₂ layers 52a and 52b need to be formed with an equal width in plan view over a long distance from the P⁺ region 12a and the N⁺ region 12b to the tops of the Si pillars 4a and 4b in the vertical direction. In contrast, in this embodiment, the SiN layers 86a and 86b corresponding to the SiO₂ layers 52a and 52b are formed with a small height so as to surround the peripheries of the top portions of the Si pillars 66a and 66b. Thus, the SiN layers 86a and 86b can be formed with high precision. The W layers 85a and 85b are formed on the side surfaces of the Si pillars 66a and 66b with a uniform thickness in the vertical direction. Therefore, the TiN layers 84a and 84b are formed with high precision.

2. In this embodiment, the W layers 85a and 85b that surround the Si pillars 66a and 66b in a tubular shape with an equal width and the W layer 85c that is partly in contact with the W layers 85a and 85b function as gate conductor layers. Thus, a shallow contact hole (not illustrated) can be formed on the W layer 85c in the subsequent process. Consequently, a contact hole can be formed with high precision. This increases the degree of integration of a circuit including an SGT.

Tenth Embodiment

FIGS. 10A to 10D illustrate a method for producing a CMOS inverter circuit including an SGT according to a tenth embodiment of the present invention. FIG. 10A is a plan view, FIG. 10B is a sectional view taken along line X-X' in FIG. 10A, FIG. 10C is a sectional view taken along line Y1-Y1' in FIG. 10A, and FIG. 10D is a sectional view taken along line Y2-Y2' in FIG. 10A.

As illustrated in FIGS. 10A to 10D, SiN layers 91a and 91b are formed on a SiO₂ layer (not illustrated) that surrounds the Si pillars 66a and 66b so as to surround the side surfaces of the SiO₂ layers 2a and 2b and the SiN layers 3a and 3b on the tops of the Si pillars 66a and 66b. The SiO$_2$ layer (not illustrated) is etched using the SiN layers 3a, 3b, 91a, and 91b as masks to form SiO$_2$ layers 92a and 92b that surround the side surfaces of the Si pillars 66a and 66b with an equal width. By performing the same processes as those described in FIGS. 8CA to 8CD, the SiN layer 93 that lies below the resist layer 94 and the same P$^+$ region 67aa, N$^+$ region 67bb, N layer 65a, and P layer 1cc as those in FIGS. 8CA to 8CD that are connected to the bottom portions of the Si pillars 66a and 66b are formed.

This embodiment provides the following advantage.

In this embodiment, first, the SiN layers 91a and 91b that surround, with an equal width in plan view, the side surfaces of the SiO$_2$ layers 2a and 2b and the SiN layers 3a and 3b on the tops of the Si pillars 66a and 66b are formed as in the ninth embodiment. The heights of the SiN layers 91a and 91b can be sufficiently made smaller than those of the Si pillars 66a and 66b. Therefore, the SiN layers 91a and 91b can be formed with high precision. The SiO$_2$ layers 92a and 92b are formed on the side surfaces of the Si pillars 66a and 66b with a uniform thickness in the vertical direction. Thus, the SiO$_2$ layers 92a and 92b can function, with certainty, as etching masks for forming the P$^+$ region 67aa, the N$^+$ region 67bb, the N layer 65a, and the P layer 1cc.

Eleventh Embodiment

Figure 11A:
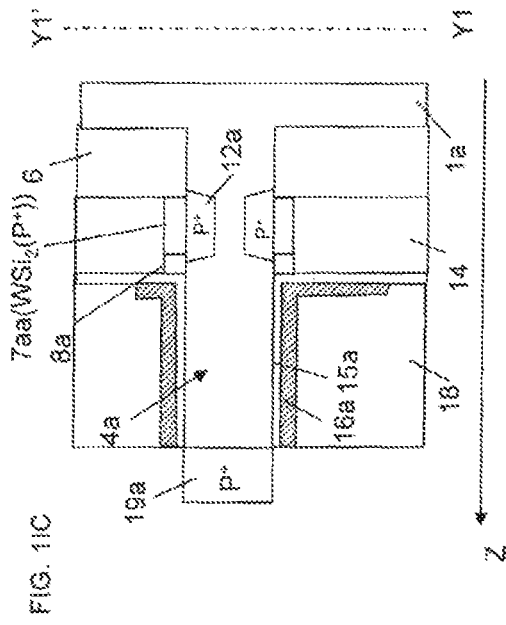
FIGS. 11AA to 11AD are a plan view and sectional views illustrating a CMOS inverter circuit for describing a method for producing a semiconductor device including an SGT according to an eleventh embodiment.
Figure 11B:
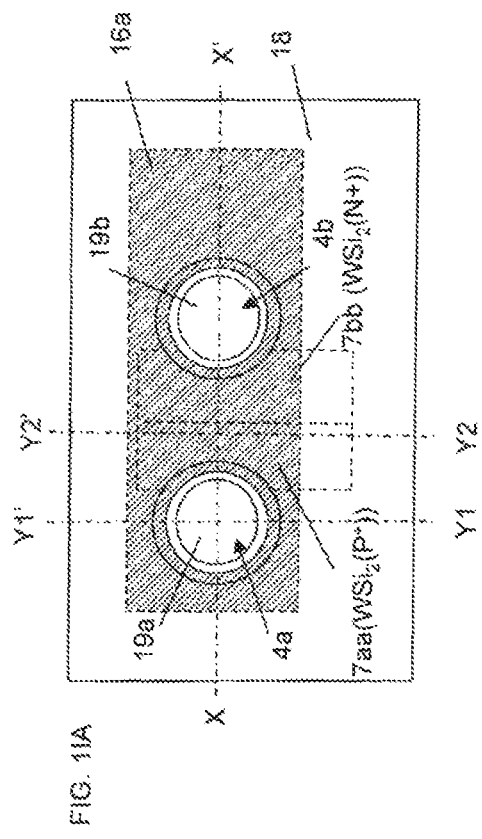
FIGS. 11BA to 11BE are plan views and sectional views illustrating a CMOS inverter circuit for describing a method for producing a semiconductor device including an SGT according to an eleventh embodiment.
Figure 11C:
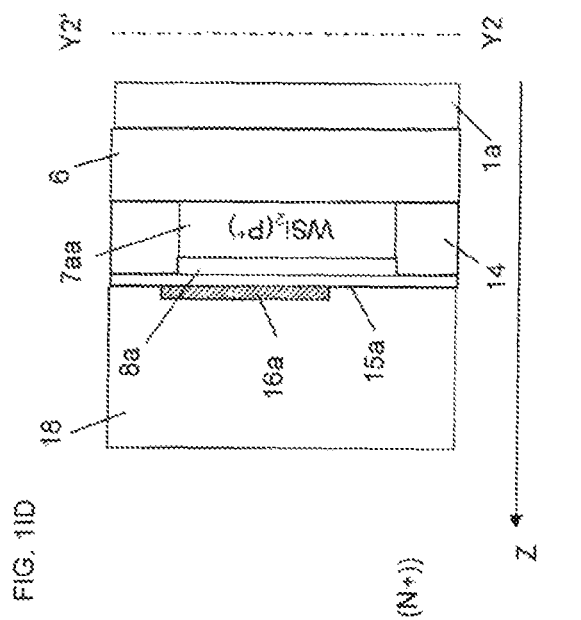
Figure 11D:
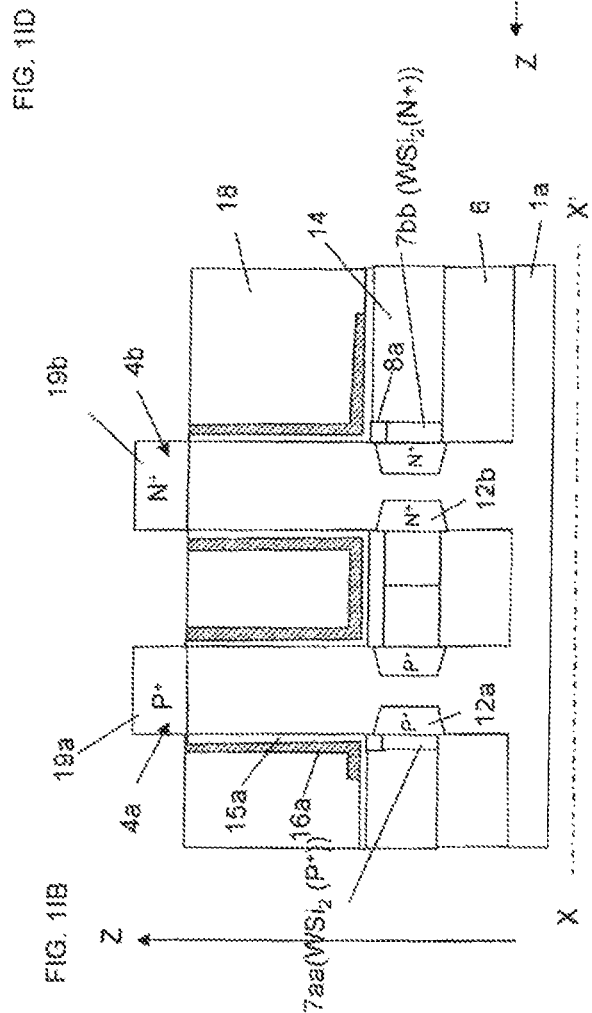

FIG. 11AA to FIG. 11BE illustrate a method for producing a CMOS inverter circuit including an SGT according to an eleventh embodiment of the present invention. Among FIG. 11AA to FIG. 11BD, figures suffixed with A are plan views, figures suffixed with B are sectional views taken along line X-X' in the corresponding figures suffixed with A, figures suffixed with C are sectional views taken along line Y1-Y1' in the corresponding figures suffixed with A, and figures suffixed with D are sectional views taken along line Y2-Y2' in the corresponding figures suffixed with A.

As illustrated in FIGS. 11AA to 11AD, Si pillars 4a and 4B are formed on the i layer substrate 1a as described in FIGS. 6AA to 6AD. The Si pillar 4B is formed closer to the Si pillar 4a than the Si pillar 4b in the first embodiment. A SiN layer 2a and a SiO$_2$ layer 3a are formed on the Si pillar 4a. A SiN layer 2B and a SiO$_2$ layer 3B are formed on the Si pillar 4B. A SiO$_2$ layer 6, a WSi$_2$ layer 7A containing B atoms, a WSi$_2$ layer 7B containing As atoms, and a SiN layer 8 are formed on the peripheries of the Si pillars 4a and 4B. By performing heat treatment, a P$^+$ region 12a is formed in a portion of the Si pillar 4a that is in contact with the WSi$_2$ layer 7A, and an N$^+$ region 12B is formed in a portion of the Si pillar 4b that is in contact with the WSi$_2$ layer 7B. A SiO$_2$ film (not illustrated) is entirely deposited by CVD. The SiO$_2$ film is etched back by RIE to form SiO$_2$ layers 55 on the side surfaces of the Si pillars 4a and 4B. The SiO$_2$ layers 55 are formed so as to be connected to each other in a portion between the Si pillars 4a and 4B.

Next, as illustrated in FIGS. 11BA to 11BD, the SiN layer 8 and the WSi$_2$ layers 7A and 7B are etched using the SiO$_2$ layers 55 as masks to form a SiN layer 8A and WSi$_2$ layers 7Aa and 7Bb. Subsequently, the same processes as those in the first embodiment are performed to form a CMOS inverter circuit.

FIG. 11BE illustrates the relationship between the Si pillars 4a and 4B, the P$^+$ region 12a, the N$^+$ region 12B, and the WSi$_2$ layers 7Aa and 7Bb in plan view. The diagonally shaded area indicates the WSi$_2$ layers 7Aa and 7Bb. The WSi$_2$ layer 7Aa is constituted by WSi$_2$ layers 57a and 57b serving as first alloy regions that are formed in a self-aligned manner with the P$^+$ region 12a and the N$^+$ region 12B so as to surround the entire periphery of the Si pillar 4a, WSi$_2$ layers 59a and 59b serving as second alloy regions that are partly in contact with the peripheries of the WSi$_2$ layers 57a and 57b so as to be connected to the WSi$_2$ layers 57a and 57b, and WSi$_2$ layers 58a and 58b serving as third alloy regions that partly surround the peripheries of the WSi$_2$ layers 57a and 57b and are connected to the WSi$_2$ layers 59a and 59b. By performing the processes in FIG. 1HA to FIG. 1JE, a CMOS inverter circuit can be formed on the i layer substrate 1a.

This embodiment provides the following advantages.

1. In this embodiment, the WSi$_2$ layers 7Aa and 7Bb are formed without using the resist layer 56 described in the sixth embodiment. In this case, the SiO$_2$ layers 55 that surround the Si pillars 4a and 4B are formed so as to have a larger width in plan view, a contact hole (not illustrated) is formed on the WSi$_2$ layers 7Aa and 7Bb, and the connection to the upper metal wiring (not illustrated) can be achieved. This simplifies the processes. Furthermore, the Si pillars 4a and 4B are formed close to each other, which increases the density of a circuit.

2. This embodiment is also applicable to formation of a gate conductor layer as in the sixth embodiment. This further increases the density of an SGT circuit.

In each of the above embodiments, a Si pillar made of silicon has been used. However, the technical idea of the present invention is applicable to SGTs partly or wholly formed of a semiconductor material other than silicon.

In each of the above embodiments, the case where the Si pillars 4a, 4b, and 4B have a circular shape in plan view has been described. However, it is obvious that the Si pillars 4a, 4b, and 4B may have an elliptical or rectangular shape.

In the first embodiment, the material layers that surround the peripheries of the Si pillars 4a and 4b and are to be etched with an equal width are the WSi$_2$ layers 7a and 7b connected to the P$^+$ region 12a and the N$^+$ region 12b. In the second embodiment, the material layers to be etched are the CoSi$_2$ layers 23a and 23b connected to the P$^+$ region 12a and the N$^+$ region 12b. In the fifth embodiment, the material layer to be etched is the TiN layer 16. In the eighth embodiment, the material layers to be etched are the P$^+$ region 67a and the N$^+$ region 67b that are semiconductor layers containing a donor or acceptor impurity. In the ninth embodiment, the material layer to be etched is the W layer 85 serving as a metal layer. As described above, the material layers to be etched in the present invention are conductive layers such as alloy layers, metal layers, and semiconductor layers containing a donor or acceptor impurity.

In the first embodiment, the SiO$_2$ layers 11a and 11b that surround the side surfaces of the Si pillars 4a and 4b have been used as etching masks for the WSi$_2$ layers 7a and 7b connected to the P$^+$ region 12a and the N$^+$ region 12b. Instead of the SiO$_2$ layers 11a and 11b, a material layer formed of one or more layers may be used. When the WSi$_2$ layers 7a and 7b are changed to other conductive layers, another material layer that functions as an etching mask may be used. The same applies to the SiO$_2$ layers 2a and 2b and the SiN layers 3a and 3b that lie on the tops of the Si pillars 4a and 4b and prevent the Si pillars 4a and 4b from being etched. Instead of the SiO$_2$ layers 2a and 2b and the SiN layers 3a and 3b, other material layers that function as etching masks and are formed of one or more layers may be used. In the fifth embodiment, the SiO$_2$ layers 52a and 52b that surround the side surface of the TiN layer 16 to serve as a gate conductor layer have been used as etching masks. The same also applies to the case where the present invention is applied to the gate conductor layer. The same also applies to other embodiments according to the present invention.

In the first embodiment, the resist layer 13 has been used as an etching mask. However, an organic or inorganic material layer formed of one or more layers may be formed below a resist layer for lithography, and such a material layer may be used as a mask material layer. The same applies to other embodiments according to the present invention.

In the first embodiment, the TiN layer 16a has been used as a gate conductive layer. However, the gate conductive layer may be a different metal layer or a conductor material layer. The gate conductor layer may be a multilayer conductor layer. The same applies to other embodiments according to the present invention.

In the first embodiment, the $SiO_2$ layer 6, the $WSi_2$ layer 7, and the SiN layer 8 have been formed by sputter deposition, but they may be formed by entirely depositing material layers by, for example, CVD and then etching back the material layers. Alternatively, another method may be employed in which any of the $SiO_2$ layer 6, the $WSi_2$ layer 7, and the SiN layer 8 is formed by an etch-back process and the other is formed by a sputtering process. The same applies to other embodiments according to the present invention.

In the first embodiment, the case where the side surfaces of the Si pillars 4a and 4b have a columnar shape that is vertical to the plane of the i layer substrate has been described. However, the side surfaces of the Si pillars 4a and 4b may have a trapezoidal shape or a barrel-like shape as long as the structure in each embodiment is realized. The same applies to other embodiments according to the present invention.

In the first embodiment, the description has been made using the $WSi_2$ layers 7a and 7b. However, for example, a silicide layer containing another metal atom, an alloy layer containing a semiconductor atom other than Si, or a semiconductor layer containing an impurity atom may be used as long as the structure in this embodiment is realized. The same applies to other embodiments according to the present invention.

In the first embodiment, the $P^+$ regions 12a and 33a and the $N^+$ regions 12b and 33b are formed on the peripheries of the Si pillars 4a and 4b. In the fourth embodiment, the $P^+$ region 42a and the $N^+$ region 42b are formed so as to extend to the centers of the Si pillars 4a and 4b. In both the embodiments, the depth of such a $P^+$ region and an $N^+$ region formed in the Si pillars 4a and 4b varies depending on the width of the Si pillars 4a and 4b and the temperature in the processes. As a result, such a $P^+$ region and an $N^+$ region may be formed to the peripheries of the Si pillars 4a and 4b or to the centers of the Si pillars 4a and 4b. The same applies to other embodiments according to the present invention.

In the first embodiment, the description has been made using the $WSi_2$ layers 7aa and 7bb as wiring alloy layers. In this case, almost no silicide layer is formed in the Si pillars 4a and 4b. However, when the interface between the $WSi_2$ layers 7aa and 7bb and the Si pillars 4a and 4b is observed under magnification, a thin silicide layer is formed in the Si pillars depending on the heat treatment conditions in the processes. Therefore, the $WSi_2$ layers 7aa and 7bb may be connected to the $P^+$ regions 12a and 12b on the peripheries of the Si pillars 4a and 4b or inside the Si pillars 4a and 4b in plan view. The same applies to other embodiments according to the present invention.

In the first embodiment, as illustrated in FIGS. 1GA to 1GD, the resist layer 13 that partly overlaps the Si pillars 4a and 4b in plan view is formed. The SiN layer 8 and the $WSi_2$ layers 7a and 7b are etched by RIE using the resist layer 13, the $SiO_2$ layers 11a and 11b, the $SiO_2$ layers 2a and 2b, and the SiN layers 3a and 3b as masks to form a SiN layer 8a and $WSi_2$ layers 7aa and 7bb. As a result of this etching, a part or the entirety of the SiN layers 3a and 3b may be removed as long as the top portions of the Si pillars 4a and 4b are not etched at the end of the etching. The $SiO_2$ layers 11a and 11b, the $SiO_2$ layers 2a and 2b, and the SiN layers 3a and 3b may be changed to other material layers formed of one or more layers as long as they function as etching masks. The same applies to other embodiments according to the present invention.

In the first embodiment, a well layer is not formed in lower portions of the Si pillars 4a and 4b below the $P^+$ region 12a and the $N^+$ region 12b. However, after the formation of the Si pillars 4a and 4b, a well layer formed of one or more layers may be formed by, for example, ion implantation or solid-state diffusion. This does not depart from the scope of the present invention at all. The same applies to other embodiments according to the present invention.

In the first embodiment, the $HfO_2$ layer 15a has been used as an insulating layer. However, the material for the insulating layer is not limited to $HfO_2$, and another insulating layer formed of one or more layers may be used. The same applies to other embodiments according to the present invention.

In the first embodiment, the case where a single SGT is formed in each of the Si pillars 4a and 4b has been described. However, since the present invention relates to the $P^+$ region 12a and the $N^+$ region 12b formed in the bottom portions of the Si pillars 4a and 4b and to the $WSi_2$ layers 7aa and 7bb serving as wiring alloy layers connected to the $P^+$ region 12a and the $N^+$ region 12b, the present invention is applicable to formation of a circuit including a plurality of SGTs in a single semiconductor pillar. The same applies to other embodiments according to the present invention.

In the descriptions of the second embodiment and the fourth embodiment, the $CoSi_2$ layers 24a, 24b, 43a, and 43b serving as silicide layers are formed on the peripheries of the Si pillars 4a and 4b. The formation of the silicide layers to the centers of the Si pillars 4a and 4b does not depart from the scope of the present invention at all. The same applies to other embodiments according to the present invention.

In the fourth embodiment, the TiN layers 16A and 16B and the NiSi layer 46 serving as a wiring conductor layer are connected to each other at the intermediate positions of the TiN layers 16A and 16B in the vertical direction. This reduces the capacitance between the gate TiN layers 16A and 16B and the source $P^+$ region 42a and $N^+$ region 42b. The same applies to other embodiments according to the present invention.

In the fifth embodiment, as illustrated in FIGS. 5AA to 5AD, the $P^+$ region 12A is formed so as to be connected to the side surface of the bottom portion of the Si pillar 4a, and the $N^+$ region 12B is formed so as to be connected to the side surface of the bottom portion of the Si pillar 4b. Then, the TiN layer 16a serving as a gate conductor layer is formed. However, as described in the fourth embodiment, the $P^+$ region 12A and the $N^+$ region 12B may be formed by forming the TiN layers 16A and 16B serving as gate conductor layers and then forming the holes 30A and 30B in the layers overlying the Si pillars 4a and 4b at bottom portions of the Si pillars 4a and 4b so that the $P^+$ region 12A is connected to the side surface of the bottom portion of the Si pillar 4a and the $N^+$ region 12B is connected to the side surface of the bottom portion of the Si pillar 4b. In this case, as illustrated in FIGS. 5AA to 5AD, the $P^+$ region 12A containing an acceptor impurity may be formed by, for example, selective epitaxial crystal growth after the formation of the hole 30A, and then the $N^+$ region 12B containing a donor impurity may be formed by, for example, selective epitaxial crystal growth after the formation of the hole 30B. Subsequently, a W layer (not illustrated) is formed by, for example, selective epitaxial crystal growth so as to be connected to the side surfaces of the $P^+$ region 12A and the $N^+$ region 12B. The periphery of the W layer in plan view is desirably aligned with the peripheries of the $SiO_2$ layers 38a and 38b in FIGS. 4AA to 4AD. Subsequently, another W layer (not illustrated) is formed by, for example, sputter deposition so as to be in contact with the periphery of the W layer formed by selective epitaxial crystal growth. Then, by performing the same processes as those illustrated in FIG. 4BA to FIG. 4DD, a CMOS inverter circuit is formed. The $P^+$ region 12A and the $N^+$ region 12B may be formed by a method other than selective epitaxial crystal growth. The same applies to the formation of the W layer 51. The $P^+$ region 12A and the $N^+$ region 12B may be semiconductor material layers made of a material other than Si, such as SiGe layers containing a donor or acceptor impurity. Regarding the W layer 51, a buffer conductor layer formed of one or more layers for reducing the contact resistance between the W layer and the $P^+$ region 12A and $N^+$ region 12B may be disposed between the W layer and the $P^+$ region 12A and $N^+$ region 12B. The same applies to other embodiments according to the present invention.

The $P^+$ region 12A and the $N^+$ region 12B in the fifth embodiment may be made of a semiconductor material, such as SiGe, that is different from the semiconductor material for the Si pillars 4a and 4b. The same applies to other embodiments according to the present invention.

In the fifth embodiment, the W layer 51 and the TiN layer 16a are formed so that the W layer 51 and a portion of the TiN layer 16a that extends in a horizontal direction do not overlap each other in plan view. This reduces the capacitance between the W layer 51 and the TiN layer 16a. The same effect is also produced by decreasing the size of the overlapping portion. The same applies to other embodiments according to the present invention.

In the fifth embodiment, the rectangular resist layers are formed so that the center lines A and B of the resist layers extend so as not to pass through the center points of the Si pillars 4a and 4b. However, only one of the center lines may extend so as not to pass through the center points of the Si pillars 4a and 4b. In this embodiment, two Si pillars 4a and 4b are employed, but one Si pillar may be employed. The same applies to other embodiments according to the present invention.

In the fifth embodiment, the $P^+$ region 12A and the $N^+$ region 12B are formed so as to be in contact with the side surfaces of the bottom portions of the Si pillars 4a and 4b. A $P^+$ region and an $N^+$ region may be formed inside the Si pillars 4a and 4b through thermal diffusion of impurities caused by heat treatment after the formation of the $P^+$ region 12A and the $N^+$ region 12B. The same applies to other embodiments to which this embodiment can be applied.

In the sixth embodiment and the eleventh embodiment, the description has been made using an example in which the present invention is applied to a CMOS inverter circuit. The present invention can also be applied to formation of a circuit in which SGTs formed in the Si pillars 4a and 4b while the $P^+$ region 12a is changed to an $N^+$ region containing a donor impurity are connected in parallel. This circuit is used when a large electric current is required. A high-density circuit is easily formed because the $N^+$ regions are connected in parallel and the gate conductor layers are connected in parallel. The electric current is increased by increasing the number of SGTs formed in parallel.

In the ninth embodiment, the W layers 85a and 85b serving as conductor layers have been formed so as to be in contact with the side surfaces of the TiN layers 84a and 84b. The W layers 85a and 85b may be other material layers such as conductor layers or insulating layers as long as they function as etching masks for the TiN layer 84. The W layers 85a and 85b may also be multilayer material layers.

In the first embodiment, the SiN layers 2a and 2b and the $SiO_2$ layers 3a and 3b on the Si pillars 4a and 4b are used as etching masks for the $WSi_2$ layers 7a and 7b. By changing the $WSi_2$ layers 7a and 7b to other conductive material layers or selecting another etching gas, the $WSi_2$ layers 7aa and 7bb or other conductive material layers may be formed while the SiN layers 2a and 2b and the $SiO_2$ layers 3a and 3b are not present. For the SiN layers 2a and 2b and the $SiO_2$ layers 3a and 3b, for example, in the process in FIGS. 8BA to 8BD, a $SiO_2$ layer is formed so as to cover the Si pillars 66a and 66b and polished by CMP so as to have an upper surface that is flush with the upper surfaces of the SiN layers 2a and 2b. The SiN layers 2a and 2b are removed and then mask material layers such as SiN layers and $SiO_2$ layers may be additionally formed on the tops of the Si pillars 66a and 66b. It is sufficient that mask material layers such as SiN layers and $SiO_2$ layers are formed before the resist layer 71 is formed. The same applies to other embodiments to which this embodiment can be applied.

In the first embodiment, as illustrated in FIGS. 1JA to 1JE, the $WSi_2$ layers 7Aa (7aa) and 7Ba (7bb) are formed that are constituted by the first alloy regions that are directly in contact with the side surfaces of the Si pillars 4a and 4b, surround the entire peripheries of the Si pillars 4a and 4b in a tubular shape with an equal width in plan view, and are in contact with the $P^+$ region 12a and the $N^+$ region 12b in a self-aligned manner and the second alloy region that is connected to the first alloy regions and extends in a horizontal direction. In the fifth embodiment, as illustrated in FIGS. 5CA to 5CD, the TiN layer 16a is formed that is constituted by the first alloy regions that are in contact with the gate TiN layers 16a and 16b in a self-aligned manner so as to surround the entire peripheries in a tubular shape with an equal width in plan view and the second alloy region that is connected to the first alloy regions and extends in a horizontal direction. As described above, the first alloy regions and the second alloy region that are connected to the $P^+$ region 12a and the $N^+$ region 12b and the first alloy regions and the second alloy region that are connected to the gate TiN layers 16a and 16b are formed by fundamentally the same method. Thus, the present invention can be applied to at least one of the formation of the first alloy regions and the second alloy region that are connected to the $P^+$ region 12a and the $N^+$ region 12b and the formation of the first alloy regions and the second alloy region that are connected to the gate TiN layers 16a and 16b. The same applies to other embodiments to which this embodiment can be applied.

In the first embodiment, as illustrated in FIGS. 1FA to 1FD, the $P^+$ region 12a and the $N^+$ region 12b are formed by causing an acceptor or donor impurity to thermally diffuse from the $WSi_2$ layers 7a and 7b containing an acceptor or donor impurity. For the $P^+$ region 12a and the $N^+$ region 12b, the $WSi_2$ layers 7a and 7b do not necessarily contain an acceptor or donor impurity in the case where the $P^+$ region 60a and the $N^+$ region 60b in the seventh embodiment are formed in the previous process. In this case, the $WSi_2$ layers 7a and 7b may be conductor layers formed of other material layers. The first alloy regions and the second alloy region may be first conductive regions and a second conductive region formed of another conductive material. The same applies to other embodiments to which this embodiment can be applied.

In the first embodiment, the WSi$_2$ layers 7aa and 7bb are used as wiring alloy layers. However, conductive layers that have an equal width in plan view and are formed of one or more layers may be used. The same applies to other embodiments to which this embodiment can be applied.

In the fifth embodiment, as illustrated in FIGS. 5AA to 5AD, the P$^+$ region 12A is formed so as to be connected to the side surface of the bottom portion of the Si pillar 4a, and similarly the N$^+$ region 12B is formed so as to be connected to the side surface of the bottom portion of the Si pillar 4b. The W layer 51 is formed so as to surround the peripheries of the P$^+$ region 12A and the N$^+$ region 12B. As described above, the region corresponding to the first alloy region in the first embodiment is constituted by two regions, that is, the P$^+$ region 12A and the W layer 51. Similarly, the region corresponding to the first alloy region is constituted by two regions, that is, the N$^+$ region 12B and the W layer 51. The first alloy (conductive) region may be constituted by a plurality of conductive layers having an equal width in plan view. The same applies to other embodiments to which this embodiment can be applied.

In the fifth embodiment, as illustrated in FIGS. 5CA to 5CD, the gate TiN layer 16a is constituted by the first alloy regions (first conductive regions) that surround the Si pillars 4a and 4b with an equal width and the second alloy region (second conductive region) connected to the first alloy regions of the Si pillars 4a and 4b. As described above, the first alloy regions and the second alloy region are formed of the same material layer. The same applies to other embodiments to which this embodiment can be applied.

In the fourth embodiment, the NiSi layers 46a and 46b serving as first alloy regions are formed with an equal width in plan view so as to be connected to the gate TiN layers 16A and 16B, and the NiSi layer 46c serving as a second alloy region is formed so as to be connected to the NiSi layers 46a and 46b serving as first alloy regions. As described above, the first alloy regions and the second alloy region can be formed through connection at the intermediate positions of the gate TiN layers 16A and 16B in the vertical direction. The same applies to other embodiments to which this embodiment can be applied.

The SiO$_2$ layers 92a and 92b and the SiN layer 93 in the tenth embodiment may be other material layers or may be multilayer material layers.

In each of the above embodiments, a SOI (silicon on insulator) substrate including an insulating substrate may also be used instead of the i layer substrate 1a.

The SGT has a structure in which a gate insulating layer is formed on a periphery of a semiconductor pillar and a gate conductor layer is formed on a periphery of the gate insulating layer. A flash memory device including a conductor layer electrically floating between the gate conductor layer and the gate insulating layer is also one embodiment of the SGT, and the technical idea of the present invention can be applied to such a flash memory device.

In the present invention, there are provided at least a first conductive region that surrounds the entire periphery of a source or drain impurity region in the lower portions of the Si pillars 4a, 4b, and 4B and a second conductive region that is partly connected the periphery of the first conductive region in plan view. For example, in a circuit including a plurality of SGTs connected in parallel on the same substrate to increase the driving current, the circuit being different from the circuit having the features of the present invention, the second conductive region may be connected to a plurality of portions of the periphery of the first conductive region or to the entire periphery of the first conductive region.

In each of the above embodiments, the case where only an SGT is formed in the semiconductor pillar has been described. However, the technical idea of the present invention is applicable to a method for producing a semiconductor device including an SGT and an element (e.g., a photodiode) other than the SGT incorporated therein.

In each of the above embodiments, the description has been made using an SGT in which the upper and lower impurity regions serving as sources or drains contain impurity atoms having the same polarity. However, the present invention is also applicable to a tunneling SGT including impurity atoms having different polarities. Similarly, the present invention is also applicable to an SGT in which at least one of the source and the drain is formed using a Schottky diode.

In each of the above embodiments, the description has been made using the i layer substrates 1 and 1a and the P layer substrates 1c and 1cc. However, for example, a well structure or a SOI substrate may be employed in accordance with the required performance.

Various embodiments and modifications of the present invention can be made without departing from the broad spirit and scope of the present invention. The above-described embodiments are illustrative examples of the present invention and do not limit the scope of the present invention. The above-described embodiments and modifications can be freely combined with each other. Furthermore, embodiments from which some of constituent features of the embodiments are removed as required are also within the technical idea of the present invention.

The semiconductor device including an SGT according to the present invention and the method for producing the semiconductor device are useful for realizing a high-density semiconductor device including an SGT.

What is claimed is:

1. A semiconductor device including a surround gate MOS transistor (SGT), comprising:
    a first semiconductor pillar that stands on a substrate in a direction vertical to a plane of the substrate;
    a first gate insulating layer that surrounds the first semiconductor pillar;
    a first gate conductor layer that surrounds the first gate insulating layer;
    a first impurity region that is positioned below the gate conductor layer in the vertical direction and is connected to a portion inside the first semiconductor pillar or to a side surface of the first semiconductor pillar;
    a first conductive layer that surrounds an entire periphery of the first impurity region in a plan view;
    a second conductive layer that is partly connected to a periphery of the first conductive layer in the plan view and extends in a direction horizontal to the plane of the substrate;
    a third conductive layer that surrounds an entire periphery of the first gate conductor layer in the plan view; and
    a fourth conductive layer that is partly connected to a periphery of the third conductive layer in the plan view, extends in a direction horizontal to the plane of the substrate, and partly overlaps the second conductive layer or does not overlap the second conductive layer in the plan view, wherein at least one of the first conductive layer and the third conductive layer has an equal width in the plan view.

* * * * *

UNITED STATES PATENT AND TRADEMARK OFFICE
CERTIFICATE OF CORRECTION

PATENT NO. : 10,644,151 B2
APPLICATION NO. : 16/398574
DATED : May 5, 2020
INVENTOR(S) : Fujio Masuoka et al.

Page 1 of 1

It is certified that error appears in the above-identified patent and that said Letters Patent is hereby corrected as shown below:

On the Title Page

In (60) Related U.S. Application Data, on the second line, after "Mar. 9, 2018," insert --now Pat. No. 10,553,715--.

Signed and Sealed this
Twenty-fifth Day of August, 2020

Andrei Iancu
*Director of the United States Patent and Trademark Office*